(12) United States Patent  (10) Patent No.: US 11,316,118 B2
Judd et al.  (45) Date of Patent: Apr. 26, 2022

(54) DIBENZO[D,B]SILOLE-BASED REACTIVE MESOGENS

(71) Applicant: LOMOX LIMITED, Congleton (GB)

(72) Inventors: Luke William Judd, Congleton (GB); Matthew P. Aldred, Congleton (GB)

(73) Assignee: Lomox Limited, Congleton (GB)

( * ) Notice: Subject to any disclaimer, the term of this patent is extended or adjusted under 35 U.S.C. 154(b) by 393 days.

(21) Appl. No.: 16/338,070

(22) PCT Filed: Oct. 6, 2017

(86) PCT No.: PCT/GB2017/053031
§ 371 (c)(1),
(2) Date: Mar. 29, 2019

(87) PCT Pub. No.: WO2018/065786
PCT Pub. Date: Apr. 12, 2018

(65) Prior Publication Data
US 2019/0280223 A1  Sep. 12, 2019

(30) Foreign Application Priority Data
Oct. 7, 2016 (GB) ..................... 1617087

(51) Int. Cl.
*H01L 51/50* (2006.01)
*H01L 51/00* (2006.01)
(Continued)

(52) U.S. Cl.
CPC ........ *H01L 51/0094* (2013.01); *C07F 7/0807* (2013.01); *C07F 7/0816* (2013.01);
(Continued)

(58) Field of Classification Search
None
See application file for complete search history.

(56) References Cited

U.S. PATENT DOCUMENTS 9,112,157 B2   8/2015 Brown et al.
2010/0059712 A1*  3/2010 Cheong ................ G02B 5/3016
                                                             252/299.62
(Continued)

FOREIGN PATENT DOCUMENTS

JP  2010215759 A  9/2010
WO  2005047363 A1  5/2005
(Continued)

OTHER PUBLICATIONS

International Search Report, PCT/GB2017/053031, dated Dec. 12, 2017, 6 pages.
(Continued)

*Primary Examiner* — Gregory D Clark
(74) *Attorney, Agent, or Firm* — Stinson LLP

(57) ABSTRACT

A compound of Formula (I)

$$D\text{-}S^1\text{-}A\text{-}S^2\text{—}B^1, \quad \text{Formula (I)}$$

wherein:
A represents a conjugated chain of from 1 to 20 aromatic moieties independently selected from the group consisting of aromatic moieties, heteroaromatic moieties and E moieties, provided that A includes at least one E moiety,
wherein E is selected from the group consisting of:
$E^1$ being a dibenzo[d,b]silole moiety of the structure:
(Continued)

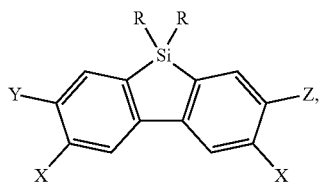

$E^2$ being a moiety of the structure:

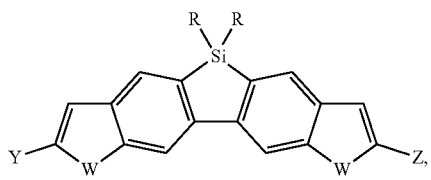

and $E^3$ being a moiety of the structure:

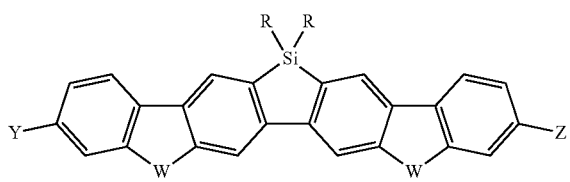

wherein E is connected in the conjugated chain of A and optionally to $S^1$ or to $S^2$ through covalent bonds at Y and Z;

wherein each R is independently selected from the group consisting of straight chain or branched $C_1$-$C_{20}$ alkyl and $C_2$-$C_{20}$ alkenyl, optionally wherein from 1 to 5 $CH_2$ groups are each replaced by an oxygen, provided that no acetal, ketal, peroxide or vinyl ether is present in the R group, and optionally wherein each H bonded to a C in each R group may independently be replaced by a halogen;

wherein the X moieties are the same and are selected from the group consisting of hydrogen, straight chain or branched $C_1$-$C_8$ alkyl, straight chain or branched $C_1$-$C_8$ alkoxyl and a halogen, wherein each E moiety may have the same or different X moieties, wherein W is either an oxygen or sulfur atom, D represents a moiety having one or more cross-linkable functionalities, $S^1$ and $S^2$ are flexible linker groups; and $B^1$ represents a moiety having one or more cross-linkable functionalities or a hydrogen atom, with the proviso that when $B^1$ represents a hydrogen atom, D represents a moiety having at least two cross-linkable functionalities.

25 Claims, 6 Drawing Sheets

(51) Int. Cl.
  C07F 7/08     (2006.01)
  C09K 11/02    (2006.01)
  C09K 11/06    (2006.01)
  C09K 19/40    (2006.01)
  C09K 19/04    (2006.01)
  H01L 51/05    (2006.01)
  H01L 51/42    (2006.01)

(52) U.S. Cl.
  CPC ............. C09K 11/02 (2013.01); C09K 11/06 (2013.01); C09K 19/406 (2013.01); H01L 51/0035 (2013.01); H01L 51/0053 (2013.01); H01L 51/0076 (2013.01); C09K 2019/0448 (2013.01); C09K 2211/1007 (2013.01); C09K 2211/1018 (2013.01); C09K 2211/1022 (2013.01); H01L 51/0067 (2013.01); H01L 51/0071 (2013.01); H01L 51/0508 (2013.01); H01L 51/42 (2013.01); H01L 51/5012 (2013.01); H01L 51/5056 (2013.01); H01L 51/5072 (2013.01); Y02E 10/549 (2013.01)

(56) References Cited

U.S. PATENT DOCUMENTS

2013/0245211 A1   9/2013  Zhou et al.
2013/0324716 A1*  12/2013 Brown .................. H01L 51/006
                                                        544/35
2017/0033290 A1   2/2017  Judd et al.

FOREIGN PATENT DOCUMENTS

WO    2007133705 A2    11/2007
WO    2008/091096 A1   7/2008
WO    2012087243 A1    6/2012

OTHER PUBLICATIONS

Written Opinion, PCT/GB2017/053031, dated Dec. 12, 2017, 7 pages.

Yue-Qi Mo et al: "Blue electroluminescence from 3,6-silafluorene-based copolymers", Journal of Polymer Science, Part A: Polymer Chemistry, vol. 47, No. 13, Jul. 1, 2009 (Jul. 1, 2009), pp. 3286-3295, XP055429504, ISSN: 0887-624X, DOI: 10.1002/pola.23393 *.

Database CA [online] Chemical Abstracts Service, Columbus, Ohio, US; 2010, Nishizeki, Masato et al: "Organic electroluminescent materials for organic electroluminescent device, display and lighting apparatus display", XP002776120, retrieved from STN Database accession No. 2010:1221744 *.

* cited by examiner

US 11,316,118 B2

DIBENZO[D,B]SILOLE-BASED REACTIVE MESOGENS

REFERENCE TO RELATED APPLICATIONS

This application is a U.S. national stage application of International Patent Application No. PCT/GB2017/053031, filed Oct. 6, 2017, and claims the benefit of priority of Great Britain Application No. 1617087.0, filed Oct. 7, 2016, the entire disclosures of which are incorporated herein by reference.

FIELD OF THE INVENTION

The present invention relates to novel compounds with electronic and photoelectronic properties that render them useful for the production of electrical devices. The invention further relates to electronic devices that incorporate layers comprising these compounds wherein these compounds function as charge transport materials or photoluminescent and electroluminescent materials.

BACKGROUND OF THE INVENTION

Organic light emitting diodes (OLED) are light emitting diodes in which the emissive electroluminescent material is a film of organic material which emits light in response to an electrical current. The emissive organic layer of an OLED is sandwiched between two electrical contact layers. For enhanced efficiency, in addition to a light emitting layer, the OLED device may incorporate layers of charge transporting material between the emissive layer and the electrical contact layers. These charge transporting layers may comprise either hole or electron charge transporting materials. These charge transport materials can allow the holes and electrons to migrate through to the emissive layer, thereby facilitating their combination to form a bound state called an exciton. These excitons in due course relax into a lower energy ground state by emitting radiation in which, for an OLED device, the wavelength is most often in the visible region.

There is considerable ongoing interest in academia and industry directed towards the research and development of new materials with improved properties that are suitable for use in the fabrication of OLED devices. For example, materials that function as emitters, electron transporters and hole transporters are of particular interest. Many materials have been developed over the years in the attempt to produce improved OLED devices and in particular devices with optimal light output, energy efficiency and life time. In addition, a further notable goal is the realisation of materials that allow the device fabrication process to be simplified. Notwithstanding existing materials, there is a continuing need for materials that have properties such as those identified above that possess superior combination of properties for the fabrication of OLED devices and other electronic devices.

It is known that some reactive mesogens (liquid crystalline materials capable of being chemically polymerised into a cross-linked polymer matrix) of the general formula:

B—S-A-S—B where A represents a linear aromatic molecular core comprising a fluorene substituted with two alkyl groups at C-9, S represents flexible spacer units and B represents cross-linking groups such as methacrylate groups, may be useful in the fabrication of organic electronic devices. This is particularly the case if B represents a photo-cross-linkable group, since then the materials function essentially as photoresists, in which thin layers of these materials may be patterned into useful electronic structures by patterned exposure to light, particularly UV light.

Further, if the linear aromatic core A is luminescent in nature, these reactive mesogen materials may be patterned into the active light emitting layers in electroluminescent devices, such as organic light emitting diodes (OLEDS) and organic diode lasers. However, working OLED devices of the B—S-A-S—B structure have exhibited disappointingly low lifetimes, or laborious low yielding synthetic routes. Materials used in these B—S-A-S—B structures exhibited slow curing times which increase the difficulty of device fabrication.

OLEDs that contain polymeric silafluorene are known in the literature (Chan, K. L.; McKiernan, M. J.; Towns, C. R.; Holmes, A. B. *J. Am. Chem. Soc.* 2005, 127, 7662-7663) and they have been shown to exhibit improved photo-stability over their fluorene counterparts. Polymeric silafluorene materials that are patternable by photolithographic methods also exist in the literature (McDowell, J. J.; Maier-Flaig, F.; Wolf, T. J. A.; Unterreiner, A. N.; Lemmer, U.; Ozin, G. *ACS Appl. Mater. Interfaces* 2014, 6, 83-93). Polymeric OLED materials are known to have issues with reproducibility due to the polydispersity and inadequate purity of the active polymeric materials.

JP 2010215759A discloses organic electroluminescent element, display, lighting device and material for organic electroluminescent element.

JP 2013155294 discloses material for organic electroluminescence element and use of the same.

WO 2015/159098 discloses fluroalkylfluorene derivatives.

WO 2012/098410 discloses polymer networks.

WO 2006/058182 discloses lighting elements, devices and methods.

WO 2005/034184 discloses lighting elements, devices and methods

US 2003/0119936 discloses light emitting polymer.

It is an object of the present invention to provide new silafluorene-containing materials for use in electronic devices which overcome, or substantially reduce, problems associated with existing fluorene derivatives or at least provide a commercially useful alternative thereto.

SUMMARY OF THE INVENTION

In a first aspect of the present invention, there is provided a compound of Formula (I)

$$D\text{-}S^1\text{-}A\text{-}S^2\text{—}B^1, \qquad \text{Formula (I)}$$

wherein:

A represents a conjugated chain of from 1 to 30 aromatic moieties independently selected from the group consisting of aromatic moieties, heteroaromatic moieties and E moieties, provided that A includes at least one E moiety, wherein E is selected from the group consisting of:

$E^1$ being a dibenzo[d,b]silole moiety of the structure:

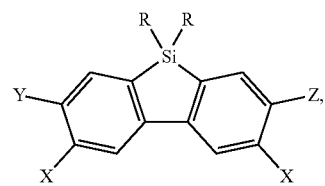

$E^2$ being a moiety of the structure:

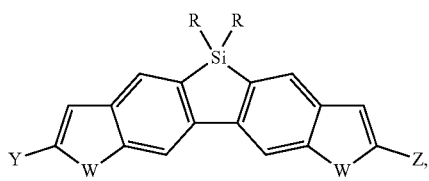

and $E^3$ being a moiety of the structure:

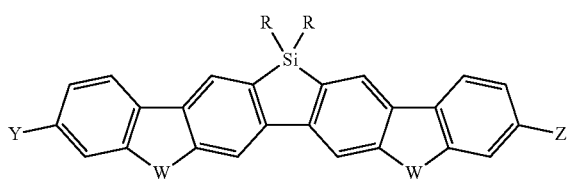

wherein E is connected in the conjugated chain of A and optionally to $S^1$ or to $S^2$ through covalent bonds at Y and Z;

wherein each R is independently selected from the group consisting of straight chain or branched $C_1$-$C_{20}$ alkyl and $C_2$-$C_{20}$ alkenyl, optionally wherein from 1 to 5 $CH_2$ groups are each replaced by an oxygen, provided that no acetal, ketal, peroxide or vinyl ether is present in the R group, and optionally wherein each H bonded to a C in each R group may independently be replaced by a halogen;

wherein the X moieties are the same and are selected from the group consisting of hydrogen, straight chain or branched $C_1$-$C_8$ alkyl, straight chain or branched $C_1$-$C_8$ alkoxyl and a halogen, wherein each E moiety may have the same or different X moieties, wherein W is either an oxygen or sulfur atom, D represents a moiety having one or more cross-linkable functionalities, $S^1$ and $S^2$ are flexible linker groups; and $B^1$ represents a moiety having one or more cross-linkable functionalities or a hydrogen atom, with the proviso that when $B^1$ represents a hydrogen atom, D represents a moiety having at least two cross-linkable functionalities.

The compound of Formula (I) is for use in making OLEDs. In particular it is considered that the stability of such dibenzo[d,b]silole-containing materials (also known as Silafluorene materials) are advantageous for OLEDs.

By the term "aromatic/heteroaromatic moiety" as used herein it is meant a single aromatic ring or fused ring system. Thus a biphenyl ring system, although fully conjugated, would represent two aromatic moieties in a chain.

By the term "chain" it is meant that the aromatic/heteroaromatic moieties are linked in a row. Such moieties provided as substituents which do not extend the chain length are not counted against the limit of 1 to 30 aromatic moieties. The aromatic/heteroaromatic moieties may be linked directly by covalent bonds or by ethyne or ethene linkers. The ethene or ethyne linkers maintain the conjugation of the chain but may aid synthesis of the chain. Preferably where ethene linkers are used they are trans ethene. The linker structures are shown below with benzene as the exemplary aromatic moiety. Preferably the moieties are directly linked by covalent bonds.

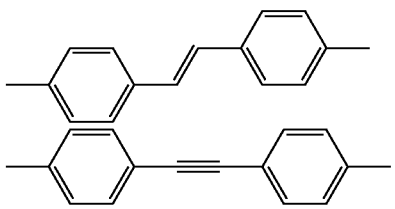

The aromatic/heteroaromatic moieties may be linked by an intervening atom so long as said atom does not interrupt the conjugation of the chain. Linker atoms in the conjugated chain (such as nitrogen atoms) may be substituted with further aromatic or heteroaromatic groups not within the chain. As above, such moieties are not counted against the limit of 1 to 30 Aromatic moieties. Preferably the chain does not contain any such linker atoms.

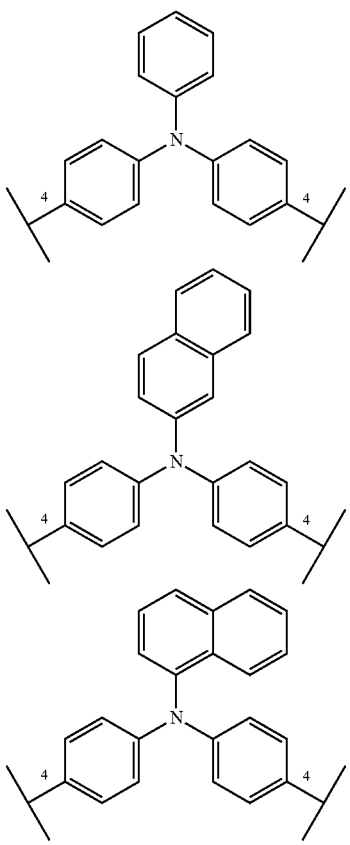

As noted above, A represents a conjugated chain of from 1 to 20 aromatic moieties independently selected from the group consisting of aromatic moieties, heteroaromatic moieties and E moieties, provided that A includes at least one E moiety. Each E moiety is connected in the chain through Y and Z positions. If the E moiety is at the end of the chain then it will be connected to either an $S^1$ or to $S^2$ through covalent bonds at C-3 and C-7.

Preferably A has the structure:

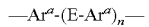

wherein each $Ar^a$ is independently selected from the group consisting of a bond, a diradical comprising an aromatic moiety, a diradical comprising a heteroaromatic moiety, an E moiety, or a chain comprising 2 to 5 aromatic, heteroaromatic and/or E moieties connected together by single bonds and wherein n is an integer from 1 to 8.

Preferably each $Ar^a$ is independently selected from the group consisting of a diradical comprising a $C_6$-$C_{22}$ aromatic moiety, a diradical comprising a heteroaromatic moiety having 4 to 22, preferably 4 to 18 carbon atoms, an E moiety, or a chain comprising 2 or 3 aromatic, heteroaromatic and/or E moieties connected together by single bonds.

Preferably the diradical comprising a $C_6$-$C_{22}$ aromatic moiety is selected from the group consisting of 1,3-phenylene, 1,4-phenylene, 1,4-phenylenevinylene, naphthalene-1,4-diyl, naphthalene-2,6-diyl, 9,9-dialkylfluorene-2,7-diyl, 9,9-dialkylfluorene-3,6-diyl, 9-(1'-alkylidene) fluorene)-2,7-diyl, 1,3-xylene-2,5-diyl, 1,4-xylene-2,5-diyl, durene-3,6-diyl, perylene-3,10-diyl, perylene-2,8-diyl, perylene-3,9-diyl and pyrene-2,7-diyl, and/or wherein the diradical comprising a heteroaromatic moiety having 4 to 22 carbon atoms is selected from the group consisting of 2,2'-dithiophene-5,5'-diyl, furan-2,5-diyl, thiophene-2,5-diyl, pyrimidine-2,5-diyl, pyridine-2,5-diyl, 1,2,4,5-tetrazine-3,6-diyl, 1,2,4-oxazole-3,5-diyl, 1,3,4-oxadiazole-2,5-diyl, 1,2,5-oxadiazole-3,4-diyl, 2,5-dialoxybenzene-1,4-diyl, thieno[3,2-b]thiophene-2,5-diyl, dithieno[3,2-b:2',3'-d] thiophene-2,6-diyl, dithieno[3,2-b:2',3'-d]thiophene-3,7-diyl, dibenzothiophene-3,7-diyl, dibenzothiophene-4,6-diyl and dibenzothiophene-2,8-diyl, benzo[1,2-b:4,5-b']bis[1] benzothiophene-3,9-diyl, thiazolo[5,4-d]thiazole-2,5-diyl, oxazolo[5,4-d]oxazole-2,5-diyl, thiazolo[5,4-d]oxazole-2,5-diyl, thiazolo[4,5-d]thiazole-2,5-diyl, oxazolo[4,5-d]oxazole-2,5-diyl, thiazolo[4,5-d]oxazole-2,5-diyl, 2,1,3-benzothiadiazole-4,7-diyl, 4-thien-2-yl-2,1,3-benzothiazole-7,5'-diyl, 4,7-dithien-2-yl-2,1,3-benzothiazole-5',5''-diyl, imidazo[4,5-d]imidazole-2,5-diyl, 4-alkyl-1,2,4-triazole-3, 5-diyl, 9-alkylcarbazole-2,7-diyl, 9-alkylcarbazole-3,6-diyl, 1,7-dialkylindolo[2,3-b]carbazole-3,9-diyl, 1,7-dialkylindolo[2,3-b]carbazole-2,8-diyl, 2,9-dialkylcarbazolo[3,2-b] carbazole-4,11-diyl, 2,9-dialkylcarbazolo[3,2-b]carbazole-5,12-diyl, 1,7-dialkyldiindolo[3,2-b]thiophenes-3,9-diyl, 1,7-dialkyldiindolo[3,2-b]thiophenes-4,10-diyl, benzo[1,2-b:4,5-b']dithiophene-2,6-diyl, benzo[1,2-b:5,4-b']dithiophene-2,6-diyl, [1]benzothieno[3,2-b][1]benzothiophene-2,7-diyl, benzo[1,2-d:4,5-d']bisoxazole-2,6-diyl, benzo[1,2-d:5,4-d']isoxazole-2,6-diyl, and 5,5-dioxodibenzothiophene-3,7-diyl diradicals. Preferably, the diradical comprises a $C_6$-$C_{20}$ aromatic moiety or a heteroaromatic moiety having 4 to 18 carbon atoms.

Preferably A comprises from 1 to 10 E moieties, and/or A represents a conjugated chain of from 8 to 16 aromatic moieties. Preferably A comprises at least 3 different aromatic moieties. In certain preferred aspects, the number of E in each —$Ar^1$-(E-$Ar^2$)$_n$— group is selected from 1 to 6, 1 to 3, 3 to 6, or 5, or 6.

As noted above, E is a dibenzo[d,b]silole moiety of the structure $E^1$:

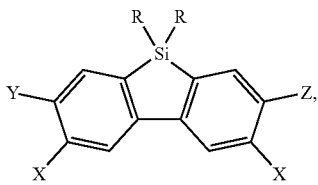

or a larger dibenzo[d,b]silole based structure $E^2$:

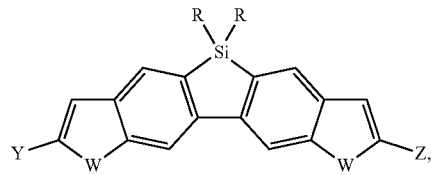

or $E^3$:

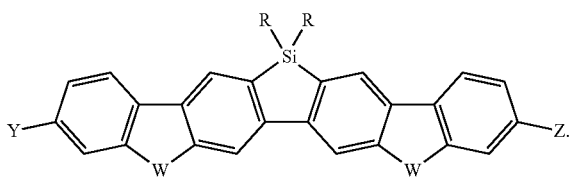

Each R is independently selected from the group consisting of straight chain or branched $C_1$-$C_{20}$ alkyl and $C_2$-$C_{20}$ alkenyl, optionally wherein from 1 to 5 CH$_2$ groups are each replaced by an oxygen, provided that no acetal, ketal, peroxide or vinyl ether is present in the R group, and optionally wherein each H bonded to a C in each R group may independently be replaced by a halogen.

R groups comprising $C_4$-$C_{20}$ alkyl and $C_4$-$C_{20}$ alkenyl are preferred as they have increased solubility. Shorter chain lengths may be used with longer chain lengths of X to increase the solubility. For example, $C_1$-$C_3$ alkyl or alkenyl may be used when X is a $C_5$-$C_8$ alkyl or alkoxyl.

In a particular embodiment the R groups comprise —CF$_2$—CF$_2$—$R^6$ wherein $R^6$ is $C_1$-$C_{18}$ alkyl and $C_2$-$C_{18}$ alkenyl, optionally wherein from 1 to 5 CH$_2$ groups are each replaced by an oxygen, provided that no acetal, ketal, peroxide or vinyl ether is present in the R group, and optionally wherein each H bonded to a C in each R group may independently be replaced by a halogen.

Examples of such R groups are:

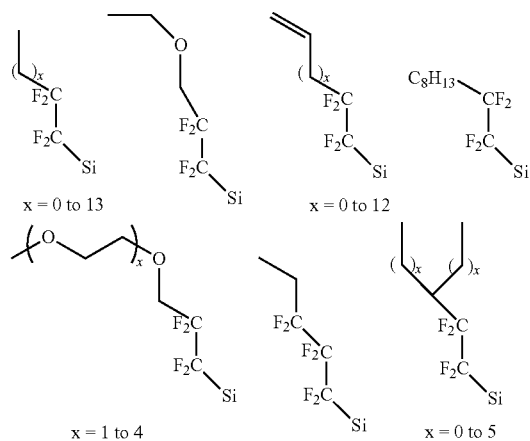

Preferably each E is an $E^1$ structure, since this structure offers advantages relating to the synthesis of the compounds.

$B^1$ represents a moiety having one or more cross-linkable functionalities or a hydrogen atom, with the proviso that when $B^1$ represents a hydrogen atom, D represents a moiety having at least two cross-linkable functionalities. When $B^1$ is hydrogen preferably D represents a moiety having two or more cross-linkable functionalities, such that D is:
—$B^2$—$S^3$—$B^3$—$S^{1a}$-A-$S^{2a}$—$B^{1a}$
—$S^3(B^2)$—$B^3$—$S^{1a}$-A-$S^{2a}$—$B^{1a}$
—$S^3(B^2)(B^3)$—$S^{1a}$-A-$S^{2a}$—$B^{1a}$
—$S^3(B^2)(B^3)$ or
-A-$S^2$—$B^1$ wherein $B^{1a}$ represents a moiety having a cross-linkable functionality, or a hydrogen atom;

$B^2$ and $B^3$ each represents a moiety having a cross-linkable functionality;

$S^{1a}$ and $S^{2a}$ are flexible linker groups; and $S^3$ is a spacer group. Where any of the foregoing moieties occur more than once in the compound, in each instance they may be the same or different, i.e. they are independently selected from the foregoing definitions.

Preferably in the moieties having one or more or two or more cross-linkable functionalities, the cross-linkable functionalities are selected from the group consisting of ethylenic, diene, thiol and oxetane.

Preferably the cross-linkable moieties are selected from the group consisting of straight chain and cyclic α,β-unsaturated esters, α,β-unsaturated amides, vinyl ethers and non-conjugated diene cross-linking groups, preferably from the group consisting of methacrylate, ethacrylate, ethylmaleato, ethylfumarato, N-maleimido, vinyloxy, alkylvinyloxy, vinylmaleato, vinylfumarato, N-(2-vinyloxymaleimido) and 1,4-pentadien-3-yl. The vinyl ether function is connected to the flexible linker or spacer ($S^1$, $S^{1a}$, $S^2$, $S^{2a}$ or $S^3$) through an intervening hydrocarbyl structure such as 4-vinyloxyphenyloxy and 2-vinyloxyethyl groups.

If the compounds of the present invention only have a single cross-linking group, then they will be unable to form a network polymer, except when provided in combination with a secondary monomer (or polymer) having two or more cross-linking grounds.

In a preferred aspect, polymerisable cross-linking groups are selected from the group of ethylenic, diene, thiol and oxetane polymerisable cross-linking groups. Ethylenic cross-linking groups are cross-linking groups containing a carbon-carbon double bond. In a preferred aspect, all of the cross-link groups independently represent an ethylenic cross-link group. Favoured ethylenic cross-link groups include electron rich and electron poor ethylenic cross-link groups.

In a preferred aspect the cross-linkable groups undergo cross-link reactions on exposure to radiation. In a preferred aspect the cross-linkable groups are photo cross-linkable groups, i.e. those groups that undergo cross-link reactions on exposure to ultra-violet (UV) light.

Examples of preferred cross-linking groups are straight chain and cyclic α,β-unsaturated esters and α,β-unsaturated amides, straight chain terminal alkenes, bridged cyclic alkenes, thiols, vinyl ethers, cyclic ethers and non-conjugated dienes cross-linking groups. Favoured cross-linking groups therefore include acrylate, methacrylate, monomethylmaleate, monoethylmaleate, monomethylfumarate, monoethylfumarate, 4,4,4-trifluorocrotonate, N-maleimide, ethenyl, N-vinylpyrrolidone, N-substituted-N-vinylformamide, N-substituted-N-vinylalkylamide, norbornene, sulfhydryl, vinyloxy, methylvinyloxy, 1,3-propylene oxide (oxetane), 1,4-pentadiene, 1,6-heptadiene and diallylamine as these groups are particularly suitable for photo cross-linking, especially with UV-light.

In a preferred aspect the cross-linking groups are electron-rich ethylenic cross-linkable groups. Electron rich ethylenic cross-linkable groups contain an ethylene group substituted with one or more electron donating groups. The electron donating group can comprise a heteroatom such as O, N or S. In a preferred aspect the electron rich cross-linkable group is a vinyloxy group. Other electron donating group substituted crosslinking groups are 1-alkenyl ethers such as propen-1-yloxy groups and buten-1-yloxy groups; cyclic vinyl ethers such as cyclohexen-1-yloxy and cyclopenten-1-yloxy; bicyclic vinyl ethers such as 2-norbornen-2-yloxy groups. The cross-link groups are connected to the rest of the structure through an S group

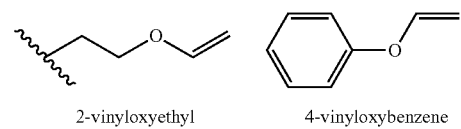

2-vinyloxyethyl    4-vinyloxybenzene

The above groups show examples of cross-linking groups (vinyloxy), also including a portion of the spacer group S (ethyl and phenyl groups).

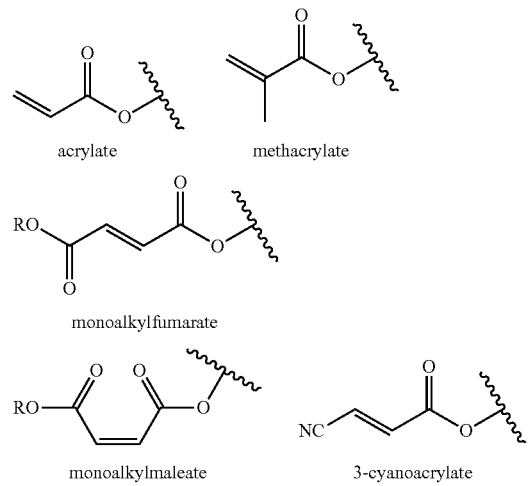

acrylate    methacrylate monoalkylfumarate monoalkylmaleate    3-cyanoacrylate

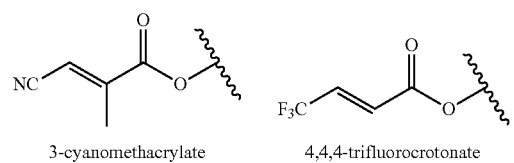

3-cyanomethacrylate    4,4,4-trifluorocrotonate

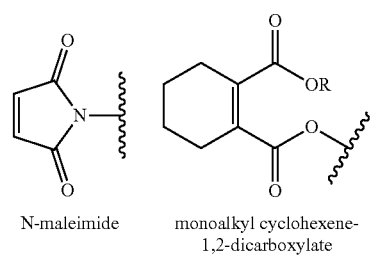

N-maleimide    monoalkyl cyclohexene-1,2-dicarboxylate

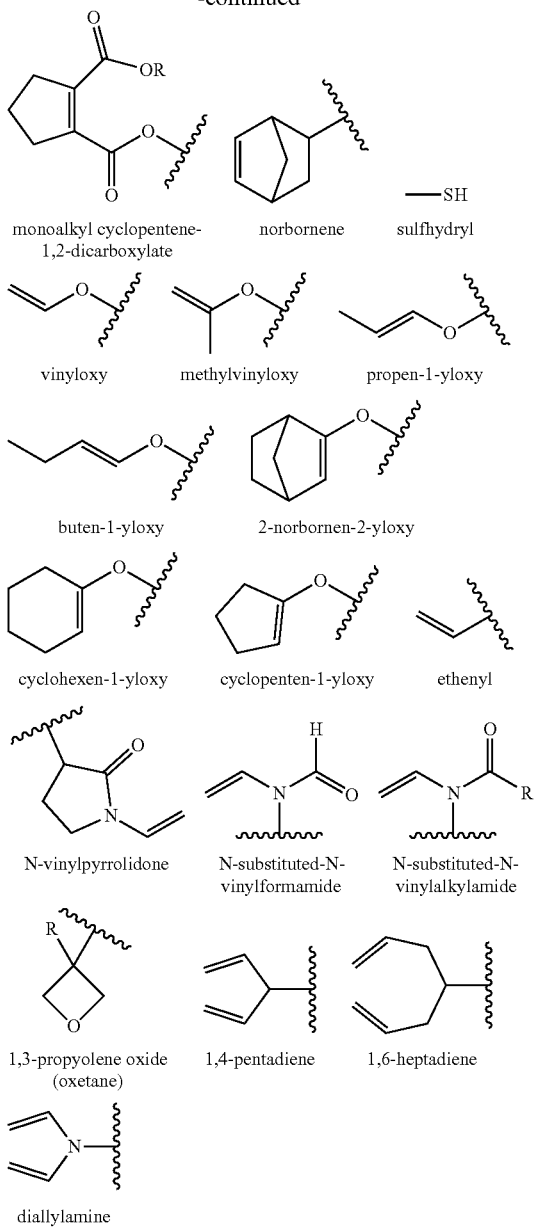

In a preferred aspect the cross-link groups are electron-poor ethylenic cross-linkable groups. Electron deficient ethylenic cross-linkable groups contain an ethylene group substituted with one or more electron withdrawing groups. The electron withdrawing group may comprise a carbonyl group and may for example be an ester or an amide. In a preferred aspect the electron deficient cross-linkable group comprises a monoalkylmaleate group, a monoalkylfumarate group, a monoarylmaleate group, a monoarylfumarate group or a maleimide group. Other examples of electron deficient crosslinking groups are acrylate groups, methacrylate groups, 4,4,4-trifluorocrotonate groups, Z- and E-3-cyanoacrylates, Z- and E-3-cyanomethacrylates, monoalkyl cyclohexene-1,2-dicarboxylates, and monoalkyl cyclopentene-1,2-dicarboxylates.

Preferably D, and $B^1$, $B^2$ and $B^3$, where present, are radiation-activated cross-linkable groups.

Preferably $—S^1$, $—S^2$, $—S^{1a}$ and $—S^{2a}$ in each occurrence are independently of formula II:

$$—K_1—R_3 \qquad \text{Formula (II)}$$

wherein $R_3$ is straight chain or branched $C_5$-$C_{14}$ alkyl, optionally wherein from 1 to 5 $CH_2$ groups are each replaced by an oxygen, provided that no acetal, ketal, peroxide or vinyl ether is present in the $—S^1$, $—S^2$, $—S^{1a}$ or $S^{2a}$ moiety, and wherein $K_1$ is a bond or an ether, ester, carbonate, thioether, amine or amide linkage.

Preferably $—R_3$ in each occurrence is a straight chain $C_5$-$C_{14}$ alkyl, optionally wherein from 1 to 5 $CH_2$ groups are each replaced by an oxygen, provided that no acetal, ketal, peroxide or vinyl ether is present in the $—S^1$, $—S^2$, $—S^{1a}$ or $—S^{2a}$ moiety.

Preferably $—S^3$ in each occurrence is independently of formula III:

$$—K_2—R_4 \qquad \text{Formula (II)}$$

wherein $R_4$ is 1 to 5 $R_5$ moieties each independently connected by a bond, an ether linkage or an ester linkage, where each $R_5$ moiety is independently selected from a straight chain or branched $C_1$-$C_{20}$ alkyl group, a $C_3$-$C_8$ cycloalkyl group, a $C_6$-$C_{16}$ aryl group or a $C_4$-$C_{15}$ heteroaryl group, and optionally wherein each H bonded to a C in each $R_5$ group may independently be replaced by a halogen, and wherein $K_2$ is a bond or an ether, ester, carbonate, thioether, amine or amide linkage. The $R_5$ moieties may be arranged to form a chain, or may form a branched configuration with one or more of the $R_5$ moieties connected together with further $K_2$ groups, or, in one embodiment each connected to the $K_2$ moiety, where $K_2$ represents a carbon (C, CH, $CH_2$) or nitrogen centre (N, NH, $NH_2$).

In a preferred embodiment, each R group attached to the Si comprises a $C_4$-$C_{20}$ alkyl or $C_4$-$C_{20}$ alkenyl and each spacer group $—S^1$ and $—S^2$, comprises a straight chain $C_5$-$C_{14}$ alkyl, optionally wherein from 1 to 5 $CH_2$ groups are each replaced by an oxygen, provided that no acetal, ketal, peroxide or vinyl ether is present in the $—S^1$ or $—S^2$, moiety. The flexible spacers allow the aromatic portions of the molecules to align in a liquid crystalline phase.

In a preferred embodiment, each R group attached to the Si comprises a $C_4$-$C_{20}$ alkyl or $C_4$-$C_{20}$ alkenyl and each spacer group $—S^1$, $—S^2$, $—S^{1a}$ and $—S^{2a}$ comprises a straight chain $C_5$-$C_{14}$ alkyl, optionally wherein from 1 to 5 $CH_2$ groups are each replaced by an oxygen, provided that no acetal, ketal, peroxide or vinyl ether is present in the $—S^1$, $—S^2$, $—S^{1a}$ or $—S^{2a}$ moiety.

Preferably the compound displays liquid crystalline order, and is preferably nematic. In an alternative embodiment the compound displays a smectic phase.

The inventors have found that when the compounds of the present invention exhibit a smectic phase cross-linking the material while in the smectic phase may improve the cross-linking efficiency.

According to a further aspect there is provided a network polymer formed by exposure of the compound as disclosed herein to radiation, optionally wherein said radiation in ultraviolet light.

According to a further aspect there is provided a device comprising one or more charge transport layers and/or emissive layers comprising the network polymer or the compound as disclosed herein.

Preferably the device is an OLED device, a photovoltaic device or a thin film transistor (TFT) device.

Preferably the network polymer or the compound disclosed herein is provided in a hole transporting layer or an electron transporting layer provided directly adjacent an electron transporting layer or a hole transporting layer respectively.

Preferably the device is an OLED device having a light emitting emissive layer and wherein the network polymer or the compound forms a uniformly aligned liquid crystalline structure whereby the light emitting layer emits linearly polarised light.

According to a further aspect there is provided a method for forming a device as disclosed herein, the method comprising providing a layer comprising the compound disclosed herein, selectively irradiating the layer with radiation, preferably with UV radiation, to form a network polymer and washing away any non-irradiated and unpolymerised compound.

Preferably the method further comprises providing a further layer comprising a compound as disclosed herein, selectively irradiating the layer with radiation, preferably with UV radiation, to form a network polymer and washing away any non-irradiated and unpolymerised compound.

According to a further aspect there is provided a device obtainable by the method disclosed herein, comprising two or more network polymers each forming patterned structures, said structures being comprised of materials that are electroluminescent in nature, wherein the wavelength of electroluminescence emitted by one patterned structure is different to the wavelength of electroluminescence emitted by at least one other patterned structure.

According to a further aspect there is provided the use of the compound according to formula IV:

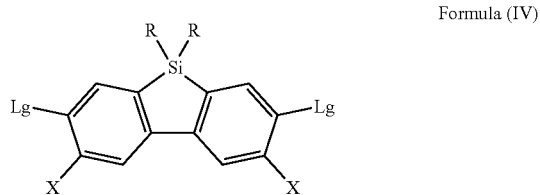

Formula (IV)

wherein Lg is a halogen atom or borate leaving group, preferably Lg is bromine, for synthesising the compound disclosed herein, wherein each R is independently selected from the group consisting of straight chain or branched $C_1$-$C_{20}$ alkyl and $C_2$-$C_{20}$ alkenyl, optionally wherein from 1 to 5 $CH_2$ groups are each replaced by an oxygen, provided that no acetal, ketal, peroxide or vinyl ether is present in the R group, and optionally wherein each H bonded to a C in each R group may independently be replaced by a halogen, wherein the X moieties are the same and are selected from the group consisting of hydrogen, straight chain or branched $C_1$-$C_8$ alkyl, straight chain or branched $C_1$-$C_8$ alkoxyl and a halogen, wherein the compound of formula IV provides one or more E moieties.

According to a further aspect there is provided the use of the compound according to formula V:

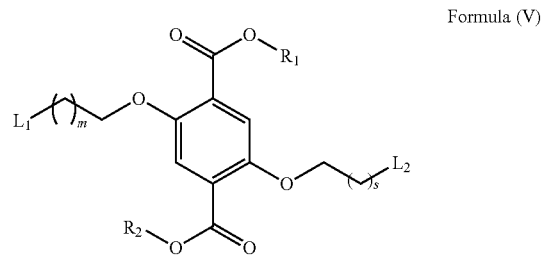

Formula (V)

for synthesising the compound disclosed herein, wherein $R_1$ and $R_2$ are independently selected from the group consisting of $C_1$-$C_{12}$ alkyl, $C_6$-$C_{10}$ aryl or $C_5$-$C_9$ heteroaryl;

wherein $L_1$ and $L_2$ are independently selected leaving groups, optionally selected from Cl, Br, I, O-Tosyl, O-Mesyl or O-Triflyl; and wherein m and s are each an integer independently selected from 1 to 10, the synthesis comprising a step of alkylating a phenolic oxygen with the compound of Formula V, wherein the compound of formula V provides one or more $S^3$ moieties.

Preferably the compound according to Formula V is diethyl-2,5-di(bromohexyl) oxyterephthalate.

There is disclosed herein a species $Ar^a$, which can be independently selected from, amongst others, a $C_6$-$C_{22}$ aromatic moiety and a diradical comprising a heteroaromatic moiety having 4 to 22 carbon atoms diradical. Although various lists are provided herein, especially divided into two separate sections, a complete list of preferred embodiments is as follows: Phenylene-1,3-diyl, phenylene-1,4-diyl, phenylenevinylene-1,4-diyl, cyanophenylenevinylene-1,4-diyl, phenyleneethynylene-1,4-diyl, 2,5-dialkoxybenzene-1,4-diyl, naphthalene-1,4-diyl, naphthalene-2,6-diyl, anthracene-9,10-diyl, 9,9-dialkylfluorene-2,7-diyl, 9,9-dialkylfluorene-3,6-diyl, 6,12-dihydro-6,6,12,12-tetraoctyl-indeno[1,2-b]fluorene-2,8-diyl, 6,12-dihydro-6,6,12,12-tetraoctyl-indeno[1,2-b]fluorene-3,9-diyl, 9-(1'-alkylidene) fluorene)-2,7-diyl, 2-methylbenzene-1,4-diyl, 2,6-xylene-1,4-diyl, 2,5-xylene-1,4-diyl, 2,3-xylene-1,4-diyl, 2,3,5-trimethylbenzene-1,4-diyl, 2,3,5,6-durene-1,4-diyl, 2-fluorobenzene-1,4-diyl, 2,6-difluorobenzene-1,4-diyl, 2,5-difluorobenzene-1,4-diyl, 2,3-difluorobenzene-1,4-diyl, 2,3,5-trifluorobenzene-1,4-diyl, 2,3,5,6-tetrafluorobenzene-1,4-diyl, perylene-3,10-diyl, perylene-2,8-diyl, perylene-3,9-diyl and pyrene-2,7-diyl, 2,2'-dithiophene-5,5'-diyl, furan-2,5-diyl, thiophene-2,5-diyl, pyrimidine-2,5-diyl, pyridine-2,5-diyl, 1,2,4,5-tetrazine-3,6-diyl, 1,2,4-oxazole-3,5-diyl, 1,3,4-oxadiazole-2,5-diyl, 1,2,5-oxadiazole-3,4-diyl, 2,5-dialoxybenzene-1,4-diyl, thieno[3,2-b]thiophene-2,5-diyl, dithieno[3,2-b:2',3'-d]thiophene-2,6-diyl, dithieno[3,2-b:2',3'-d]thiophene-3,7-diyl, dibenzothiophene-3,7-diyl, dibenzothiophene-4,6-diyl, dibenzothiophene-2,8-diyl, benzo[1,2-b:4,5-b']bis[1]benzothiophene-3,9-diyl, thiazolo[5,4-d]thiazole-2,5-diyl, oxazolo[5,4-d]oxazole-2,5-diyl, thiazolo[5,4-d]oxazole-2,5-diyl, thiazolo[4,5-d]thiazole-2,5-diyl, oxazolo[4,5-d]oxazole-2,5-diyl, thiazolo[4,5-d]oxazole-2,5-diyl, 2,1,3-benzothiadiazole-4,7-diyl, 4-thien-2-yl-2,1,3-benzothiazole-7,5'-diyl, 9-fluorenone-2,7-diyl, 4,7-dithien-2-yl-2,1,3-benzothiazole-5',5"-diyl, 2,1,3-benzooxadiazole-4,7-diyl, imidazo[4,5-d]imidazole-2,5-diyl, 4-alkyl-1,2,4-triazole-3,5-diyl, N-alkylcarbazole-2,7-diyl, N-alkylcarbazole-3,6-diyl, 5,11-dialkylindolo[3,2-b]carbazole-3,9-diyl, 5,11-dialkylindolo[3,2-b]carbazole-2,8-diyl, 2,9-dialkylcarbazolo[3,2-b]carbazole-4,11-diyl, 2,9-dialkylcarbazolo[3,2-b]carbazole-5,12-diyl, 5,7-dihydroindolo[2,3-b]carbazole-2,10-diyl, 11,12-dihydroindolo[2,3-a]carbazole-3,8-diyl, 1,7-dialkyldiindolo[3,2-b]thiophenes-3,9-diyl, 1,7-dialkyldiindolo[3,2-b]thiophenes-4,10-diyl, benzo[b]benzo[4,5]thieno[2,3-d]thiophene-2,7-diyl, benzo[1,2-d:4,5-d']bis(oxazole)-2,6-diyl, benzo[1,2-b:4,5-b']dithiophene-2,6-diyl, benzo[1,2-b:5,4 b']dithiophene 2,6 diyl, [1]benzothieno[3,2-b][1]benzothiophene-2,7-diyl, benzo[1,2-d:4,5-d']bisoxazole-2,6-diyl, benzo[1,2-d:5,4-d']bisoxazole-2,6-diyl, dibenzo[b,d]thiophene-5,5-dioxide-3,7-diyl, 5,5-dioxodibenzothiophene-3,7-diyl, 3,4,5-triphenyl-4H-1,2,4-triazole-4,4-diyl, benzo[d]oxazole-2,6-diyl, triphenylamine-4,4-diyl, N,N-diphenylnaphthalen-2-amine-4,4-diyl, N,N-diphenylnaphthalen-1-amine-4,4-diyl diradicals.

A preferred list is as follows: Phenylene-1,4-diyl, phenylenevinylene-1,4-diyl, phenyleneethynylene-1,4-diyl, 9,9-dialkylfluorene-2,7-diyl, 9,9-dialkylfluorene-3,6-diyl, 9-(1'-alkylidene)fluorene-2,7-diyl, 2,5-dialkoxybenzene-1,4-diyl, 6,12-dihydro-6,6,12,12-tetraoctyl-indeno[1,2-b]fluorene-2,8-diyl, 6,12-dihydro-6,6,12,12-tetraoctyl-indeno[1,2-b]fluorene-3,9-diyl, 5,11-dialkylindolo[3,2-b]carbazole-3,9-diyl, 5,11-dialkylindolo[3,2-b]carbazole-2,8-diyl, naphthalene-2,6-diyl, naphthalene-1,4-diyl, cyanophenylenevinylene-1,4-diyl, benzo[b]benzo[4,5]thieno[2,3-d]thiophene-2,7-diyl, benzo[1,2-b:4,5-b']dithiophene-2,6-diyl, benzo[1,2-d:4,5-d']bis(oxazole)-2,6-diyl, dibenzo[b,d]thiophene-5,5-dioxide-3,7-diyl, 2,1,3-benzothiadiazole-4,7-diyl, 2,1,3-benzooxadiazole-4,7-diyl, pyridine-2,5-diyl, pyrimidine-2,5-diyl, 1,2,4,5-tetrazine-3,6-diyl, furan-2,5-diyl, thiophene-2,5-diyl, 1,3,4-thiadiazole-2,5-diyl, 1,3,4-oxadiazole-2,5-diyl, 9-fluorenone-2,7-diyl, N-alkylcarbazole-2,7-diyl, N-alkylcarbazole-3,6-diyl, 2-methylbenzene-1,4-diyl, 2,6-xylene-1,4-diyl, 2,5-xylene-1,4-diyl, 2,3-xylene-1,4-diyl, 2,3,5-trimethylbenzene-1,4-diyl, 2,3,5,6-durene-1,4-diyl, triphenylamine-4,4-diyl, N,N-diphenylnaphthalen-2-amine-4,4-diyl, N,N-diphenylnaphthalen-1-amine-4,4-diyl, 2-fluorobenzene-1,4-diyl, 2,6-difluorobenzene-1,4-diyl, 2,5-difluorobenzene-1,4-diyl, 2,3-difluorobenzene-1,4-diyl, 2,3,5-trifluorobenzene-1,4-diyl, 2,3,5,6-tetrafluorobenzene-1,4-diyl, 3,4,5-triphenyl-4H-1,2,4-triazole-4,4-diyl, benzo[d]oxazole-2,6-diyl di-radicals.

Preferred Embodiments

In the following the term "cross-linking group" is used as short-hand for the term "moiety having a cross-linkable functionality".

In the following the term "mutually connected by a single bond" is used as short-hand for the requirement that the moieties form a conjugated chain.

In one embodiment there is provided a compound of the formula Ia wherein the R groups of each E moiety are identical or different and are selected from the group consisting of straight chain or branched $C_4$-$C_{12}$ alkyl, $C_4$-$C_{12}$ haloalkyl, $C_4$-$C_{12}$ fluoroalkyl, $C_4$-$C_{12}$ alkenyl group, optionally wherein 1, 2, or 3 $CH_2$ groups are replaced by an oxygen, provided that no acetal, ketal, peroxide or vinyl ether is present in the R group, further wherein D, $B^1$, $B^2$, $B^3$, $S^1$, $S^{1a}$, $S^2$, $S^{2a}$, $S^3$, $Ar^1$, $Ar^2$, E and n are defined as above for compounds of formula (I).

In one embodiment there is provided a compound of the formula Ib wherein the R groups of each E moiety are identical or different and are selected from the group consisting of straight chain $C_4$-$C_{12}$ alkyl, $C_4$-$C_{12}$ haloalkyl, $C_4$-$C_{12}$ fluoroalkyl, $C_4$-$C_{12}$ alkenyl group, optionally wherein 1, 2, or 3 $CH_2$ groups are replaced by an oxygen, provided that no acetal, ketal, peroxide or vinyl ether is present in the R group, further wherein D, $B^1$, $B^2$, $B^3$, $S^1$, $S^{1a}$, $S^2$, $S^{2a}$, $S^3$, $Ar^1$, $Ar^2$, E and n are defined as above for compounds of formula (I).

In one embodiment there is provided a compound of the formula Ic wherein the R groups of each E moiety are identical or different and are selected from the group consisting of straight chain or branched $C_4$-$C_{12}$ alkyl and $C_4$-$C_{12}$ fluoroalkyl, further wherein D, $B^1$, $B^2$, $B^3$, $S^1$, $S^{1a}$, $S^2$, $S^{2a}$, $S^3$, $Ar^1$, $Ar^2$, E and n are defined as above for compounds of formula (I).

In one embodiment there is provided a compound of the formula Id wherein the R groups of each E moiety are identical or different and are selected from the group consisting of straight chain or branched $C_1$-$C_{16}$ alkyl, preferably $C_4$-$C_{12}$ alkyl, preferably $C_3$-$C_8$ alkyl, or selected from methyl, ethyl, propyl, butyl, pentyl, hexyl, heptyl, octyl, nonyl, decyl, further wherein D, $B^1$, $B^2$, $B^3$, $S^1$, $S^{1a}$, $S^2$, $S^{2a}$, $S^3$, $Ar^1$, $Ar^2$, E and n are defined as above for compounds of formula (I).

In one embodiment there is provided a compound of the formula Ie wherein the R groups of each E moiety are identical or different and are selected from the group consisting of straight chain $C_1$-$C_{16}$ alkyl, preferably $C_4$-$C_{12}$ alkyl, preferably $C_3$-$C_8$ alkyl, or selected from methyl, ethyl, propyl, butyl, pentyl, hexyl, heptyl, octyl, nonyl, decyl, further wherein D, $B^1$, $B^2$, $B^3$, $S^1$, $S^{1a}$, $S^2$, $S^{2a}$, $S^3$, $Ar^1$, $Ar^2$, E and n are defined as above for compounds of formula (I).

Preferably in each of the above embodiments, each R group in each E moiety are provided as an identical pair for ease of synthesis. That is, preferably each E moiety is symmetrical.

In one embodiment there is provided a compound of formula If wherein n is an integer from 1 to 6 further wherein D, $B^1$, $B^2$, $B^3$, $S^1$, $S^{1a}$, $S^2$, $S^{2a}$, $S^3$, $Ar^1$, $Ar^2$, E and R are defined as above for compounds of formula (I), (Ia), (Ib), (Ic), (Id) or (Ie).

In one embodiment there is provided a compound of formula Ig wherein n is an integer from 3 to 6, further wherein D, $B^1$, $B^2$, $B^3$, $S^1$, $S^{1a}$, $S^2$, $S^{2a}$, $S^3$, $Ar^1$, $Ar^2$, E and R are defined as above for compounds of formula (I), (Ia), (Ib), (Ic), (Id) or (Ie).

In one embodiment there is provided a compound of formula Ih wherein $Ar^1$ and $Ar^2$ in each occurrence are independently selected from the group comprising $Ar^a$ and a bond, wherein $Ar^a$ represents a diradical comprising 1 aromatic, heteroaromatic, or E moiety, or 2 or 3 aromatic, heteroaromatic, or E moieties mutually connected by a single bond, further wherein D, $B^1$, $B^2$, $B^3$, $S^1$, $S^{1a}$, $S^2$, $S^{2a}$, $S^3$, E, R and n are defined as above for compounds of formula (I), (Ia), (Ib), (Ic), (Id), (Ie), (If) or (Ig).

In one embodiment there is provided a compound of formula Ii wherein $Ar^1$ and $Ar^2$ in each occurrence are independently selected from the group comprising $Ar^a$ and a bond, wherein and $Ar^a$ represents a diradical comprising 1 aromatic, heteroaromatic or E moiety, or 2 or 3 aromatic, heteroaromatic and/or E moieties mutually connected by single bonds, and wherein the aromatic and heteroaromatic moieties are in each occurrence independently selected from the group consisting of 1,3-phenylene, 1,4-phenylene, 1,4-phenylenevinylene, naphthalene-1,4-diyl, naphthalene-2,6-diyl, 9,9-dialkylfluorene-2,7-diyl, 99-dialkylfluorene-3,6-diyl, 9-(1'-alkylidene)fluorene)-2,7-diyl, 1,3-xylene-2,5-diyl, 1,4-xylene-2,5-diyl, durene-3,6-diyl, perylene-3,10- diyl, perylene-2,8-diyl, perylene-3,9-diyl and pyrene-2,7-diyl, 2,2'-dithiophene-5,5'-diyl, furan-2,5-diyl, thiophene-2,5-diyl, pyrimidine-2,5-diyl, pyridine-2,5-diyl, 1,2,4,5-tetrazine-3,6-diyl, 1,2,4-oxazole-3,5-diyl, 1,3,4-oxadiazole-2,5-diyl, 1,2,5-oxadiazole-3,4-diyl, 2,5-dialoxybenzene-1,4-diyl, thieno[3,2-b]thiophene-2,5-diyl, dithieno[3,2-b:2',3'-d]thiophene-2,6-diyl, dithieno[3,2-b:2',3'-d]thiophene-3,7-diyl, dibenzothiophene-3,7-diyl, dibenzothiophene-4,6-diyl and dibenzothiophene-2,8-diyl, benzo[1,2-b:4,5-b']bis[1]benzothiophene-3,9-diyl, thiazolo[5,4-d]thiazole-2,5-diyl, oxazolo[5,4-d]oxazole-2,5-diyl, thiazolo[5,4-d]oxazole-2,5-diyl, thiazolo[4,5-d]thiazole-2,5-diyl, oxazolo[4,5-d]oxazole-2,5-diyl, thiazolo[4,5-d]oxazole-2,5-diyl, 2,1,3-benzothiadiazole-4,7-diyl, 4-thien-2-yl-2,1,3-benzothiazole-7,5'-diyl, 4,7-dithien-2-yl-2,1,3-benzothiazole-5',5''-diyl, imidazo[4,5-d]imidazole-2,5-diyl, 4-alkyl-1,2,4-triazole-3,5-diyl, 9-alkylcarbazole-2,7-diyl, 9-alkylcarbazole-3,6-diyl, 1,7-dialkylindolo[2,3-b]carbazole-3,9-diyl, 1,7-dialkylindolo[2,3-b]carbazole-2,8-diyl, 2,9-dialkylcarbazolo[3,2-b]carbazole-4,11-diyl, 2,9-dialkylcarbazolo[3,2-b]carbazole-5,12-diyl, 1,7-dialkyldiindolo[3,2-b]thiophenes-3,9-diyl, 1,7-dialkyldiindolo[3,2-b]thiophenes-4,10-diyl, benzo[1,2-b:4,5-b']dithiophene-2,6-diyl, benzo[1,2-b:5,4-b']dithiophene-2,6-diyl, [1]benzothieno[3,2-b][1]benzothiophene-2,7-diyl, benzo[1,2-d:4,5-d']bisoxazole-2,6-diyl, benzo[1,2-d:5,4-d']bisoxazole-2,6-diyl, and 5,5-dioxodibenzothiophene-3,7-diyl diradicals, further wherein D, $B^1$, $B^2$, $B^3$, $S^1$, $S^{1a}$, $S^2$, $S^{2a}$, $S^3$, E, R and n are defined as above for compounds of formula (I), (Ia), (Ib), (Ic), (Id), (Ie), (If) or (Ig).

In one embodiment (e.g. an embodiment in which the compounds are to be used as hole transporting materials) there is provided a compound of formula Ij wherein $Ar^1$ and $Ar^2$ in each occurrence are independently selected from the group comprising $Ar^a$ and a bond, wherein and $Ar^a$ represents a diradical comprising 1 aromatic, heteroaromatic or E moiety, or 2 or 3 aromatic, heteroaromatic and/or E moieties mutually connected by single bonds, and wherein the aromatic and heteroaromatic moieties are in each occurrence independently selected from the group consisting of 1,3-phenylene, 1,4-phenylene, naphthalene-1,4-diyl, naphthalene-2,6-diyl, 1,3-xylene-2,5-diyl, 1,4-xylene-2,5-diyl, durene-3,6-diyl, thiophene-2,5-diyl, perylene-3,10-diyl, pyrene-2,7-diyl, perylene-2,8-diyl, perylene-3,9-diyl, 2,2'-dithiophene-5,5'-diyl, thieno[3,2-b]thiophene-2,5-diyl, dithieno[3,2-b:2',3'-d]thiophene-2,6-diyl, dibenzothiophene-3,7-diyl, benzo[1,2-b:4,5-b']bis[1]benzothiophene-3,9-diyl, 9-alkylcarbazole-2,7-diyl, 9-alkylcarbazole-3,6-diyl, 1,7-dialkylindolo[2,3-b]carbazole-3,9-diyl, 1,7-dialkylindolo[2,3-b]carbazole-2,8-diyl, 2,9-dialkylcarbazolo[3,2-b]carbazole-4,11-diyl, 2,9-dialkylcarbazolo[3,2-b]carbazole-5,12-diyl, benzo[1,2-b:4,5-b']dithiophene-2,6-diyl, benzo[1,2-b:5,4-b']dithiophene-2,6-diyl, or [1]benzothieno[3,2-b][1]benzothiophene-2,7-diyl diradicals, further wherein D, $B^1$, $B^2$, $B^3$, $S^1$, $S^{1a}$, $S^2$, $S^{2a}$, $S^3$, E, R and n are defined as above for compounds of formula (I), (Ia), (Ib), (Ic), (Id), (Ie), (If) or (Ig).

In one embodiment (e.g. an embodiment in which the compounds are to be used as electron transporting materials) there is provided a compound of formula Ik wherein $Ar^1$ and $Ar^2$ in each occurrence are independently selected from the group comprising $Ar^a$ and a bond, wherein and $Ar^a$ represents a diradical comprising 1 aromatic, heteroaromatic or E moiety, or 2 or 3 aromatic, heteroaromatic and/or E moieties mutually connected by single bonds, and wherein the aromatic and heteroaromatic moieties are in each occurrence independently selected from the group consisting of 1,3-phenylene, 1,4-phenylene, naphthalene-1,4-diyl, naphthalene-2,6-diyl, pyrimidine-2,5-diyl, perylene-3,10-diyl, perylene-2,8-diyl, perylene-3,9-diyl, pyrene-2,7-diyl, oxazole-2,5-diyl, 1,3,4-oxadiazole-2,5-diyl, oxazolo[4,5-d]oxazole-2,5-diyl, oxazolo[5,4-d]oxazole-2,5-diyl, 4-alkyl-1,2,4-triazole-3,5-diyl, imidazo[4,5-d]imidazole-2,5-diyl, benzo[1,2-d:4,5-d']bisoxazole-2,6-diyl, benzo[1,2-d:5,4-d']bisoxazole-2,6-diyl, or 5,5-dioxodibenzothiophene-3,7-diyldiradicals and further wherein D, $B^1$, $B^2$, $B^3$, $S^1$, $S^{1a}$, $S^2$, $S^{2a}$, $S^3$, E, R and n are defined as above for compounds of formula (I), (Ia), (Ib), (Ic), (Id), (Ie), (If) or (Ig).

In one embodiment there is provided a compound of formula II wherein $S^1$, $S^{1a}$, $S^2$ and $S^{2a}$ in each occurrence are independently selected from straight chain or branched $C_5$-$C_{14}$ alkyl groups, optionally wherein 1, 2, 3, 4 or 5 methylene groups are substituted for an oxygen atom provided that no acetal, ketal or peroxide is present, that is connected to A through either a bond or an ether, ester, carbonate, thioether, amine or amide linkage and that is connected through either a bond or an ether, ester, carbonate, thioether, amine or amide linkage to D, $B^1$, $B^2$, $B^3$ or $S^3$ as determined by the nature of D, further wherein D, $B^1$, $B^2$, $B^3$, $S^3$, $Ar^1$, $Ar^2$, E, R and n are defined as above for compounds of formula (I), (Ia), (Ib), (Ic), (Id), (Ie), (If), (Ig), (Ih), (Ii), (Ij) or (Ik).

In one embodiment there is provided a compound of formula Im wherein $S^1$, $S^{1a}$, $S^2$ and $S^{2a}$ in each occurrence are independently selected from straight chain or branched $C_5$-$C_{14}$ alkyl groups, optionally wherein 1, 2, 3, 4 or 5 methylene groups are substituted for an oxygen atom provided that no acetal, ketal or peroxide is present, that is connected to A through either a bond or an ether, ester or carbonate linkage and that is connected through a bond, an ether, ester or carbonate linkage to D, $B^1$, $B^2$, $B^3$ or $S^3$ as determined by the nature of D, further wherein D, $B^1$, $B^2$, $B^3$, $S^3$, $Ar^1$, $Ar^2$, E, R and n are defined as above for compounds of formula (I), (Ia), (Ib), (Ic), (Id), (Ie), (If), (Ig), (Ih), (Ii), (Ij) or (Ik).

In one embodiment there is provided a compound of formula In wherein $S^1$, $S^{1a}$, $S^2$ and $S^{2a}$ in each occurrence are independently selected from straight chain or branched $C_7$-$C_{12}$ alkyl groups, optionally wherein 1, 2, 3 or 4 methylene groups are substituted for an oxygen atom provided that no acetal, ketal or peroxide is produced, that is connected to A through either a bond or an ether, ester, carbonate, thioether, amine or amide linkage and that is connected through a bond, an ether, ester, carbonate, thioether, amine or amide linkage to D, $B^1$, $B^2$, $B^3$ or $S^3$ as determined by the nature of D, further wherein D, $B^1$, $B^2$, $B^3$, $S^3$, $Ar^1$, $Ar^2$, E, R and n are defined as above for compounds of formula (I), (Ia), (Ib), (Ic), (Id), (Ie), (If), (Ig), (Ih), (Ii), (Ij) or (Ik).

In one embodiment there is provided a compound of formula Io wherein $S^1$, $S^{1a}$, $S^2$ and $S^{2a}$ in each occurrence are independently selected from straight chain or branched $C_7$-$C_{12}$ alkyl groups, optionally wherein 1, 2, 3 or 4 methylene groups are substituted for an oxygen atom provided that no acetal, ketal or peroxide is produced, that is connected to A through either a bond or an ether, ester or carbonate linkage and that is connected through a bond, an ether, ester or carbonate linkage to D, $B^1$, $B^2$, $B^3$ or $S^3$ as determined by the nature of D, further wherein D, $B^1$, $B^2$, $B^3$, $S^3$, $Ar^1$, $Ar^2$, E, R and n are defined as above for compounds of formula (I), (Ia), (Ib), (Ic), (Id), (Ie), (If), (Ig), (Ih), (Ii), (Ij) or (Ik).

In one embodiment there is provided a compound of formula Ip wherein $B^1$, $B^2$, $B^3$, and D when it represents a cross-linking group in each occurrence independently represents a radiation activated cross-linking group, optionally a photopolymerisable cross-linking group, further wherein $S^1$, $S^{1a}$, $S^2$, $S^{2a}$, $S^3$, $Ar^1$, $Ar^2$, E, R and n are defined as above for compounds of formula (I), (Ia), (Ib), (Ic), (Id), (Ie), (If), (Ig), (Ih), (Ii), (Ij), (Ik), (IL), (Im), (In), or (Io).

In one embodiment there is provided a compound of formula Iq wherein $B^1$, $B^2$, $B^3$, and D when it represents a cross-linking group in each occurrence is selected from the group comprising alkene cross-linking groups, further wherein $S^1$, $S^{1a}$, $S^2$, $S^{2a}$, $S^3$, $Ar^1$, $Ar^2$, E, R and n are defined as above for compounds of formula (I), (Ia), (Ib), (Ic), (Id), (Ie), (If), (Ig), (Ih), (Ii), (Ij), (Ik), (IL), (Im), (In), or (Io).

In one embodiment there is provided a compound of formula Ir wherein $B^1$, $B^2$, $B^3$, and D when it represents a cross-linking group in each occurrence independently represents an electron rich or electron poor alkene cross-linking group, further wherein $S^1$, $S^{1a}$, $S^2$, $S^{2a}$, $S^3$, $Ar^1$, $Ar^2$, E, R and n are defined as above for compounds of formula (I), (Ia), (Ib), (Ic), (Id), (Ie), (If), (Ig), (Ih), (Ii), (Ij), (Ik), (IL), (Im), (In), or (Io).

In one embodiment there is provided a compound of formula Is wherein $B^1$, $B^2$, $B^3$, and D when it represents a cross-linking group in each occurrence independently represents a photopolymerisable alkene cross-linking group, further wherein $S^1$, $S^{1a}$, $S^2$, $S^{2a}$, $S^3$, $Ar^1$, $Ar^2$, E, R and n are defined as above for compounds of formula (I), (Ia), (Ib), (Ic), (Id), (Ie), (If), (Ig), (Ih), (Ii), (Ij), (Ik), (IL), (Im), (In), or (Io).

In one embodiment there is provided a compound of formula It wherein $B^1$, $B^2$, $B^3$, and D when it represents a cross-linking group in each occurrence independently represents an alkene cross-linking group selected from the group consisting of straight chain and cyclic α,β-unsaturated esters, α,β-unsaturated amides, vinyl ethers, non-conjugated dienes further wherein $S^1$, $S^{1a}$, $S^2$, $S^{2a}$, $S^3$, $Ar^1$, $Ar^2$, E, R and n are defined as above for compounds of formula (I), (Ia), (Ib), (Ic), (Id), (Ie), (If), (Ig), (Ih), (Ii), (Ij), (Ik), (IL), (Im), (In), or (Io).

In one embodiment there is provided a compound of formula Iu wherein $B^1$, $B^2$, $B^3$, and D when it represents a cross-linking group in each occurrence independently represents an alkene cross-linking group selected from the group consisting of methacrylate, ethacrylate, ethylmaleato, ethylfumarato, N-maleimido, vinyloxy, alkylvinyloxy, vinylmaleato, vinylfumarato, N-(2-vinyloxymaleimido) and 1,4-pentadien-3-yl groups further wherein $S^1$, $S^{1a}$, $S^2$, $S^{2a}$, $S^3$, $Ar^1$, $Ar^2$, E, R and n are defined as above for compounds of formula (I), (Ia), (Ib), (Ic), (Id), (Ie), (If), (Ig), (Ih), (Ii), (Ij), (Ik), (IL), (Im), (In), or (Io).

In one embodiment there is provided a compound of formula Iv wherein $S^3$ represents a $C_1$-$C_{20}$ alkyl group, $C_1$-$C_{20}$ haloalkyl group, a $C_3$-$C_8$ cycloalkyl group, a $C_6$-$C_{16}$ aryl group or a $C_4$-$C_{15}$ heteroaryl group or a chain consisting of 1, 2, 3, 4 or 5 $C_1$-$C_{20}$ alkyl, $C_1$-$C_{20}$ haloalkyl, $C_3$-$C_8$ cycloalkyl, $C_6$-$C_{16}$ aryl and/or $C_4$-$C_{15}$ heteroaryl moieties each independently connected by a bond, an ether linkage or an ester linkage and wherein $S^1$, $S^{1a}$, $S^2$, $S^{2a}$, D, $B^1$, $B^2$, $B^3$, $Ar^1$, $Ar^2$, E, R and n are defined as above for compounds of formula (I), (Ia), (Ib), (Ic), (Id), (Ie), (If), (Ig), (Ih), (Ii), (Ij), (Ik), (IL), (Im), (In), (Io), (Ip), (Iq), (Ir), (Is), (It) or (Iu).

In one embodiment there is provided a compound of formula Iw wherein $S^3$ represents a $C_1$-$C_{14}$ alkyl group, $C_1$-$C_{14}$ haloalkyl group, a $C_5$-$C_6$ cycloalkyl group, a $C_6$-$C_{14}$ aryl group or a chain consisting of 1, 2, 3, 4 or 5 $C_1$-$C_{14}$ alkyl, $C_1$-$C_{14}$ haloalkyl, $C_3$-$C_8$ cycloalkyl and/or $C_6$-$C_{14}$ aryl moieties each independently connected by a bond, an ether linkage or an ester linkage wherein $S^1$, $S^{1a}$, $S^2$, $S^{2a}$, D, $B^1$, $B^2$, $B^3$, $Ar^1$, $Ar^2$, E, R and n are defined as above for compounds of formula (I), (Ia), (Ib), (Ic), (Id), (Ie), (If), (Ig), (Ih), (Ii), (Ij), (Ik), (IL), (Im), (In), (Io), (Ip), (Iq), (Ir), (Is), (It) or (Iu).

In one embodiment there is provided a compound of formula Ix wherein $S^3$ represents a $C_2$-$C_{10}$ alkyl group, $C_2$-$C_{10}$ haloalkyl group, a $C_5$-$C_6$ cycloalkyl group, a $C_6$-$C_{14}$ aryl group or a chain consisting of 1, 2, 3, 4 or 5 $C_1$-$C_{14}$ alkyl, $C_2$-$C_{10}$ haloalkyl, $C_3$-$C_8$ cycloalkyl and/or $C_6$-$C_{14}$ aryl moieties each independently connected by a bond, an ether linkage or an ester linkage wherein $S^1$, $S^{1a}$, $S^2$, $S^{2a}$, D, $B^1$, $B^2$, $B^3$, $Ar^1$, $Ar^2$, E, R and n are defined as above for compounds of formula (I), (Ia), (Ib), (Ic), (Id), (Ie), (If), (Ig), (Ih), (Ii), (Ij), (Ik), (IL), (Im), (In), (Io), (Ip), (Iq), (Ir), (Is), (It) or (Iu).

In one embodiment there is provided a compound of formula Iy wherein $S^3$ represents a group consisting of three $C_2$-$C_{12}$ alkyl groups and two $C_6$-$C_{16}$ aryl groups mutually connected to each other by a bond, an ether linkage or an ester linkage; wherein each $C_6$-$C_{16}$ aryl group is connected i) to the second $C_6$-$C_{16}$ aryl group by a $C_2$-$C_{12}$ alkyl group, ii) to a cross-linker $B^2$ or $B^3$ by a $C_2$-$C_{12}$ alkyl group and iii) directly to $S^1$ and $S^1$a and wherein $S^1$, $S^{1a}$, $S^2$, $S^{2a}$, D, $B^1$, $B^2$, $B^3$, $Ar^1$, $Ar^2$, E, R and n are defined as above for compounds of formula (I), (Ia), (Ib), (Ic), (Id), (Ie), (If), (Ig), (Ih), (Ii), (Ij), (Ik), (IL), (Im), (In), (Io), (Ip), (Iq), (Ir), (Is), (It) or (Iu).

In one embodiment there is provided a compound of formula Iz wherein $S^3$ represents a group consisting of four $C_2$-$C_{12}$ alkyl groups connected to a central $C_6$-$C_{16}$ aryl group mutually connected to each other by a bond, an ether linkage or an ester linkage wherein the end of each independent $C_2$-$C_{12}$ alkyl group not attached to the central $C_6$-$C_{16}$ aryl group terminates in a connection to $B^2$, $B^3$, $S^1$ and $S^{1a}$ and wherein $S^1$, $S^{1a}$, $S^2$, $S^{2a}$, D, $B^1$, $B^2$, $B^3$, $Ar^1$, $Ar^2$, E, R and n are defined as above for compounds of formula (I), (Ia), (Ib), (Ic), (Id), (Ie), (If), (Ig), (Ih), (Ii), (Ij), (Ik), (IL), (Im), (In), (Io), (Ip), (Iq), (Ir), (Is), (It) or (Iu).

In one embodiment there is provided a network polymer formed by cross-linking a plurality of monomers of the formula (I), (Ia), (Ib), (Ic), (Id), (Ie), (If), (Ig), (Ih), (Ii), (Ij), (Ik), (IL), (Im), (In), (Io), (Ip), (Iq), (Ir), (Is), (It), (Iu). (Iv), (Iw), (Ix), (Iy) or (Iz).

In one embodiment there is provided a compound with a structure according formula (I), (Ia), (Ib), (Ic), (Id), (Ie), (If), (Ig), (Ih), (Ii), (Ij), (Ik), (IL), (Im), (In), (Io), (Ip), (Iq), (Ir), (Is), (It), (Iu). (Iv), (Iw), (Ix), (Iy) or (Iz) for use in the fabrication of an OLED device.

The foregoing compounds may be used in the network polymer or devices as described herein. Preferably the compounds are used in an OLED device within an emissive layer. Alternatively the compounds may be used in a device within a charge transport layer either as the compounds or as a cross-linked network polymer.

In a device comprising an interface between a hole transporting layer and an electron transporting layer, preferably either or both of said layers includes a compound as described herein. Such a device is preferably a photovoltaic device or a thin film transistor (TFT) device.

Preferably the device contains a plurality of layers comprising compounds as described herein, wherein each layer is formed (or is obtainable) by an iterative sequential deposition and in situ polymerisation process.

Preferably the device comprises a plurality of patterned structures produced (or obtainable) by exposing a plurality of layers of material comprising the compound. This can be made using a patterned area of radiation, such as ultraviolet light, that causes said layer of material to polymerise and then washing away the unexposed and unpolymerised material.

In one embodiment there is provided a device that contains two or more of the aforementioned patterned structures, said structures being comprised of materials that are electroluminescent in nature, wherein the wavelength of electroluminescence emitted by one patterned structure is different to the wavelength of electroluminescence emitted by at least one other patterned structure.

In one embodiment there is provided a multicolour, dot-matrix display comprising a multiplicity of pixels of multiple colours, each pixel comprising one or more of the aforementioned patterned structures.

In one embodiment there is provided a device that contains two or more of the aforementioned patterned structures, said structures being comprised of materials that are electroluminescent in nature, wherein two or more of the aforementioned patterned structures are overlaid in a stack, further wherein the electroluminescent wavelength of two or more of the patterned structures in each stack is different.

The compounds disclosed herein may be useful in electronic devices as polymerised liquid crystalline materials or as glasses formed by cooling the polymerised liquid crystalline materials. Preferably the liquid crystalline materials exhibit smectic and nemantic mesophases.

The inventors have found that it is possible to "lock in" a nematic liquid crystalline structure by exposing a liquid crystalline fluid containing compounds as described herein to radiation, preferably UV radiation.

In an alternative embodiment, the inventors have found that it is possible to "lock in" a smectic liquid crystalline structure by exposing a liquid crystalline fluid containing compounds as described herein to radiation, preferably UV radiation. The inventors have found that the compounds disclosed herein, when in a smectic phase, may exhibit great cross-linking efficiency than would otherwise be expected. This offers advantages regarding processing efficiency when producing devices containing the compounds.

In one embodiment there is provided a light emitting layer produced by exposing a material comprising a uniformly aligned liquid crystalline structure containing compounds as disclosed herein to radiation. Such a layer may emit linearly polarised light.

In one embodiment there is provided a patterned polarised light emitting structure, produced by exposing a material comprising a uniformly aligned liquid crystalline structure containing compounds as disclosed herein to a patterned area of radiation.

In one embodiment there is provided a device comprising two or more of the above described patterned polarised light emitting structures wherein at least a first polarised light emitting structure has a polarisation axis of light emission that is not aligned with that of at least a second polarised light emitting structure.

In one embodiment there is provided a 3D display produced (or obtainable) by sequential deposition of aligned layers of uniformly aligned liquid crystalline fluid or a glass formed (or obtainable) by cooling a uniformly aligned liquid crystalline fluid that contains cross-linkable molecules as described herein. Such a display could be formed by sequential polymerisation of patterned areas of each layer in turn, and sequentially washing away unpolymerised areas of each layer in turn so as to provide light emitting structures such that the liquid crystalline alignment and thus the polarisation axis of light emission of each respective layer is in a different direction to that of the polarisation axis of light emission in the respective adjacent layers.

In one embodiment there is provided an OLED device comprising a network polymer as disclosed herein as a light emitting dopant in a host material that has a liquid crystalline structure.

DETAILED DESCRIPTION OF THE INVENTION

Figure 1A:
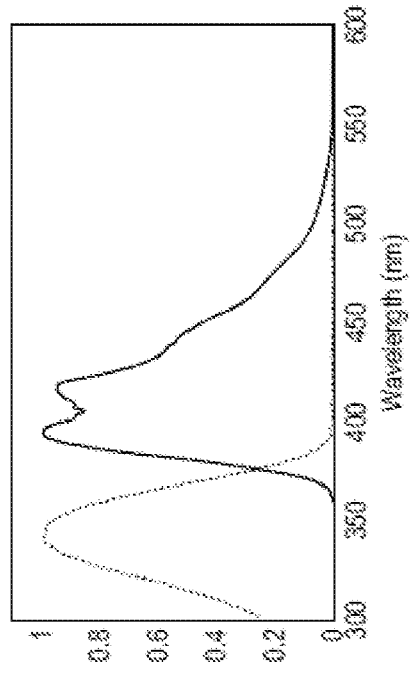
FIGS. 1a, 1b, 1c, and 1d show UV/Vis absorption spectra (blue) and PL spectra (orange) cerain non-cross-linkable compounds.
Figure 1B:
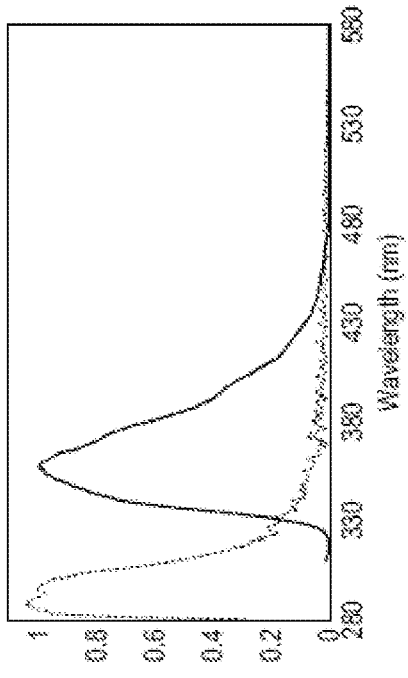
Figure 1C:
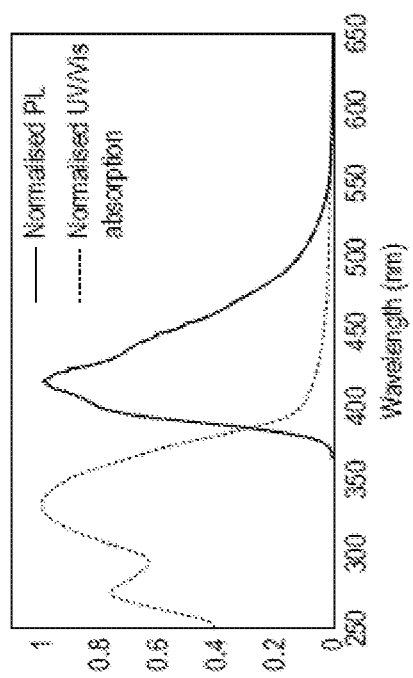
Figure 1D:
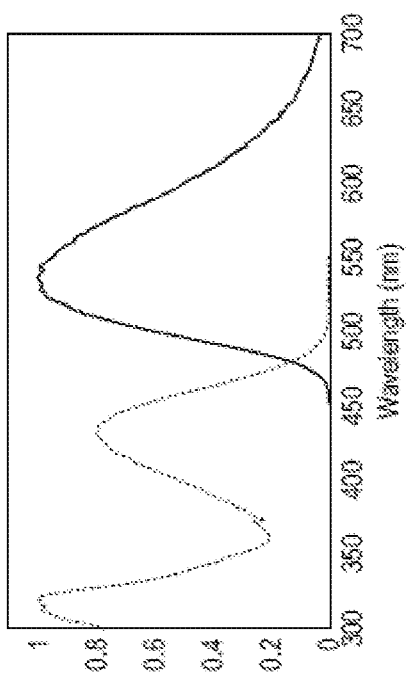
Figure 2A:
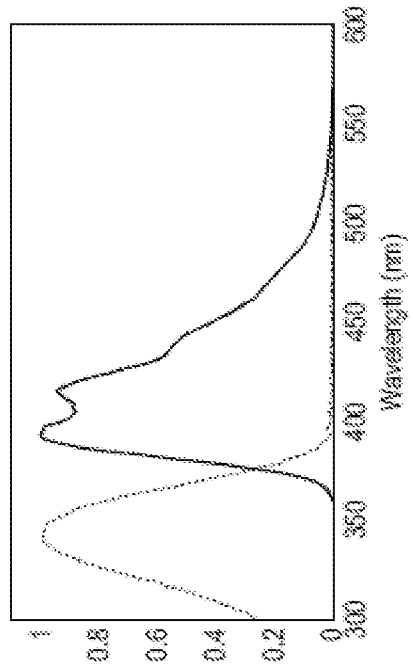
FIGS. 2a, 2b, 2c, 2d, 2e, and 2f show UV/Vis absorption spectra (blue) and PL spectra (orange) for certain cross-linkable compounds.
Figure 2B:
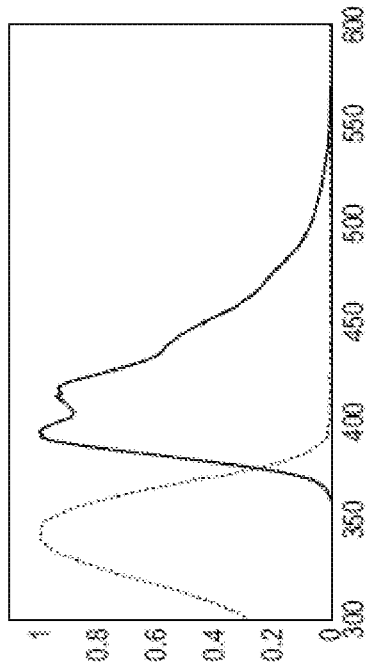
Figure 2C:
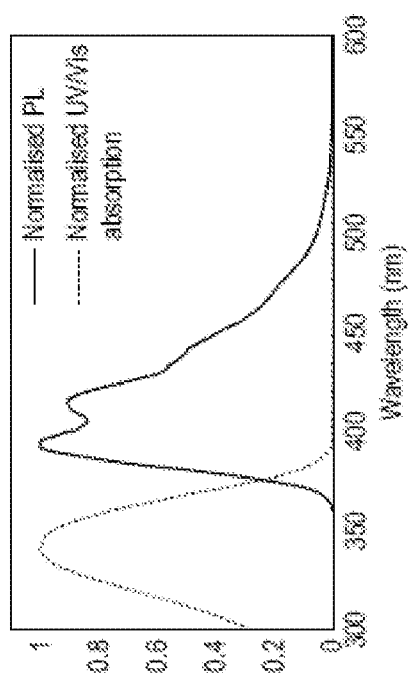
Figure 2D:
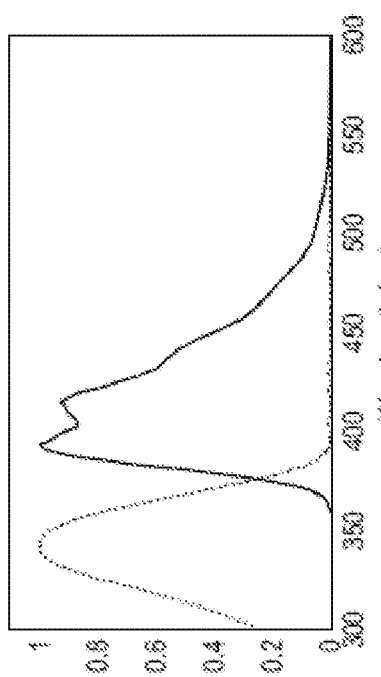
Figure 2E:
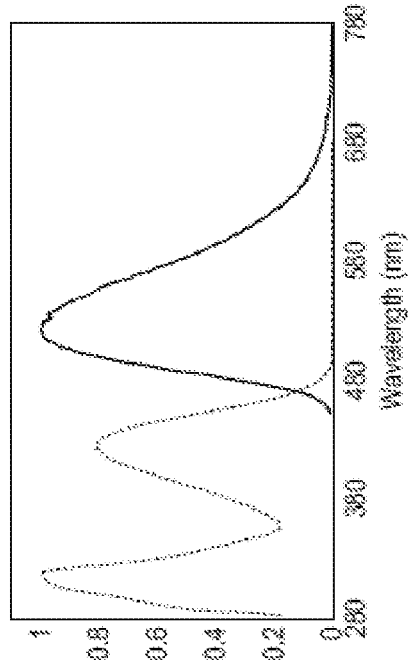
Figure 2F:
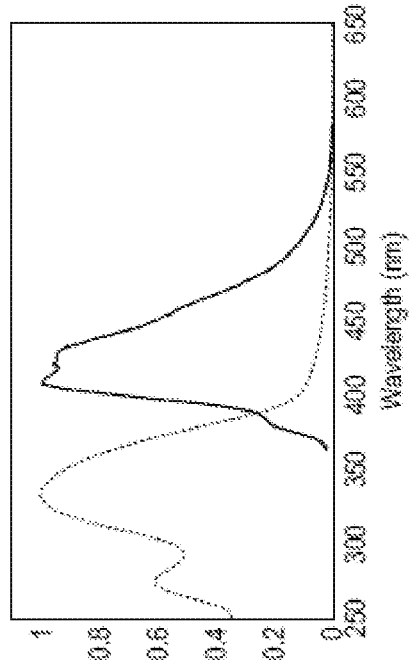
Figure 3A:
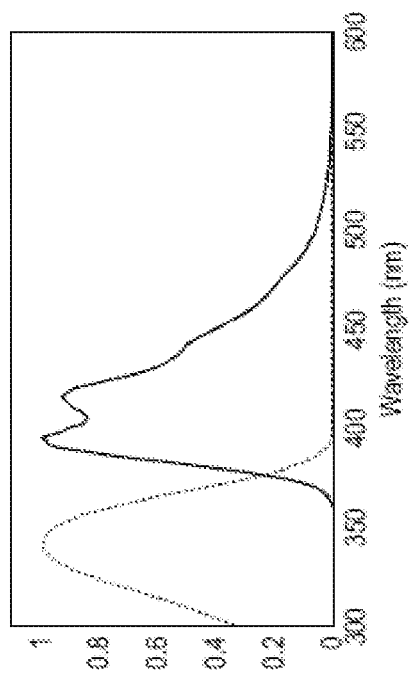
FIGS. 3a, 3b, 3c, and 3d show UV/Vis absorption spectra (blue) and PL spectra (orange) for thin films of non-cross-linkable compounds.
Figure 3B:
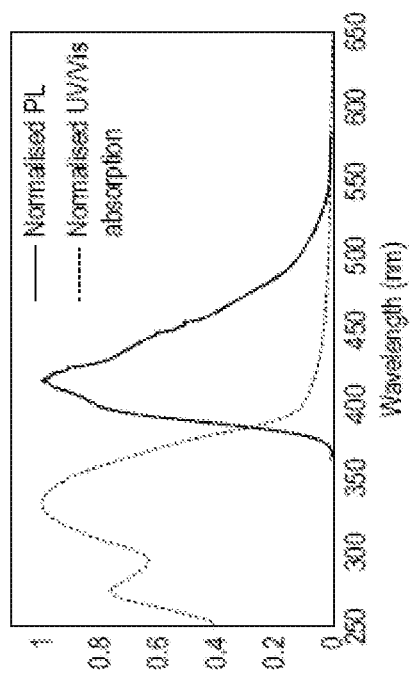
Figure 3C:
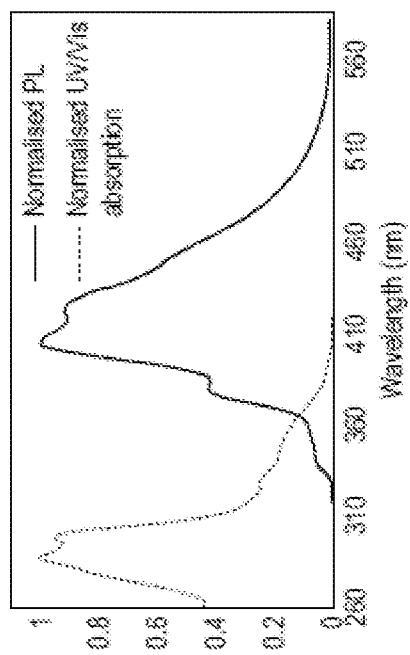
Figure 3D:
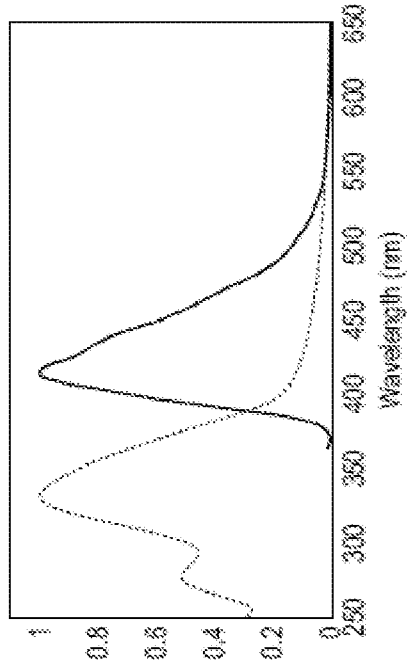
Figure 4A:
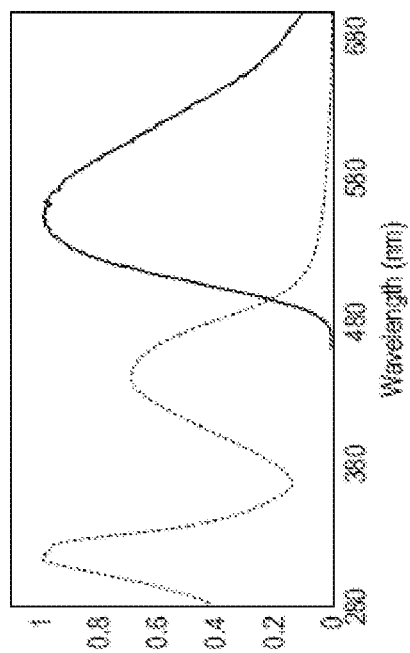
FIGS. 4a, 4b, 4c, 4d, 4e, and 4f show UV/Vis absorption spectra (blue) and PL spectra (orange) for thin films of the cross-linkable compounds.
Figure 4B:
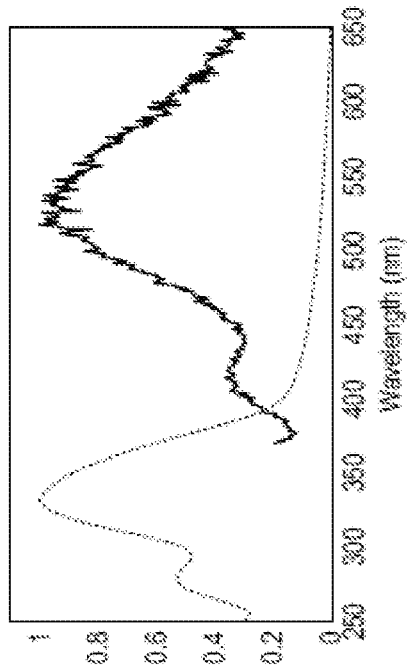
Figure 4C:
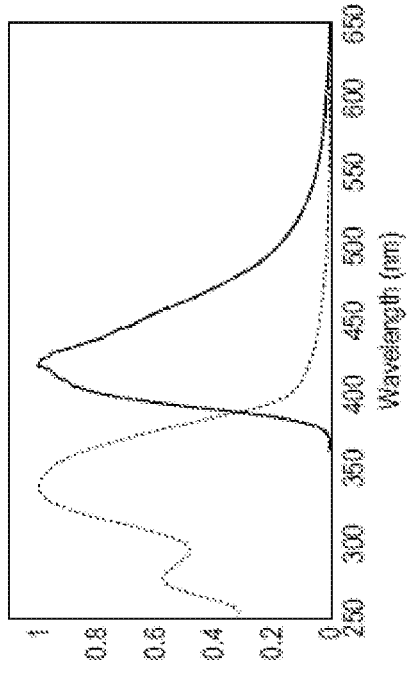
Figure 4D:
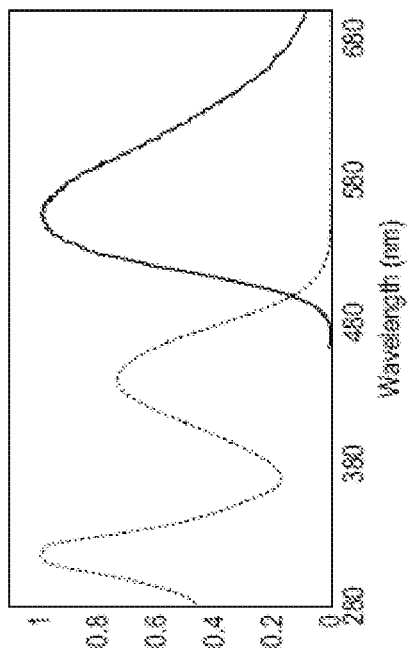
Figure 4E:
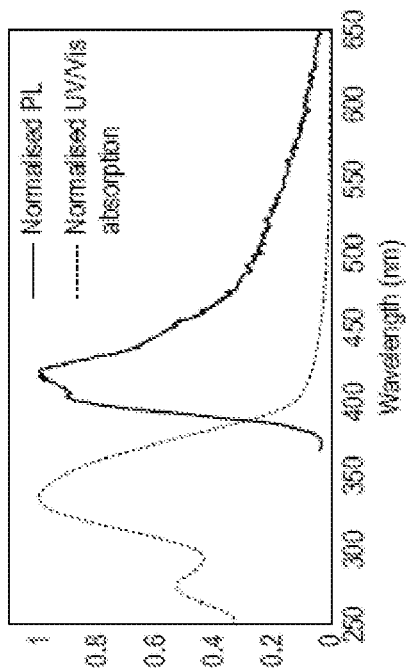
Figure 4F:
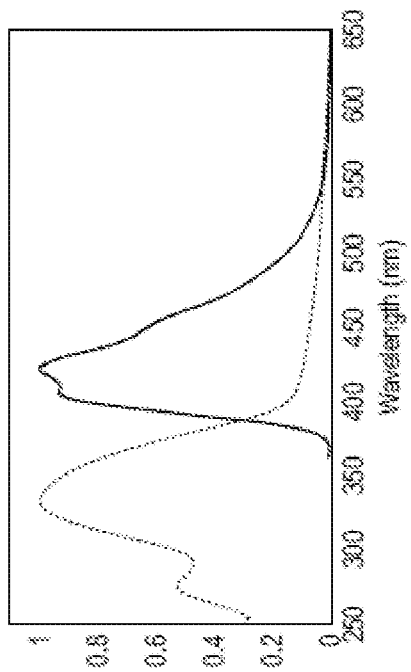

According to one aspect of the invention there is provided a compound of the formula $D\text{-}S^1\text{-}A\text{-}S^2\text{---}B^1$ wherein the groups D, $B^1$, $S^1$, $S^2$ and A are the chemical groups defined herein. A represents a group of the formula $\text{---}Ar^1\text{-}(E\text{-}Ar^2)_n\text{---}$. The component parts of the system are connected to each other through covalent bonds.

Where E is $E^1$ this group may also be presented as a compound of formula 1

Formula 1

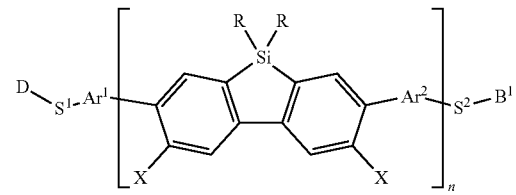

So that the invention may be better understood the nature of the constituent groups and their function is defined herein.

$Ar^1\text{-}(E\text{-}Ar^2)_n\text{---}$

The compounds of the invention comprise a $\text{---}Ar^1\text{-}(E\text{-}Ar^2)_n\text{---}$ group, abbreviated as A, that forms a "substantially linear", or "lathe like", aromatic core of the compound. In one aspect E is a silafluorene diradical of the structure below

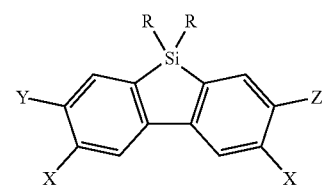

wherein the X groups of each E moiety are identical and are selected from: hydrogen, straight chain or branched $C_1$-$C_8$ alkyl, straight chain or branched $C_1$-$C_8$ alkoxyl and a halogen, and that is incorporated into the chain through covalent bonds at Y and Z.

In another aspect E is a condensed silafluorene unit consisting of multifused pentacyclic and/or hexacyclic arenes:

$E^2$:

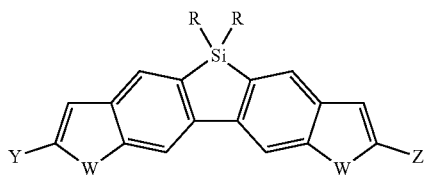

and $E^3$:

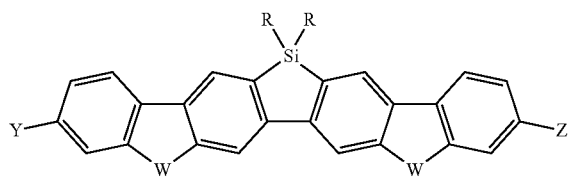

wherein W is either an oxygen or sulfur atom, and that is incorporated into the rest of the molecule through covalent bonds at Y and Z.

The integer n in —$Ar^1$-($E$-$Ar^2$)$_n$— is preferably from 1 to 8. In total each —$Ar^1$-($E$-$Ar^2$)$_n$— group preferably comprises from 1 to 8 E groups. In certain preferred aspects, the number of E in each —$Ar^1$-($E$-$Ar^2$)$_n$— group is selected from 1 to 6, 1 to 3, 3 to 6, or 5, or 6.

Surprisingly, the inventors have found that the compounds disclosed herein exhibit wider liquid crystalline ranges compared to conventional materials. That is, the temperature range of the liquid crystalline phase of the molecules is wider that for conventional materials, such as fluorene-based materials. Advantageously, a wider liquid crystalline range provides processing advantages when producing devices comprising compounds described herein.

The inventors have found that the silicon containing molecules of the present invention are cheaper and easier to synthesise than prior art compounds, and in particular the silicon containing molecules of the present invention are cheaper and easier to synthesise than fluoroalkylfluorene-based materials.

In addition the inventors have also found these compounds exhibit improved photo-crosslinking efficiencies and improved CIE (x,y) coordinates of the cross-linked and non-crosslinkable blue emissive materials, compared to the analogous n-alkylfluorene-based materials.

In the preferred aspect where the compounds of the present invention are suitable for use as light emitters each —$Ar^1$-($E$-$Ar^2$)$_n$— group comprises between 3 and 6 E groups. This is because lower n values lead to molecules with lower light emission efficiency. Further small increases in energy efficiency can be achieved by lengthening the molecular cores even further to n=7 or 8, but increases in efficiency have to be balanced with the increased cost of synthesising such molecules. In embodiments where the compounds of the present invention are suitable for use as a hole transporter, an electron transporter, or a host for a light emitting dopant, —$Ar^1$-($E$-$Ar^2$)$_n$— groups with 1 to 3 E groups are preferred because of their ease of synthesis, lower melting points and higher solubilities.

In this —$Ar^1$-($E$-$Ar^2$)$_n$— or A structure the R groups of each individual E are identical when n is greater than 1 because of the potential for multiple isomers of the material that make purification challenging. For materials with n=1 having different R groups in different E groups can be advantageous because this may cause the melting points to be lowered. The R groups are selected from straight chain or branched $C_1$-$C_{16}$ alkyl, $C_1$-$C_{16}$ haloalkyl, $C_1$-$C_{16}$ fluoroalkyl, $C_2$-$C_{16}$ alkenyl group, optionally wherein 1, 2, 3, 4 or 5 $CH_2$ groups are each replaced by an oxygen provided that no acetal, ketal, peroxide or vinyl ether is present. In other words, if more than one methylene group is replaced by an oxygen atom it will be separated from the next oxygen atom in the chain by at least three covalent bonds. When the R groups are alkenyl groups it is preferred that the alkene is cis and positioned towards the centre of the hydrocarbon, this will reduce the viscosity of the product and consequently the glass transition temperature.

$Ar^1$ and $Ar^2$ in each occurrence are independently selected from the group comprising $Ar^a$ and a bond. $Ar^a$ represents a diradical comprising 1 aromatic, heteroaromatic or E moiety, or 2, 3, 4 or 5 aromatic, heteroaromatic and/or E moieties mutually connected by a single bond.

The overall $Ar^1$-($E$-$Ar^2$)$_n$ chain is preferably "substantially linear" and is devoid of significant branching that would destroy its linearity or its ability to align with adjacent molecules and favours liquid crystallinity. Certain elements of the chain may project from the linear structure. For example, when $Ar^1$ is a naphthalene-1,4-diyl, carbons 5 to 8 project from the side of the chain even though the naphthyl structure is integral to the chain. It can be appreciated that although the chain as a whole is described as linear the nature of the chemical bonds that connect the component parts of the chain dictates that all the chemical bonds in the chain will not be exactly aligned. So long as any curvature in the backbone of the molecular core of the materials molecules does not destroy the liquid crystalline nature of the material or at least its ability to be aligned by liquid crystalline molecules said curvature is allowed. Similarly, branching that preserves the liquid crystalline nature of the material is also allowed.

R

R groups are selected from straight chain or branched $C_1$-$C_{16}$ alkyl, $C_1$-$C_{16}$ haloalkyl, $C_1$-$C_{16}$ fluoroalkyl, $C_2$-$C_{16}$ alkenyl group, optionally wherein 1, 2, 3, 4 or 5 methylene ($CH_2$) groups are replaced by an oxygen provided that no acetal, ketal, peroxide or vinyl ether is present. In other words, if more than one methylene group is replaced by an oxygen atom it will be separated from the next oxygen atom in the chain by at least three covalent bonds and no oxygen atom is connected through a single bond to a carbon-carbon double bond. In some aspects the R groups of each individual E are identical. In another aspect the R groups on every E in the chain are identical.

In a preferred aspect the R groups of each E moiety are identical and are selected from the group consisting of straight chain or branched $C_4$-$C_{12}$alkyl, $C_4$-$C_{12}$ haloalkyl, $C_4$-$C_{12}$ fluoroalkyl, $C_4$-$C_{12}$ alkenyl group, optionally wherein 1, 2, or 3 $CH_2$ groups are replaced an oxygen provided that no acetal, ketal or peroxide is present.

In a preferred aspect the R group is an alkenyl group. Alkenyl groups contain a carbon-carbon double bond. Preferred alkenyl groups contain only one carbon-carbon double bond. In a preferred aspect, where the R group is an alkenyl group it is a central and cis carbon-carbon double bond. In a preferred aspect the cis alkene is of the formula —CH═CH—.

By the term "central" it is meant that the R group is not in a terminal position and is preferably substantially in the middle of the chain and removed from the end of the chains. For example, in a chain of 9 carbon atoms, the R group would be between 4 and 6 inclusive (i.e. 4-5, or 5-6).

As stated above, in some cases one or two or three or four or five methylene groups in the R group may be substituted for an oxygen atom. When this is the case the R group is an ether or polyether. The methylene group is a $CH_2$ group. When two or more methylene groups are replaced by an oxygen atom there are at least two carbon atoms in the chain between them. Additionally, no oxygen atom is connected through a single bond to a carbon-carbon double bond. This is because peroxide, ketal, acetal and vinyl ether units are potentially unstable and are therefore not included in the structure of the compounds of the invention.

Variation of the length of the R group is useful because the melting point of the compound can be modulated. For example, when liquid crystalline compounds are required it can be advantageous to use R groups with from 4 to 16 carbon and oxygen atoms in the chain because $C_1$-alkyl derivatives often exhibit elevated melting points. In preferred aspects the R groups contain between 6 and 12 carbon and oxygen atoms in the chain.

Introduction of oxygen atoms into the R group can advantageously be used to modulate the temperature at which the compound undergoes its glass transition and/or liquid crystalline transition temperature and this can be an advantage for applications when glassy materials are required.

Introduction of a carbon-carbon double bond can be advantageously used to reduce the viscosity of the material and this is especially interesting for compounds that are to be solution processed. Introduction of a cis carbon-carbon double bond towards the centre of the chain is especially advantageous for modulation of the viscosity of the material and liquid crystalline transition temperatures.

Selected examples of E structures with the R group drawn out in full are presented below.

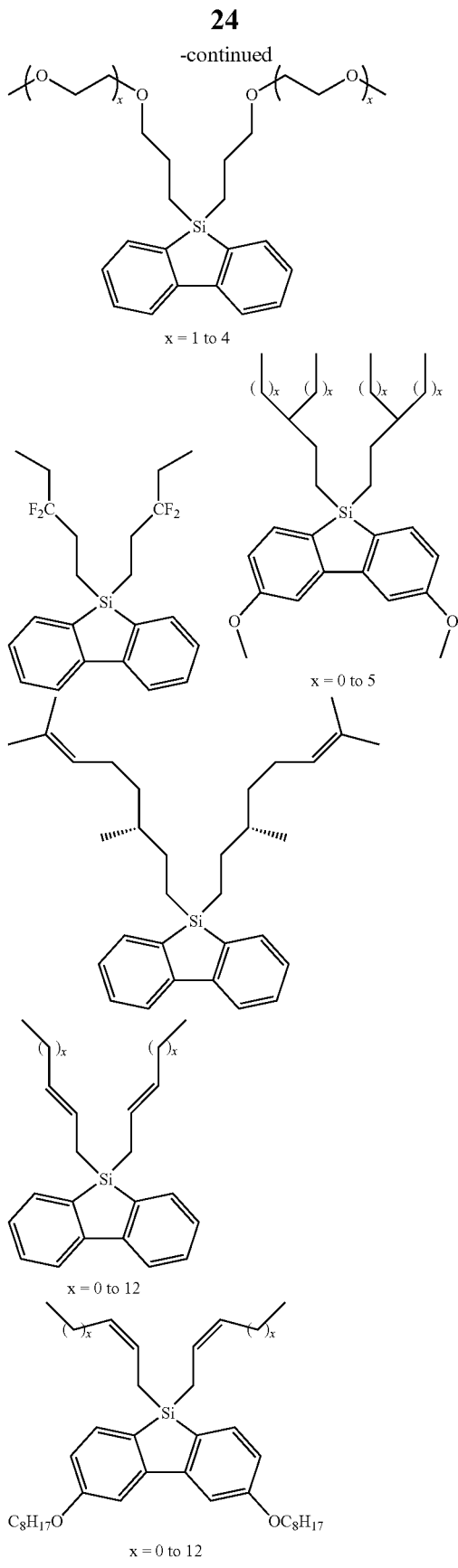

In a particular embodiment the R groups comprise —$CF_2$—$CF_2$—$R^6$ wherein $R^6$ is $C_1$-$C_{18}$ alkyl and $C_2$-$C_{18}$ alkenyl, optionally wherein from 1 to 5 CH$_2$ groups are each replaced by an oxygen, provided that no acetal, ketal, peroxide or vinyl ether is present in the R group, and optionally wherein each H bonded to a C in each R group may independently be replaced by a halogen.

Examples of such R groups are:

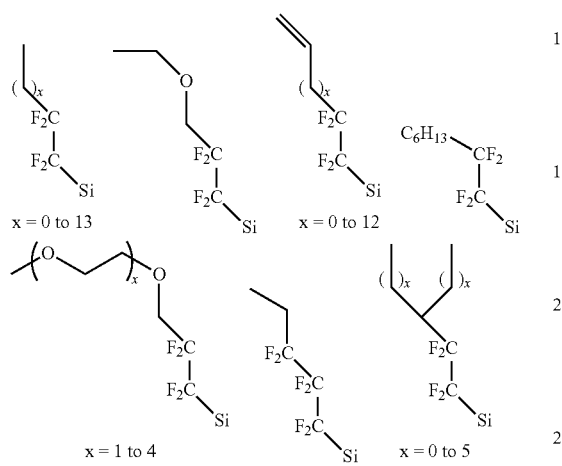

Compounds of the structure

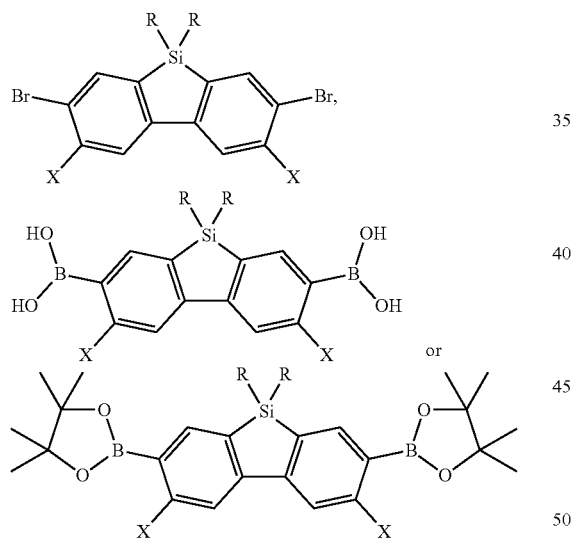

or their E$^2$ and E$^3$ equivalents, are preferred intermediates for the synthesis of compounds containing these silafluorene derivative emitter cores due to their synthetic utility.

Ar$^1$ and Ar$^2$

Ar$^1$ and Ar$^2$ in each occurrence are independently selected from the group comprising Ar$^a$ and a bond. Ar$^a$ represents a diradical comprising 1 aromatic, heteroaromatic or E moiety, or 2, 3, 4 or 5 aromatic, heteroaromatic and/or E moieties mutually connected by single bonds. Diradicals are groups that are covalently bound to two other moieties within the overall structure of the compound, some typical examples are presented below, "|" denotes the typical site of attachment.

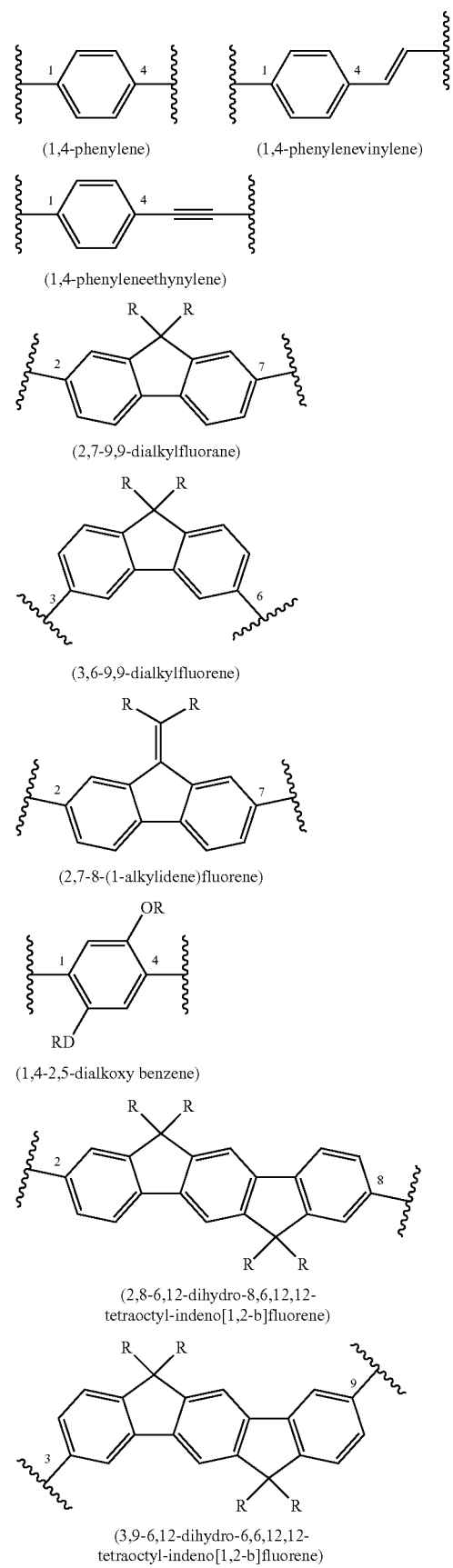

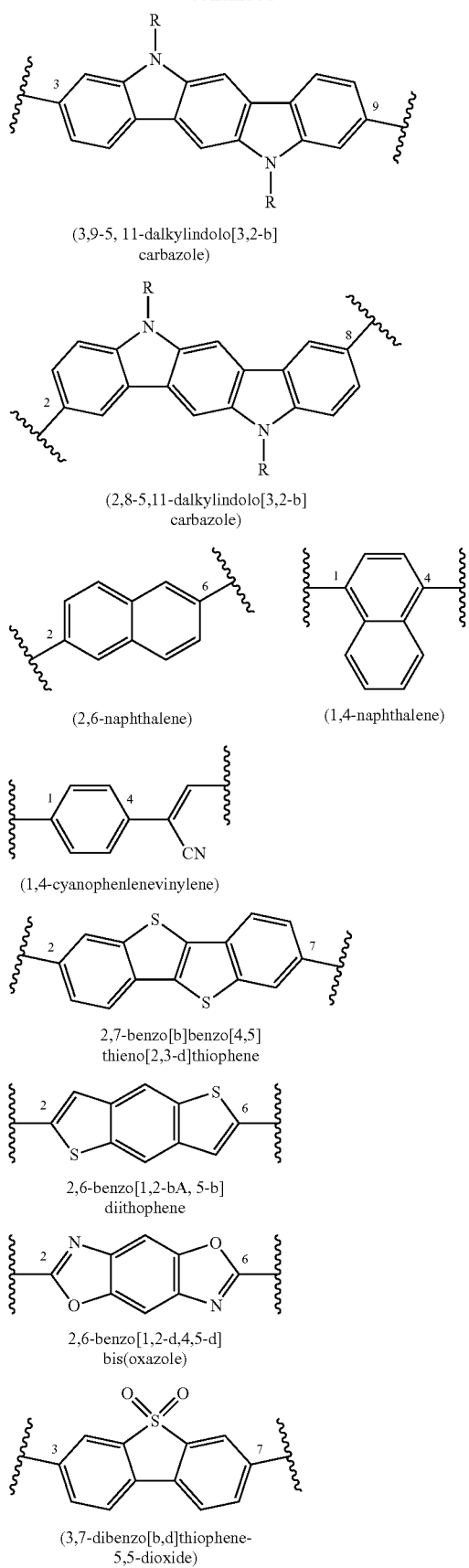
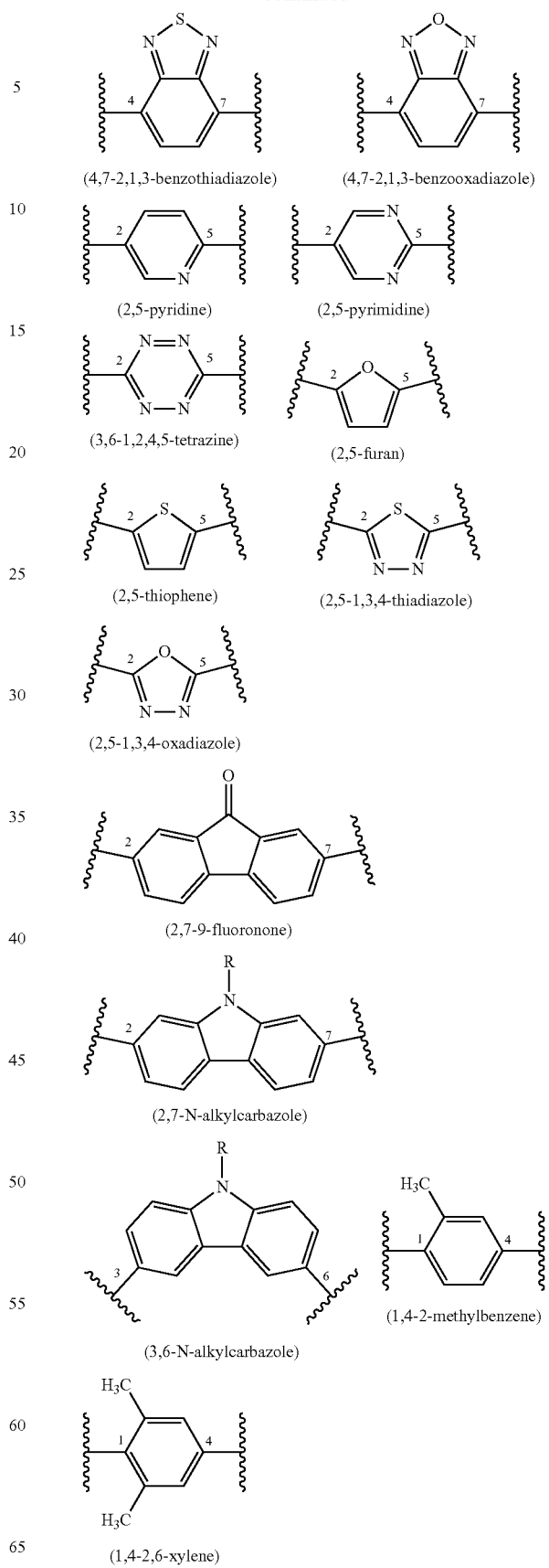

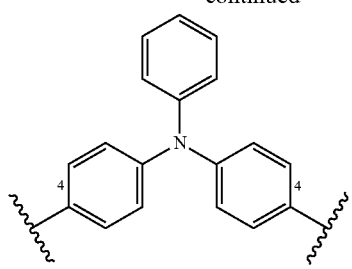
4,4-triphenylamine

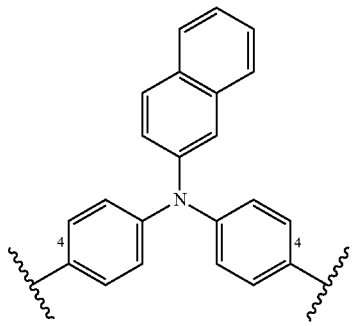
4,4-N,N-diphenyl naphthalen-2-amine

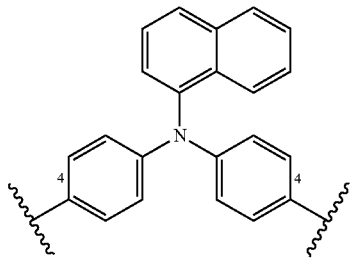
4,4-N,N-diphenyl naphthalen-1-amine

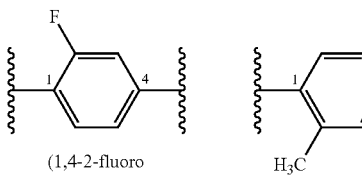
(1,4-2-fluoro benzene)    (1,4-2,5-xylene)

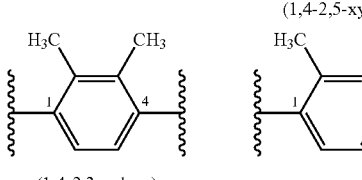
(1,4-2,3-xylene)    (1,4-2,3,5-trimethyl benzene)

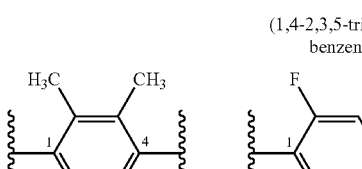
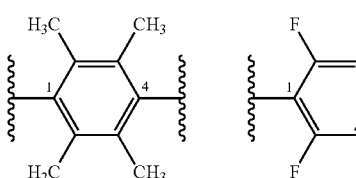
(1,4-2,3,5,6-durene)    (1,4-2,6-difluoro benzene)

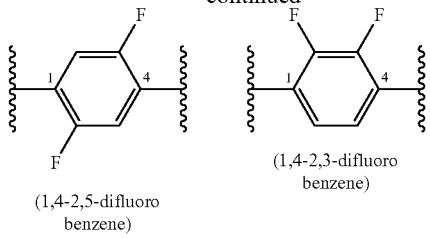
(1,4-2,5-difluoro benzene)    (1,4-2,3-difluoro benzene)

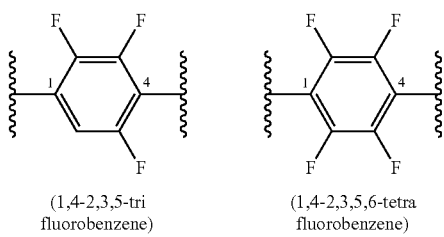
(1,4-2,3,5-tri fluorobenzene)    (1,4-2,3,5,6-tetra fluorobenzene)

In the above structures, the R groups are selected as described in relation to the E moiety.

The precise nature of the $Ar^a$ groups selected is dependent on the properties desired in the system. For example, if a light emitting compound is required two, three, four, five or six contiguous E groups may feature in the structure. Alternatively, a high proportion of $Ar^a$ groups, for example 50% or more, may be E groups.

The constituent aromatic and heteroaromatic group comprised by $Ar^a$ can be selected from the group of $C_6$-$C_{16}$ aromatic group and $C_4$-$C_{12}$ heteroaromatics that are optionally substituted. The optional substituents may be selected from the group of branched or unbranched $C_1$-$C_{10}$ alkyl, $C_4$-$C_{10}$ heteroaromatic groups or ether groups which are optionally branched.

Aromatic diradicals that are useful as $Ar^a$ structural units in the materials of the invention include, but are not limited to, 1,4-phenylene, naphthalene-1,4-diyl, naphthalene-2,6-diyl, thiophene-2,5-diyl, pyrimidine-2,5-diyl, pyridine-2,5-diyl, perylene-3,10-diyl, pyrene-2,7-diyl, 2,2'-dithiophene-5,5'-diyl, oxazole-2,5-diyl, 1,3,4-oxadiazole-2,5-diyl, thieno[3,2-b]thiophene-2,5-diyl, dithieno[3,2-b:2',3'-d]thiophene-2,6-diyl, dibenzothiophene-3,7-diyl, benzo[1,2-b:4,5-b']bis[1]benzothiophene-3,9-diyl, thiazolo[5,4-d]thiazole-2,5-diyl, oxazolo[5,4-d]oxazole-2,5-diyl, thiazolo[5,4-d]oxazole-2,5-diyl, thiazolo[4,5-d]thiazole-2,5-diyl, oxazolo[4,5-d]oxazole-2,5-diyl, thiazolo[4,5-d]oxazole-2,5-diyl, 2,1,3-benzothiadiazole-4,7-diyl, 4-thien-2-yl-2,1,3-benzothiazole-7,5'-diyl, 4,7-dithien-2-yl-2,1,3-benzothiazole-5',5''-diyl, imidazo[4,5-d]imidazole-2,5-diyl, 4-alkyl-1,2,4-triazole-3,5-diyl, 9-alkylcarbazole-2,7-diyl, 6,12-dialkylindolo[2,3-b]carbazole-2,8-diyl, benzo[1,2-b:4,5-b']dithiophene-2,6-diyl, benzo[1,2-b:5,4-b']dithiophene-2,6-diyl, [1]benzothieno[3,2-b][1]benzothiophene-2,7-diyl, benzo[1,2-d:4,5-d']bisoxazole-2,6-diyl, benzo[1,2-d:5,4-d']bisoxazole-2,6-diyl, or 5,5-dioxodibenzothiophene-3,7-diyl diradicals.

If hole transporting properties are desired then indole and thiophene containing moieties such as those presented below may be preferred, * denotes the typical site of attachment.

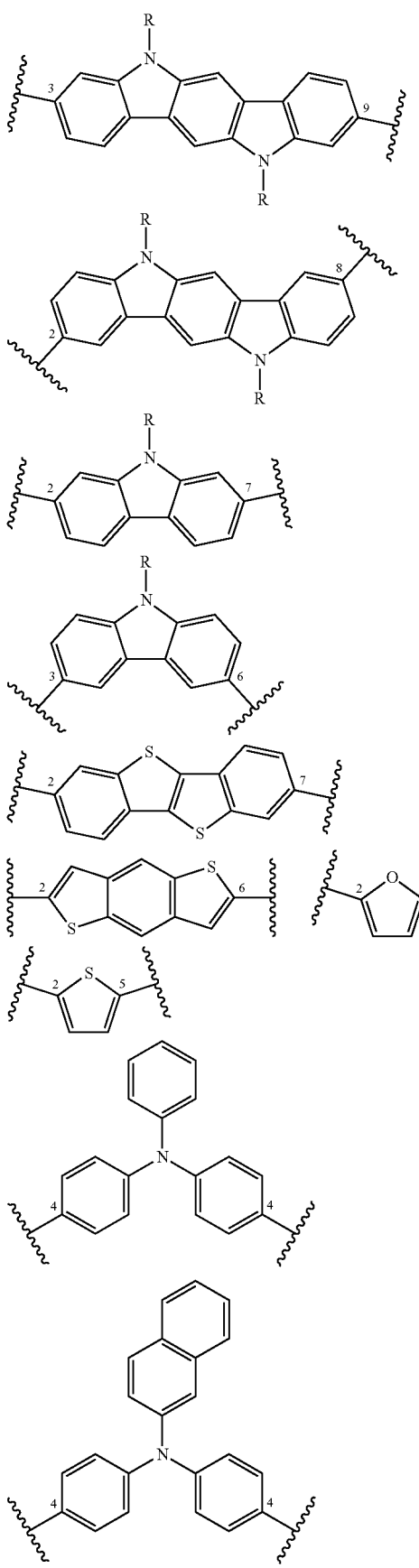

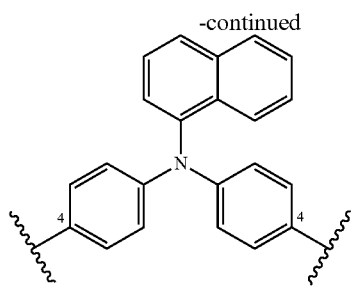

In the above structures, the R groups are selected as described in relation to the E moiety.

If electron transporting properties are desired then oxazole and oxadiazole containing moieties such as those presented below may be preferred, * denotes the typical site of attachment.

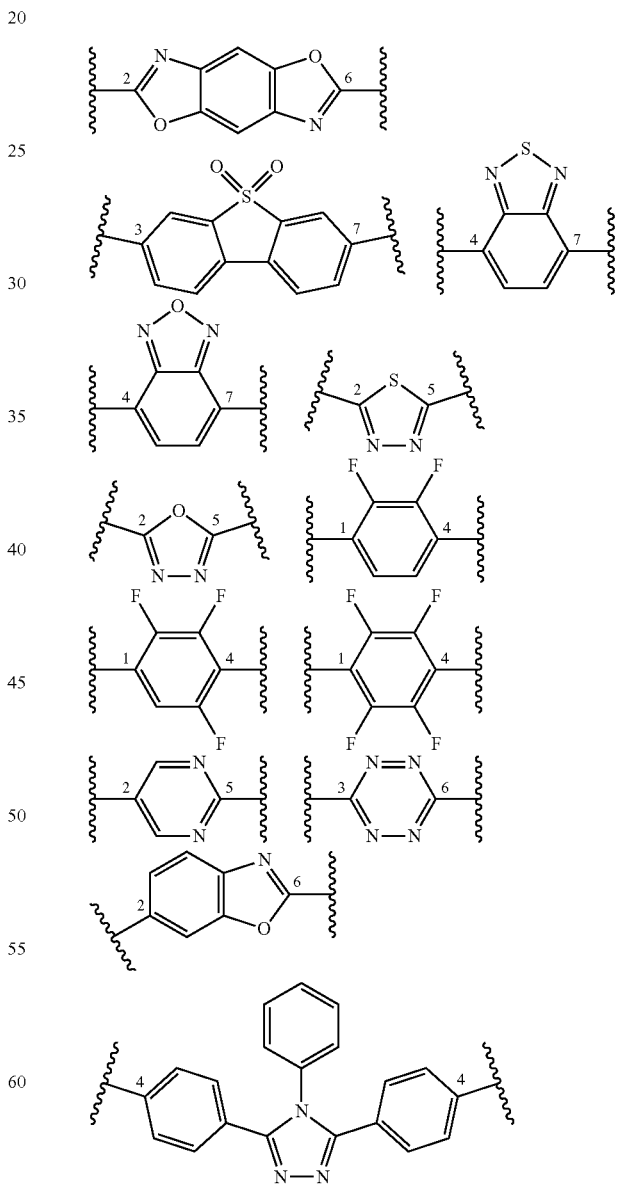

Such moieties provided as substituents which do not extend the chain length are not counted against the limit of 1 to 20 aromatic/heteroaromatic moieties. That is, moieties in the chain may be substituted with other aromatic or heteroaromatic rings. For example, due to the position of the attachment, each of the following structures would constitute a single moiety.

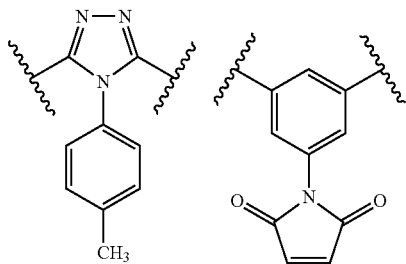 [SMILES: *c1nnc(*)n1-c1ccc(C)cc1 ; *c1cc(*)cc(N2C(=O)C=CC2=O)c1]

In a preferred aspect the compound is an emitter material and n is from 1 to 6. In a further preferred aspect n is 3 to 6. In a preferred aspect n is 5 or 6. In a preferred aspect n is 5. In a further preferred aspect n is 6. Longer molecules are preferred because device energy efficiency increases with increasing length of the aromatic core of the molecule. There is evidence from luminescence decay time measurements that the increase in energy efficiency is due to triplet-triplet exciton annihilation that occurs in the longer molecular cores, but is less likely to occur in shorter molecular cores. Further small increases in energy efficiency can be achieved by lengthening the molecular cores even further to n=7 or 8, but increases in efficiency have to be balanced with the increased cost of synthesising such molecules.

A further preferred aspect of the invention is that emitter materials of the invention comprise molecular core structures, A, which are terminated with E units. In charge transporting or host material molecules the termination of the molecular cores with Ar units such as multiple adjacent phenyl-1,4-diyl can be advantageous because the liquid crystalline properties of the materials can be enhanced and charge carrier transport can be enhanced by strong intermolecular interactions mediated by π-π interactions between the terminal Ar groups. However, in the case of emitter materials, these same interactions can lead to quenching of the exciton energy and terminal E groups with relative bulky substituents at the 9-positions are therefore preferred.

Flexible Linker Groups $S^1$, $S^{1a}$, $S^2$ and $S^{2a}$

When D represents a cross-linkable group the compounds of the invention contain two flexible linker groups $S^1$ and $S^2$. As discussed herein, D can also represent a more complex structure containing additional flexible linker groups $S^{1a}$ and $S^{2a}$ that are analogous to the $S^1$ and $S^2$ groups. In each occurrence $S^1$, $S^{1a}$, $S^2$ and $S^{2a}$ are independently selected from straight chain or branched $C_5$-$C_{14}$ alkyl groups, optionally wherein 1, 2, 3, 4 or 5 methylene groups are substituted for an oxygen atom, provided that S contains no peroxide, ketal or acetal groups, that is connected to A through either a bond or an ether, ester, carbonate, thioether, amine or amide linkage and that is connected through either a bond or an ether, ester, carbonate, thioether, amine or amide linkage to D, $B^1$, $B^2$, $B^3$ or $S^3$ as determined by the nature of D.

The flexible linker groups $S^1$, $S^{1a}$, $S^2$ and $S^{2a}$ serve to separate the fluorophore system within A from the cross-linkable groups. When the material is cross-linked into a network polymer matrix, the flexible linker mechanically and electronically isolates the fluorophore from the polymeric matrix. Thus when the material is cross-linked into a polymer matrix, the flexible linker serves to reduce non-emissive exciton quenching thereby favouring efficient light emission.

D, $B^1$, $B^2$ and $B^3$

D represents a cross-linkable group or, when $B^1$ represents a hydrogen, D represents —$B^2$—$S^3$—$B^3$—$S^{1a}$-A-$S^{2a}$—$B^{1a}$, —$S^3(B^2)$—$B^3$—$S^{1a}$-A-$S^{2a}$— $B^{1a}$, —$B^3(B^2)$ ($B^3$)—$S^{1a}$-A-$B^{2a}$—$B^{1a}$, —$S^3(B^2)(B^3)$, -A-$S^2$—$B^1$ or a cross-linkable group wherein the dash at the left-hand end of the chain represents the point of attachment to $S^1$. $B^1$, $B^2$ and $B^3$ each independently represent a cross-linking group or a hydrogen.

Where D represents -A-$S^2$—$B^1$ the A, $S^2$ and $B^1$ of D may be the same or different as the A, $S^2$, and $B^1$ of the rest of the D-$S^1$-A-$S^2$—$B^1$ structure. Preferably they are the same. That is, preferably the compound is essentially a dimeric type symmetrical structure where $S^1$ forms the connection between the halves of the molecule. One example of a dimeric type $B^1$—$S^2$A-$S^1$-A-$S^2$—$B^1$ structure is provided below.

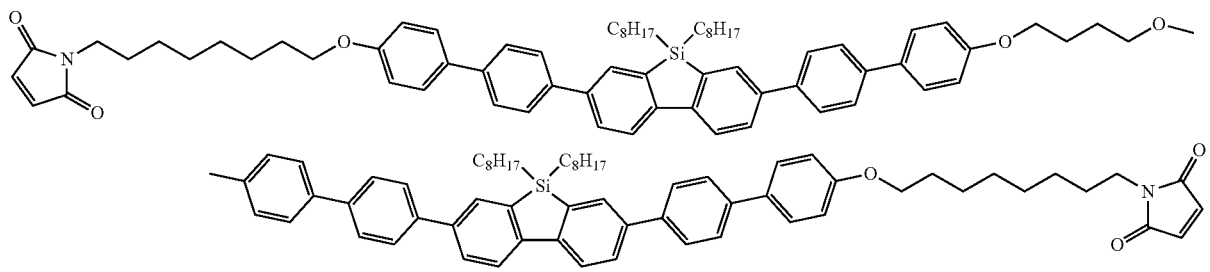

The inventors have found that these dimeric type structure are a synthetically simple approach to increasing molecular weight and thereby improving film forming properties of the OLED material due to the enhanced viscosity.

The compounds of the invention therefore comprise cross-linking groups and form, when cross-linked, network polymers. This is because preferred cross-linking groups react with two other cross-linking groups to yield a chain reaction and a polymer matrix.

In a preferred aspect, cross-linking groups are selected from the group of ethylenic, diene, thiol and oxetane cross-linkable groups. Ethylenic cross-linkable groups are cross-linkable groups containing a carbon-carbon double bond. Diene cross-linking groups may be considered as a subset of ethylenic cross-linking groups. In a preferred aspect, all of the cross-linking groups independently represent an ethylenic cross-linking group. Favoured ethylenic cross-linking groups include electron rich and electron poor ethylenic cross-linking groups.

In a preferred aspect the cross-linkable groups undergo cross-linking reaction on exposure to radiation. In a preferred aspect the cross-linkable groups undergo cross-linking reaction on exposure to ultra-violet (UV) light.

Examples of preferred cross-linking groups are straight chain and cyclic α,β-unsaturated esters, α,β-unsaturated amides, vinyl ethers and non-conjugated diene cross-linking groups. Favoured cross-linking groups therefore include methacrylate, ethacrylate, ethylmaleato, ethylfumarato, N-maleimido, vinyloxy, alkylvinyloxy, vinylmaleato, vinylfumarato, N-(2-vinyloxymaleimido) and 1,4-pentadien-3-yl.

In a preferred aspect the cross-linking groups are electron-rich ethylenic cross-linkable groups. Electron rich ethylenic cross-linkable groups contain an ethylene group substituted with one or more electron donating groups. The electron donating group can comprise a heteroatom such as O, N or S. In a preferred aspect the electron rich cross-linkable group is a vinyloxy group. Other electron donating group substituted cross-linking groups are p-alkoxystyrenes, N-vinylpyrrolidone, N-vinylformamides, N-vinylalkylamides and 1-alkenyl ethers such as propen-1-yloxy groups and buten-1-yloxy groups; cyclic vinyl ethers such as cyclohexen-1-yloxy and cyclopentene-1-yloxy; bicyclic vinyl ethers such as 2-norbornen-2-yloxy groups and groups in which the vinyl ether function is connected to the flexible linker or spacer ($S^1$, $S^{1a}$, $S^2$, $S^{2a}$ or $S^3$) through an intervening hydrocarbyl structure such as 4-vinyloxyphenyloxy and 2-vinyloxyethyl groups.

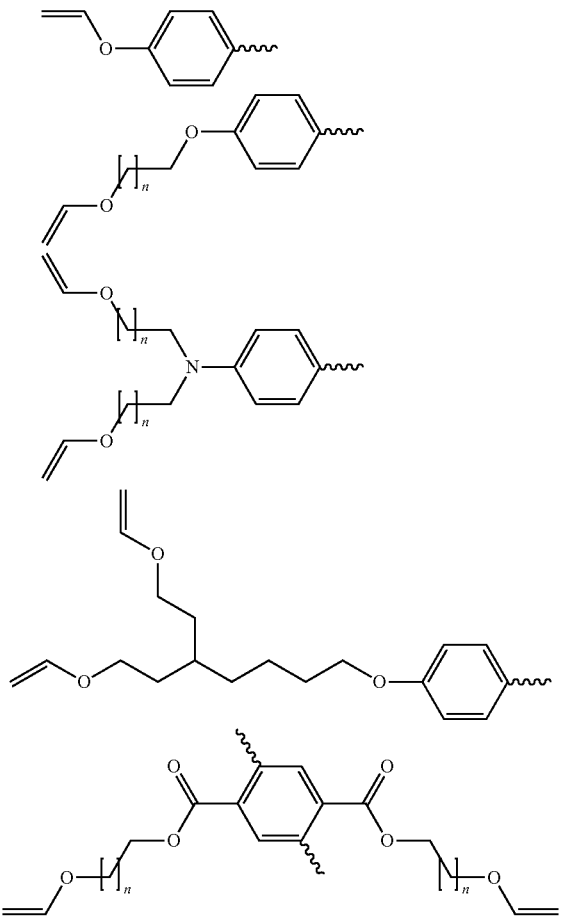

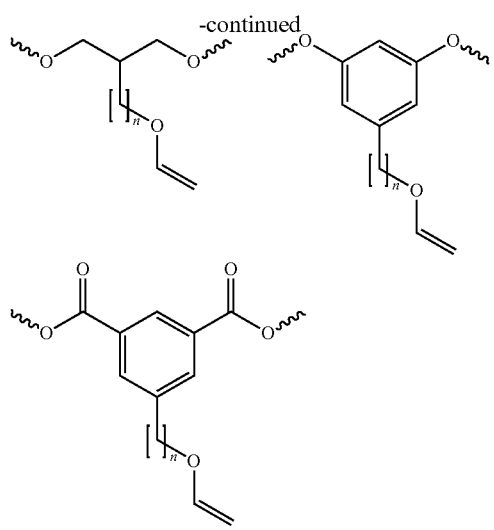

In the above structures, n in each occurrence is independently 1 to 20.

In a preferred aspect the cross-linking groups are electron-poor ethylenic cross-linkable groups. Electron deficient ethylenic cross-linkable groups contain an ethylene group substituted with one or more electron withdrawing groups. The electron withdrawing group may comprise a carbonyl group and may for example be an ester or an amide. In a preferred aspect the electron deficient cross-linkable group comprises a monoalkylmaleate group, a monoalkylfumarate group, a monoarylmaleate group, a monoarylfumarate group or a maleimide group. Other examples of electron deficient cross-linking groups are 4,4,4-trifluorocrotonate groups, Z-4,4,4-trifluorobutenoate groups, 3-trifluoromethyl-4,4,4-trifluorocrotonate groups, Z- and E-3-cyanoacrylates, Z- and E-3-cyanomethacrylates, monoalkyl cyclohexene-1,2-dicarboxylates, and monoalkyl cyclopentene-1,2-dicarboxylates.

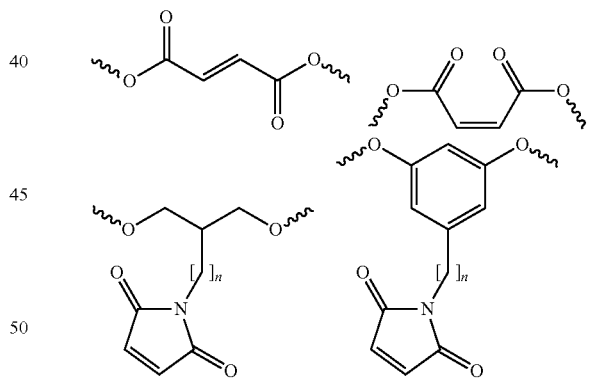

In the above structures n in each occurrence is independently 1 to 20.

As stated above, D represents a cross-linkable group or, when $B^1$ represents a hydrogen, D can represent —$B^2$—$S^3$—$B^3$—$S^{1a}$-A-$S^{2a}$—$B^{1a}$, —$S^3(B^2)$—$B^3$—$S^{1a}$-A-$S^{2a}$—$B^{1a}$, —$S^3(B^2)(B^3)$—$S^{1a}$-A-$S^{2a}$—$B^{1a}$, or —$S^3(B^2)(B^3)$ or a cross-linking group wherein the dash at the left-hand end of the chain represents the point of attachment to $S^1$.

Thus, in one aspect D is of the structure —$B^2$—$S^3$—$B^3$—$S^{1a}$-A-$S^{2a}$—$B^{1a}$ and all elements of D are connected in a linear chain. An example of this arrangement, wherein for the purposes of illustration the cross-linkable groups $B^2$ and $B^3$ are fumarate groups and $B^1$ and $B^{1a}$ represent hydrogen, the overall structure is the "type 1" $S^3$ spacer presented below.

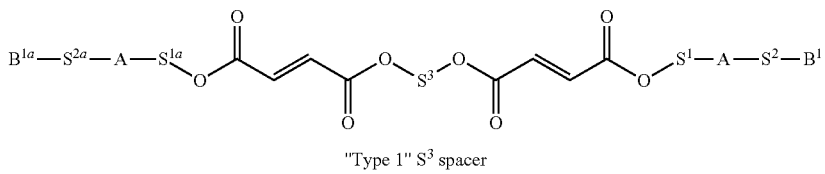

"Type 1" S³ spacer

In a second aspect, D is of the structure —S³(B²)—B³—S¹-A-S²ᵃ—B¹ᵃ and one cross-linkable group, B², forms a side chain branching from and attached to S³. An example of this arrangement, wherein for the purposes of illustration the cross-linkable groups B² and B³ are fumarate groups, B² being terminated by a methyl group, and B¹ and B¹ᵃ represent hydrogen, the overall structure is the "type 2" S³ spacer presented below.

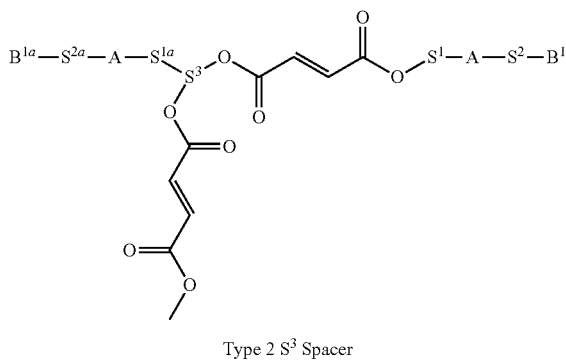

Type 2 S³ Spacer

In a third aspect, D is of the structure S³(B²)(B³)—S¹-A-S²ᵃ—B¹ᵃ both S¹ groups within the structure are bridged by the linker S³ to which two cross-linkable groups are attached and projects from. An example of this arrangement, wherein for the purposes of illustration the cross-linkable groups B² and B³ are monomethyl fumarate groups and B¹ᵃ and B¹ represent hydrogens, the overall structure is the "type 3" S³ spacer presented below:

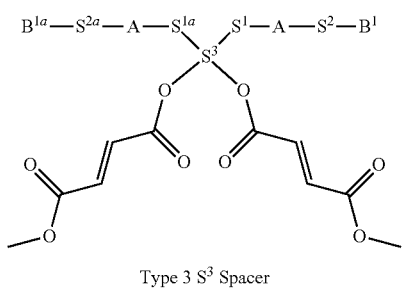

Type 3 S³ Spacer

In a fourth aspect, D is of the structure —S³(B²)(B³). In this structure the spacer group S³ is decorated with two cross-linking groups. An example of this arrangement, wherein for the purposes of illustration the cross-linkable groups B² and B³ are monomethyl fumarate groups and B¹ represents a hydrogen, the overall structure is the "type 4" S³ spacer presented below.

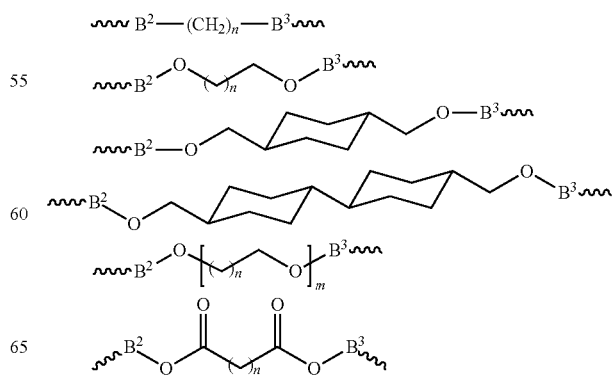

Type 4 S³ Spacer

S³

D represents a cross-linkable group or, when B¹ represents a hydrogen, D can represent —B²—S³—B³—S¹ᵃ-A-S²ᵃ—B¹ᵃ, —S³ (B²)—B³—S¹ᵃ-A-S²ᵃ—B¹ᵃ, —S³(B²)(B³)—S¹ᵃ-A-S²ᵃ—B¹ᵃ, or —S³(B²)(B³) or a cross-linking group wherein the dash at the left-hand end of the chain represents the point of attachment to S¹ and where B¹ᵃ represents a hydrogen. In this structure a further spacer S³ is present.

S³ represents a non-chromophoric spacer group that may be rigid or flexible. S³ may comprise a $C_1$-$C_{20}$ alkyl group, $C_1$-$C_{20}$ haloalkyl group, a $C_3$-$C_8$ cycloalkyl group, a $C_6$-$C_{16}$ aryl group or a $C_4$-$C_{15}$ heteroaryl group or a chain consisting of 1, 2, 3, 4 or 5 $C_1$-$C_{20}$ alkyl, $C_1$-$C_{20}$ haloalkyl, $C_3$-$C_8$ cycloalkyl, $C_6$-$C_{16}$ aryl and/or $C_4$-$C_{15}$ heteroaryl moieties each independently connected by a bond, an ether linkage or an ester linkage. S³ is connected to B² and/or B³ through a bond, an ether, an ester or a carbonate linkage.

Preferred examples of the spacer S³ comprise a $C_2$-$C_{12}$ alkyl group, a $C_3$-$C_8$ cycloalkyl group or a $C_6$-$C_{16}$ aryl group or a chain consisting of 1, 2, 3, 4 or 5 $C_1$-$C_{20}$ alkyl, $C_1$-$C_{20}$ haloalkyl, $C_3$-$C_8$ cycloalkyl, $C_6$-$C_{16}$ aryl and/or $C_4$-$C_{15}$ heteroaryl moieties each independently connected by a bond, an ether linkage or an ester linkage.

Examples of Type 1 S³ spacer groups with B² and B³ cross-linking groups presented for clarity are presented below (the wavy line indicates the point of attachment to S¹ and S¹ᵃ):

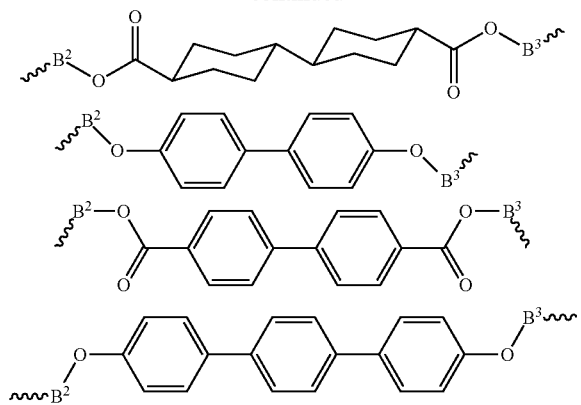

In the above structures, n in each occurrence is independently 1 to 20 and m is from 1 to 5.

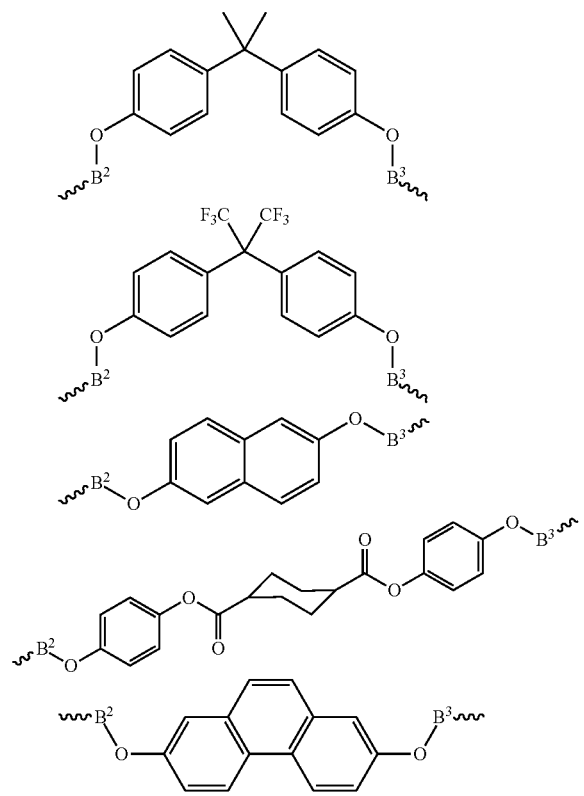

Examples of Type 2 S³ spacer groups with B² and B³ cross-linking groups presented for clarity are (the wavy line indicates the point of attachment to other chain components):

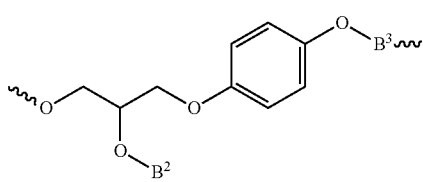

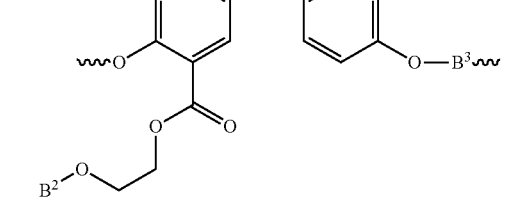

Examples of Type 3 S³ spacer groups with B² and B³ cross-linking groups presented for clarity are (the wavy line indicates the point of attachment to other chain components):

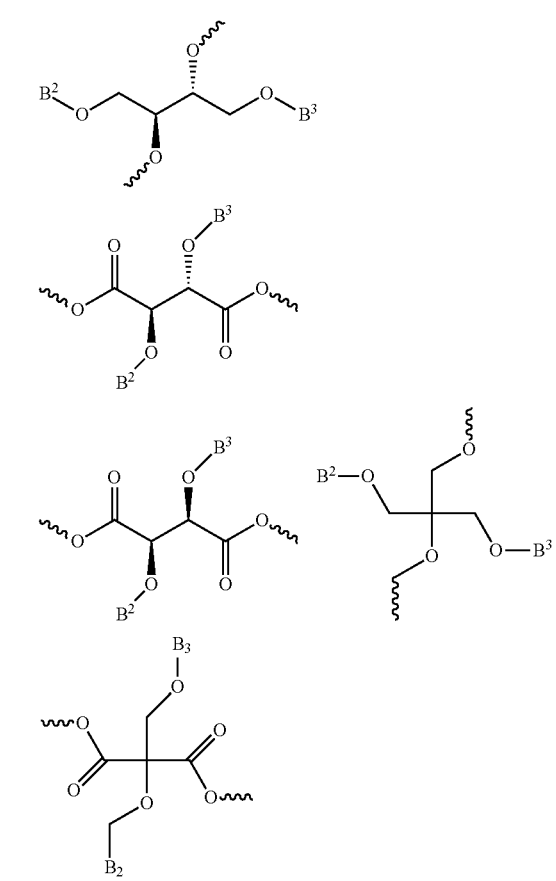

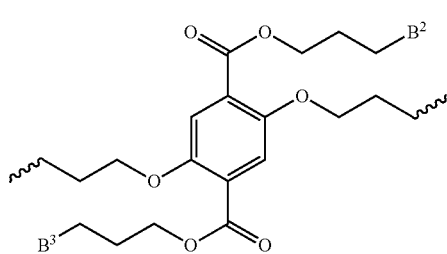

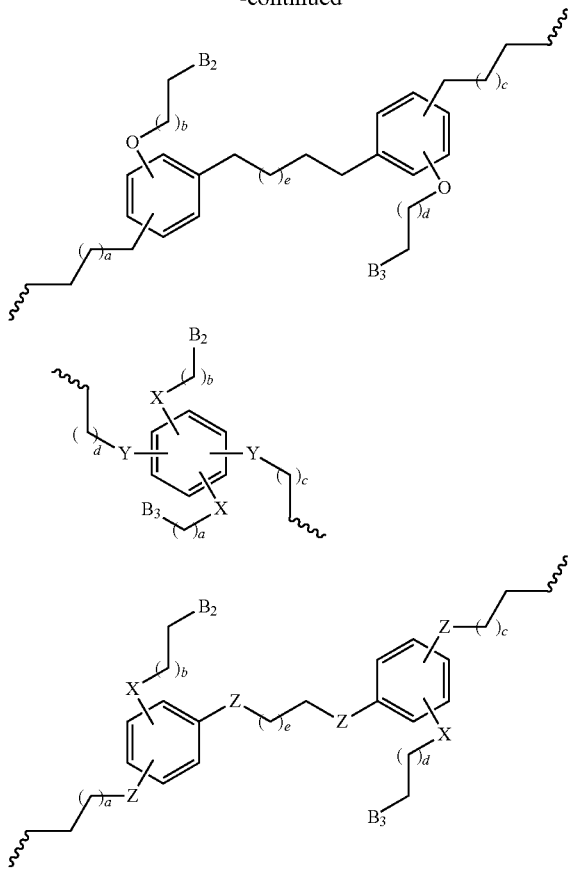

X, Y and Z are independently selected from bond, ether (O) or ester linkage (—$CO_2$)

a, b, c, d and e are integers that provide for a $C_1$ to $C_{20}$ linkage (alkyl, haloalkyl)

Type 3 $S^3$ spacer groups are of particular interest, as are the chemical intermediates for incorporating these groups into the overall $B^1$—$S^2$-A-$S^1$—$S^3(B^2)(B^3)$—$S^{1a}$-A-$S^{2a}$—$B^{1a}$ structure. Preferred examples of Type 3 $S^3$ spacer groups comprise a $C_2$-$C_{12}$ alkyl group, a $C_3$-$C_8$ cycloalkyl group or a $C_6$-$C_{16}$ aryl group or a chain consisting of 1, 2, 3, 4 or 5 $C_1$-$C_{20}$ alkyl, $C_1$-$C_{20}$ haloalkyl, $C_3$-$C_8$ cycloalkyl, $C_6$-$C_{16}$ aryl and/or $C_4$-$C_{15}$ heteroaryl moieties each independently connected by a bond, an ether linkage or an ester linkage. In a preferred example the Type 3 $S^3$ spacer group comprises a $C_2$-$C_{12}$ alkyl group, or a $C_6$-$C_{16}$ aryl group or a chain consisting of 1, 2, 3, 4 or 5 $C_2$-$C_{12}$ alkyl groups and/or $C_6$-$C_{16}$ aryl groups each independently connected by a bond, an ether linkage or an ester linkage. In a preferred example the Type 3 $S^3$ spacer group comprises 3, 4 or 5 $C_2$-$C_{12}$ alkyl groups and/or $C_6$-$C_{16}$ aryl groups each independently connected by a bond, an ether linkage or an ester linkage.

In a preferred example, the Type 3 $S^3$ spacer group comprises 5 groups selected from $C_2$-$C_{12}$ alkyl and $C_6$-$C_{16}$ aryl groups that are each independently connected by a bond, an ether linkage or an ester linkage. In Type 3 $S^3$ spacer groups it is preferred that the cross-linking groups $B^2$ and $B^3$ are connected to $C_3$-$C_{12}$ alkyl groups, optionally $C_4$-$C_{10}$ alkyl groups, because this configuration provides greater structural flexibility and facilitates eventual cross-linking reaction of $B^2$ and $B^3$ with the cross-linking groups present in adjacent molecules. This affords the potential for cross-linking under mild conditions and minimises and possible degradation.

In a preferred example, the Type 3 $S^3$ spacer group comprises four $C_2$-$C_{12}$ alkyl groups connected to a central $C_6$-$C_{16}$ aryl group by either a bond, an ether linkage or an ester linkage. In such Type 3 $S^3$ spacer groups the other end of each independent $C_2$-$C_{12}$ alkyl groups terminates in a connection to $B^2$, $B^3$, $S^1$ and $S^{1a}$, respectively. Examples of Type 3 $S^3$ spacer groups of this preferred variety are presented below wherein the wavy line indicates the point of attachment to other chain components, $S^1$ and $S^{1a}$, the groups X, Y and Z independently represent a bond, an ether linkage or an ester linkage, a and d is in each case an integer from 2 to 12 and a and c is in each case an integer from 1 to 11.

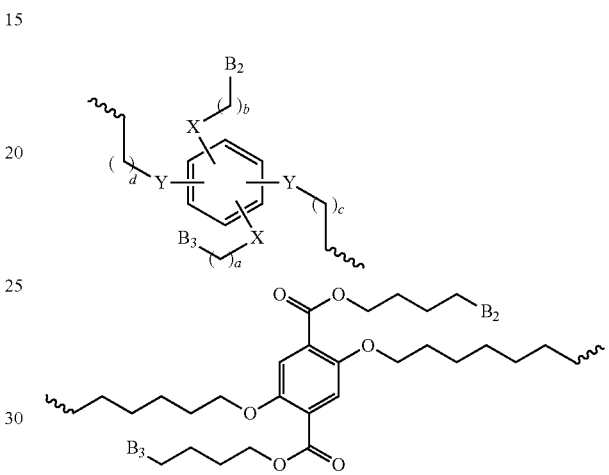

X, Y and Z are independently selected from bond, ether (O) or ester linkage (—$CO_2$)

a, b, c, d and e are integers that provide for a $C_1$ to $C_{20}$ linkage (alkyl, haloalkyl)

In a further preferred example, the Type 3 $S^3$ spacer group comprises three $C_2$-$C_{12}$ alkyl groups and two $C_6$-$C_{16}$ aryl groups connected to each other by either a bond, an ether linkage or an ester linkage. In such structures the each $C_6$-$C_{16}$ aryl groups is connected i) to the second $C_6$-$C_{16}$ aryl group by a $C_2$-$C_{12}$ alkyl group, ii) to a cross-linker $B^2$ or $B^3$ by a $C_2$-$C_{12}$ alkyl group and iii) directly to $S^1$ and $S^{1a}$. Examples of Type 3 $S^3$ spacer groups of this preferred variety are presented below wherein the wavy line indicates the point of attachment to other chain components, $S^1$ and $S^{1a}$, the groups X, Y and Z independently represent a bond, an ether linkage or an ester linkage, b and d is an integer from 1 to 11 and a and c is an integer from 0 to 10.

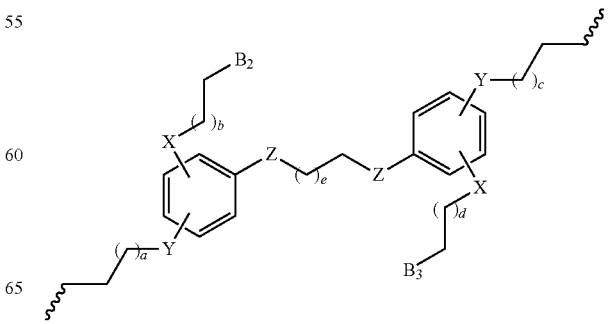

-continued
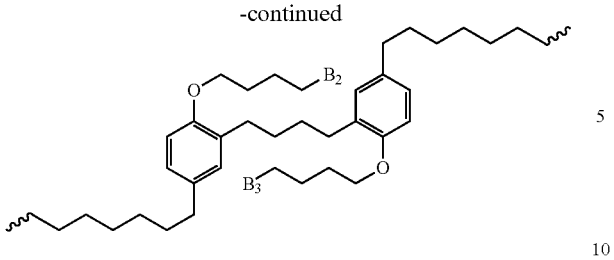
X, Y and Z are independently selected from bond, ether (O) or ester linkage (—$CO_2$)
a, b, c, d and e are integers that provide for a $C_1$ to $C_{20}$ linkage (alkyl, haloalkyl)
Examples of structures incorporating preferred Type 3 $S^3$ spacer group are presented below.

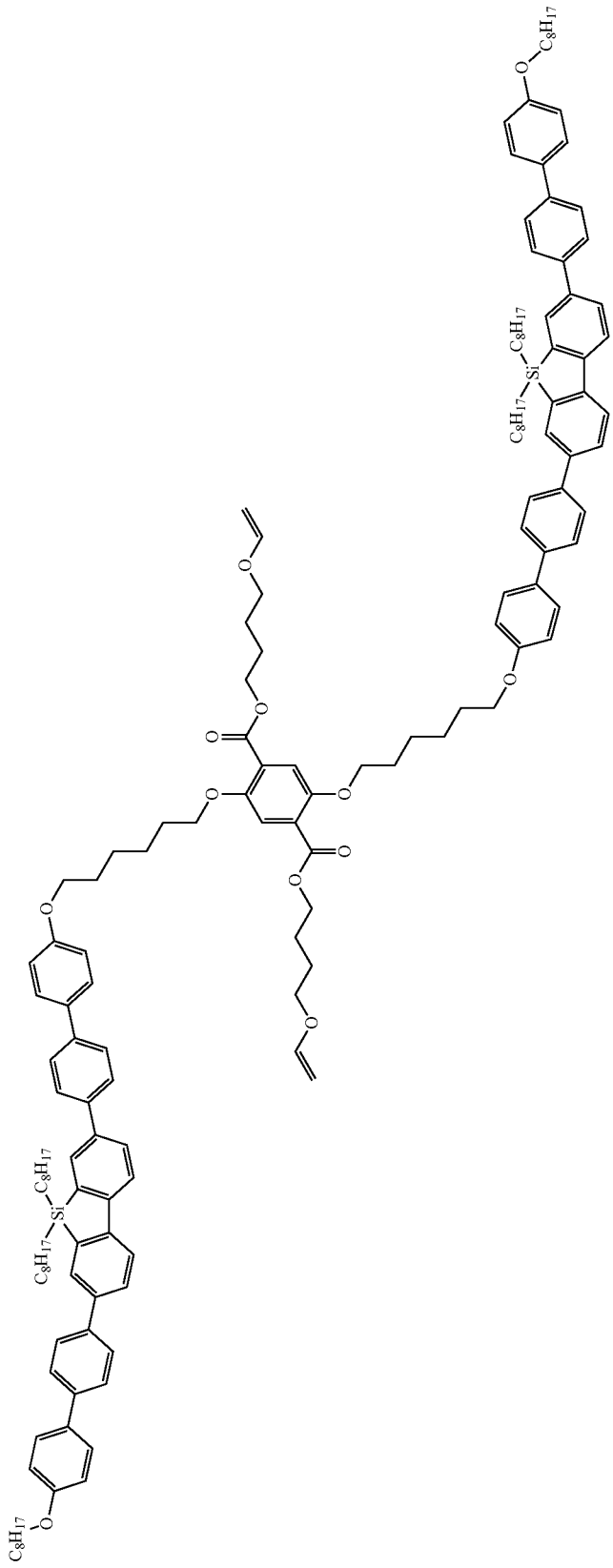

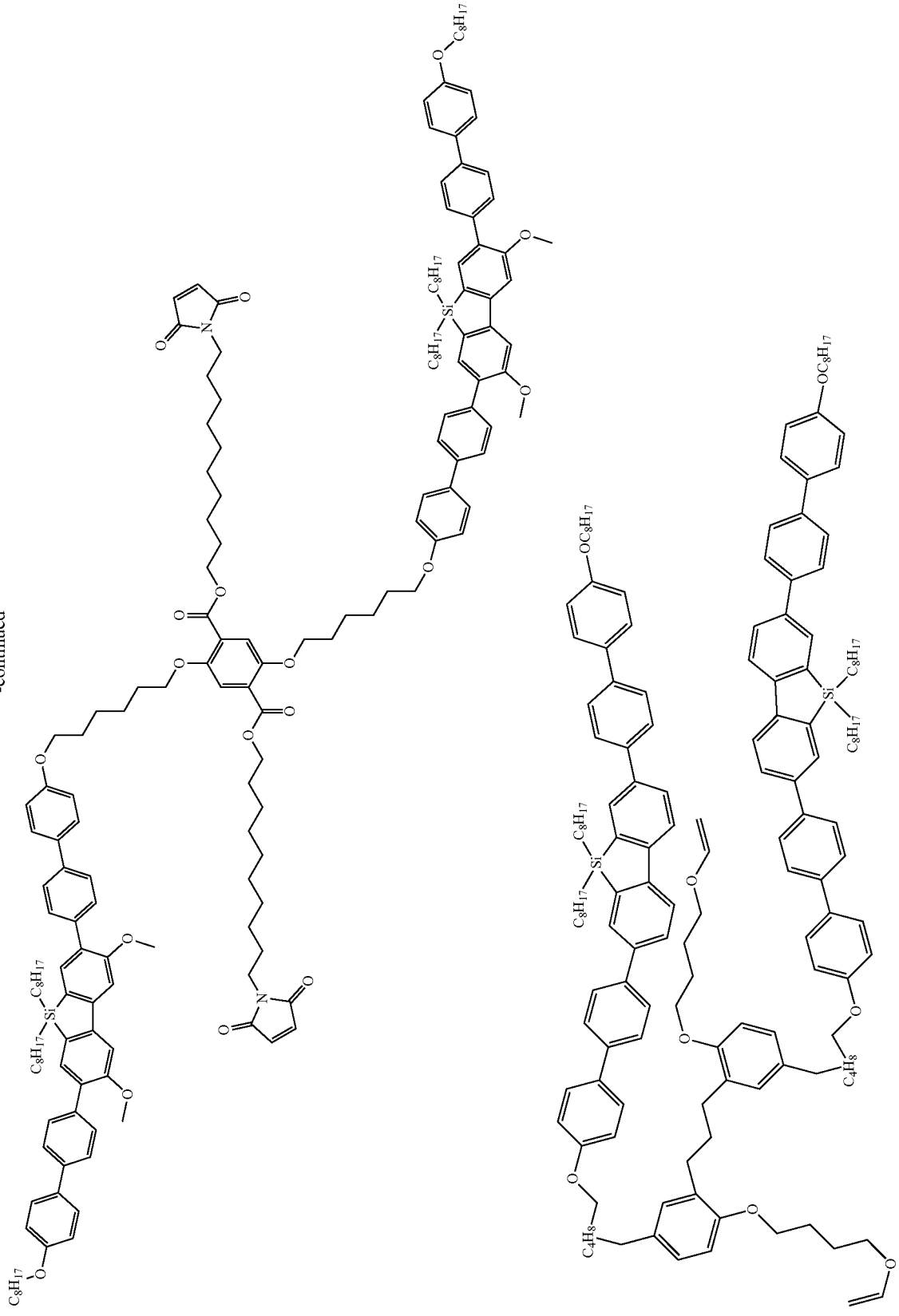

Examples of Type 4 $S^3$ spacer groups with $B^2$ and $B^3$ cross-linking groups presented for clarity are (the wavy line indicates the point of attachment to $S^1$):

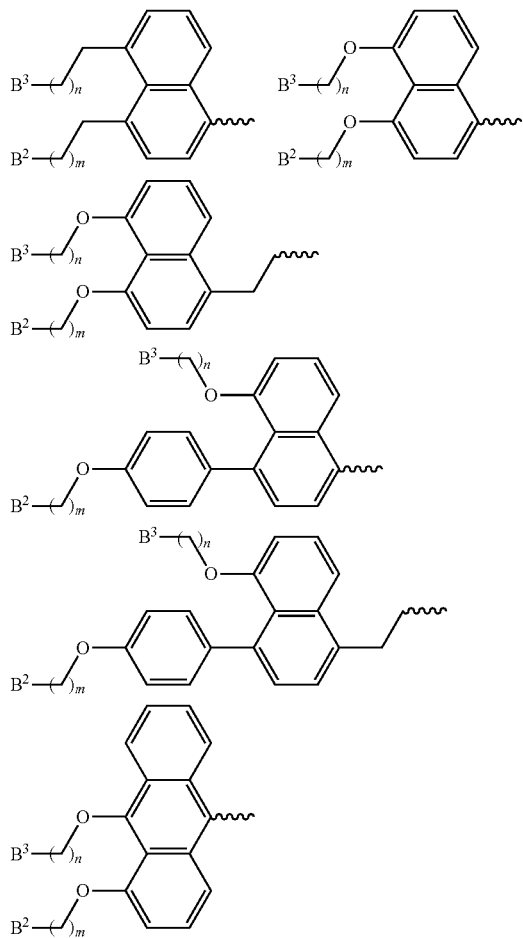

In the above structures, n and m in each occurrence is independently 1 to 20.

The group D in some instances can therefore be appreciated to be of the general structural types presented below.

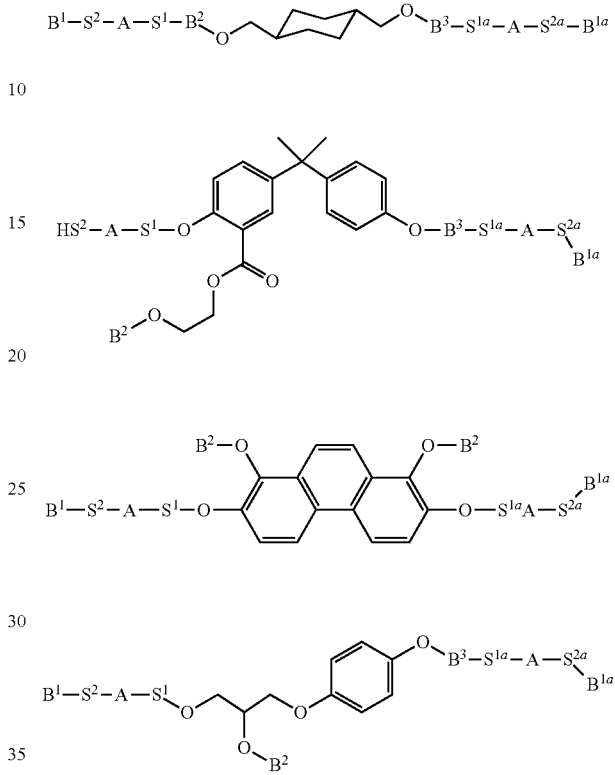

wherein $B^1$ and $B^{1a}$ represent hydrogens.

Further examples of structures D of the materials of the invention are provided below for illustration. Branching in the R group can be used to modulate the melting point of the material.

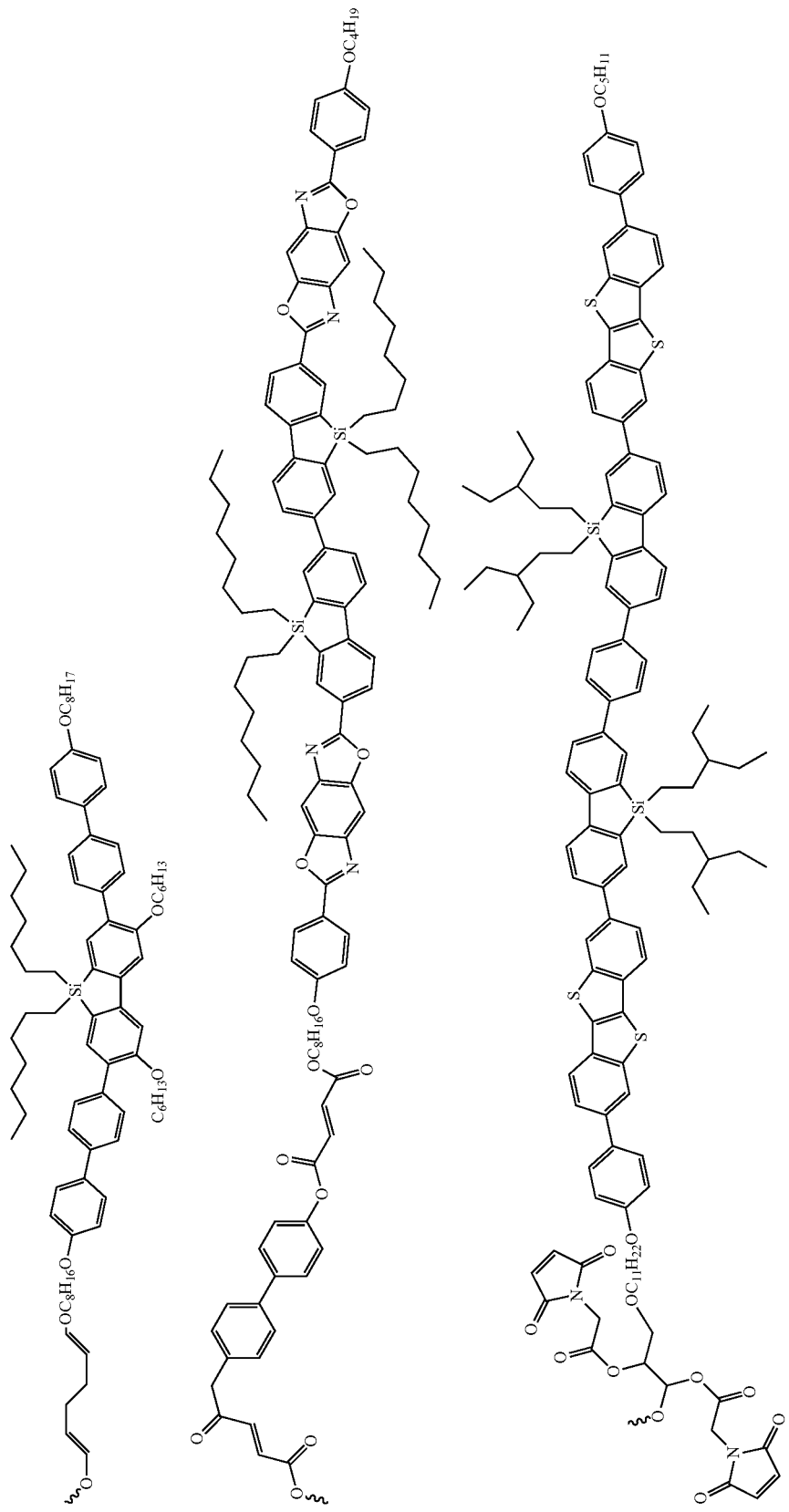

-continued
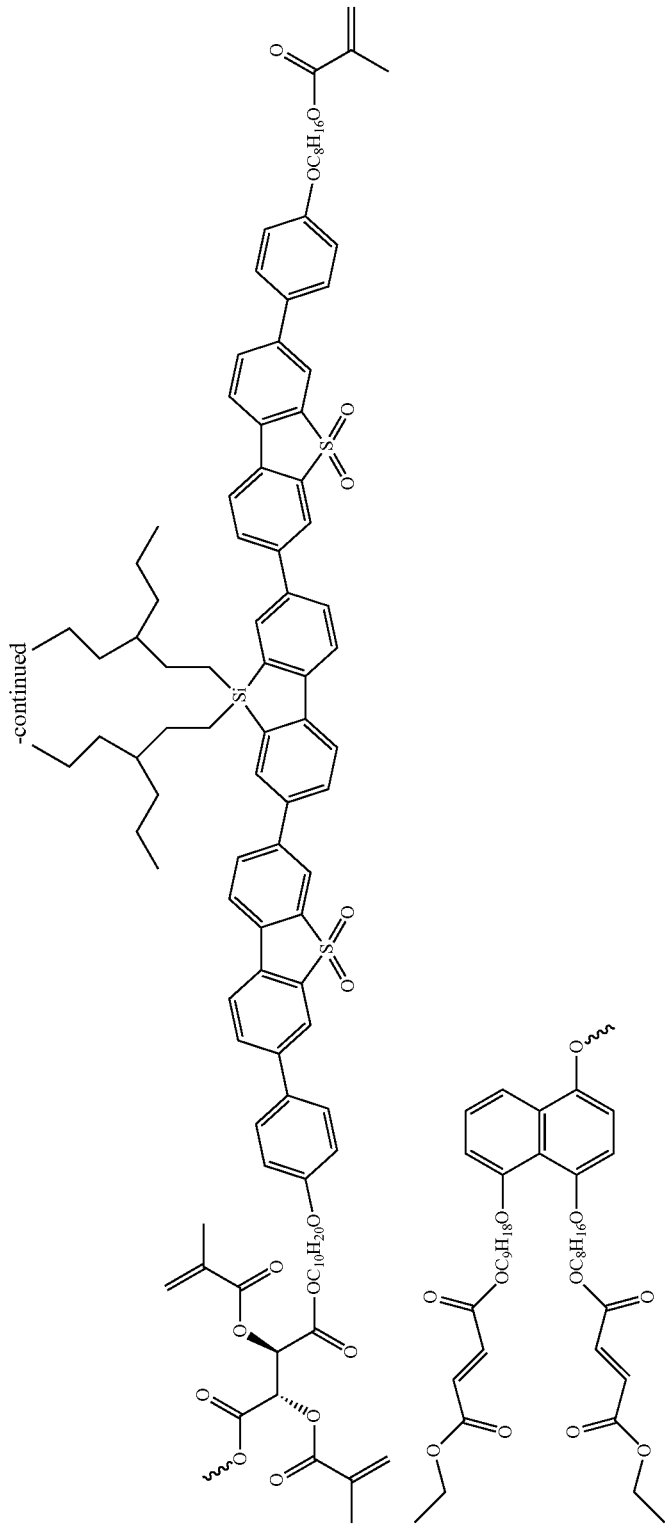

Material Properties

The materials of the present invention are particularly useful for both their charge transport and light emitting properties. As such the materials described herein are useful in the fabrication of electronic devices, for example organic light emitting diodes and photovoltaic devices.

One advantageous property of the oligomeric materials of the present invention is that they are soluble in common organic solvents. This is significant as the solubility properties of the oligomers provide a distinct advantage in terms of device fabrication relative to e.g. polymeric materials. In more detail, these oligomeric materials may be used to fabricate devices via a solution processing approach. In outline, this involves first dissolving the material, applying this solution to a substrate and then evaporating to generate a film coating on the substrate. Once the material is deposited as a film the material can be polymerised in situ. This polymerisation may be initiated by exposure to radiation, for instance ultraviolet light, which causes the cross-linking groups of one molecule to cross-link with those in an adjacent molecule to form a network polymer. Regions of the deposited film can be masked from the initiating radiation to give zones of non-cross-linked material while zones exposed to radiation undergo polymerisation. If desired the unexposed, non-cross-linked material can be washed off to leave behind a patterned structure of cross-linked material due to the cross-linked material having negligible or reduced solubility relative to that of the monomer. Iterative cycles of solution deposition and polymerisation can be used to generate structures with complex architectures.

Sequentially deposited polymerised structures can be assembled in a side by side or stacked/layered manner. In one example, sequential deposition and polymerisation of red, green and blue emitting material in a side by side manner can be used to generate pixels for colour displays. In another example, a stack of red, green and blue emitter materials can be used to give a white light source. In another example, two or more emitter structures can be arranged in a stack to give a coloured light source.

The ability to cheaply and economically produce multi-layer devices in which adjoining layers have different highest occupied or lowest unoccupied molecular orbital (HOMO and LUMO) energy levels as well as different charge carrier mobilities is of general utility in plastic electronics. For instance, the equivalent of p-n junctions may be formed using the materials and processes of this invention and these may find utility in diodes, transistors, and photovoltaic devices. The propensity of the materials of the invention to be photo lithographically patterned allows large arrays of plastic electronic devices of virtually any size and description to be fabricated.

Materials according to this invention may be mixed together to form liquid crystalline mixtures. This can be very advantageous from the standpoint of optimising the material properties for the intended application. For instance, individual compounds of the invention may have liquid crystal to isotropic liquid transition temperature far below their melting points (monotropic liquid crystalline phases). In device fabrication applications this can lead to glassy or supercooled liquid films of the materials that are sufficiently thermodynamically unstable so as to lead to the danger of crystallisation within the film and subsequent destruction of useful electronic properties. Mixing multiple component compounds together can depress the melting point of the resulting mixtures below the liquid crystal to isotropic liquid transition temperatures or at least sufficiently suppress crystallisation so as to eliminate this problem.

Another advantage associated with using mixtures of the materials of the invention is that it may allow materials with otherwise highly useful device application properties to be used even though they a have a particular property that renders them unusable as a pure material. For instance, it may be desired to prepare a light emitting liquid crystalline film having low temperature liquid crystalline transition temperatures. A compound of the invention may be a light emitting material of very high efficiency and possess other useful properties, but at the same time may be found to possess high temperature liquid crystalline phases. By dissolving said desirable compound into a eutectic mixture of other compounds of the invention that have lower temperature liquid crystalline phases, a mixture having the required thermal properties may result.

A further advantage associated with using liquid crystalline materials or mixtures of material is that directional organised or anisotropic structures can be formed. This directional order can be fixed in place by cross-linking the components of the deposited films, for example by exposing the deposited film to radiation such as ultraviolet light.

In one preferred instance, a liquid crystalline film can be deposited onto a substrate that is coated with an alignment layer such as a photoalignment layer. The components of a photoalignment layer form directionally ordered structures on exposure to light. This directional order in the alignment layer can then transfer into the deposited liquid crystalline film formed on its surface leading to a highly ordered device structure which can be locked in place by polymerising the component oligomer by exposing the deposited ordered film to radiation such as ultraviolet light.

The potential to obtain highly ordered device structures can be exploited to generate polarised light emitting structures in which the emitter cores are aligned in the same direction and therefore emit light in the same direction. Ultimately, the properties of the materials described herein afford the possibility to fabricate 3D-displays through sequential deposition of aligned layers of uniformly aligned liquid crystalline fluid or glass, sequential polymerisation of patterned areas of each layer in turn, and sequentially washing away unpolymerised areas of each layer in turn so as to provide light emitting structures such that the liquid crystalline alignment and thus the polarisation axis of light emission of each respective layer is in a different direction.

The materials of the present invention also possess a number of additional desirable properties that render them useful for the production of electronic devices such as OLEDs. In organic light emitting devices it is often also desirable to reduce the self-absorption of emitted light by organic luminescent materials. This self-absorption occurs because the spectral absorbance and emission bands of organic luminescent materials overlap to a greater or lesser extent in various materials. A solution to this problem is well known, for instance, in the field of dye lasers one can dissolve the luminescent material in a host that absorbs light at a shorter wavelength than the luminescent solute. If the solution is dilute, for instance one to two percent, the self-absorption of the luminescent solute is nearly completely suppressed. The facile mutual miscibility of the various compounds of this invention makes the preparation of solutions of this type very easy. The materials of the present invention therefore are useful as host materials as well as light emitting materials.

In organic light emitting device applications it is necessary that there be facile excitation energy transfer from the host material to the solute luminescent material. This is because charge carriers (electrons and holes) must be transported through the host medium to recombine to form the excitons (electrically excited molecular orbital states) that radiate light. In a mixture composed mainly of component host molecules this recombination and exciton formation will mainly occur in the host molecules. The excitation energy then needs to be transferred from the host molecules into the luminescent solute molecules. It is a requirement for this energy transfer that the spectral luminescent emission band(s) of the host material overlap the absorption band of the luminescent solute. Thus an important aspect of the invention is the preparation of mixtures of the compounds of the invention that have this spectral relationship between the constituent components. For instance, a compound which emits in the blue region of the spectrum can serve as a host for a compound which is a green light emitter. A polymer film prepared by the UV induced cross-linking of a solution of 5% green emitter compound in blue emitter compound will exhibit considerably less self-absorption of the green light emitted by the green emitter than will a film prepared by UV cross-linking of pure green emitter.

Yet another advantage of using mixtures of the materials of the invention is that it allows the use of mixtures of reactive mesogen materials in which photoinitiated electron donor/acceptor interactions as opposed to ionic or free radical initiation are used to initiate polymerization. This may result in much more stable (in terms of shelf-life) reactive mesogen materials than in methacrylate-based systems, while at the same time maintaining low UV cross-linking fluences. In these mixtures at least one of the reactive mesogen materials is substituted with electron-rich cross-linking groups while at least one other component reactive mesogen material is substituted with electron-deficient cross-linking groups. Ultraviolet radiation incident on the material promotes the electron deficient cross-linking groups on some reactive mesogen molecules into electronically excited states. The excited state, electron-deficient cross-linking groups then abstract electrons from the electron-rich (electron donor) cross-linking groups on other reactive mesogen molecules initiating the copolymerization cross-linking reaction. Descriptions of this mode of photo-polymerization may be found in, for example, "Photoinitiated radical polymerization of vinyl ether-maleate systems", Polymer 38, (9) pp. 2229-37 (1997); and "Co-Polymerization of Maleimides and Vinyl Ethers: A Structural Study", Macromolecules 1998, (31) pp. 5681-89.

Electron-deficient cross-linking groups include maleimides, maleates, fumarates, and other unsaturated esters. Electron donor groups include vinyl ethers, propenyl ethers and other similar alkenyl ethers. Mixtures like these are advantageous in that the individual components are thermally and photochemically stable with excellent shelf lives. However, when the materials are combined, the mixture has high photochemical sensitivity and requires only a relatively small UV dose for cross-linking.

FIGURES

The invention will now be described in relation to the following non-limiting figures. Further advantages of the disclosure are apparent by reference to the detailed description when considered in conjunction with the figures, in which:

FIG. 1 shows UV/Vis absorption spectra (blue) and PL spectra (orange) in solution, at a concentration of $1\times10^{-5}$ M for UV/Vis absorption and $1\times10^{-6}$ M for PL in toluene, for the non-cross-linkable compounds. All PL spectra were recorded at excitation=350 nm, except for compounds K8-8 and L8-8 that were excited at 440 nm and 300 nm, respectively. The x-axis is wavelength in nm, and the y-axis is absorbance on a normalised scale of 0-1.

FIG. 2 shows UV/Vis absorption spectra (blue) and PL spectra (orange) in solution, at a concentration of $1\times10^{-5}$ M for UV/Vis absorption and $1\times10^{-6}$ M for PL in toluene, for the cross-linkable compounds. All PL spectra were recorded at excitation=350 nm, except for compound K8-8MI that was excited at 450 nm.

FIG. 3 shows UV/Vis absorption spectra (blue) and PL spectra (orange) for thin films of the non-cross-linkable compounds. All PL spectra were recorded at excitation=350 nm, except for compounds K8-8 and L8-8 that were excited at 450 nm and 300 nm, respectively.

FIG. 4 shows UV/Vis absorption spectra (blue) and PL spectra (orange) for thin films of the cross-linkable compounds. All PL spectra were recorded at excitation=350 nm, except for compounds K8-8 and L8-8 that were excited at 450 nm and 300 nm, respectively.

Figure 5A:
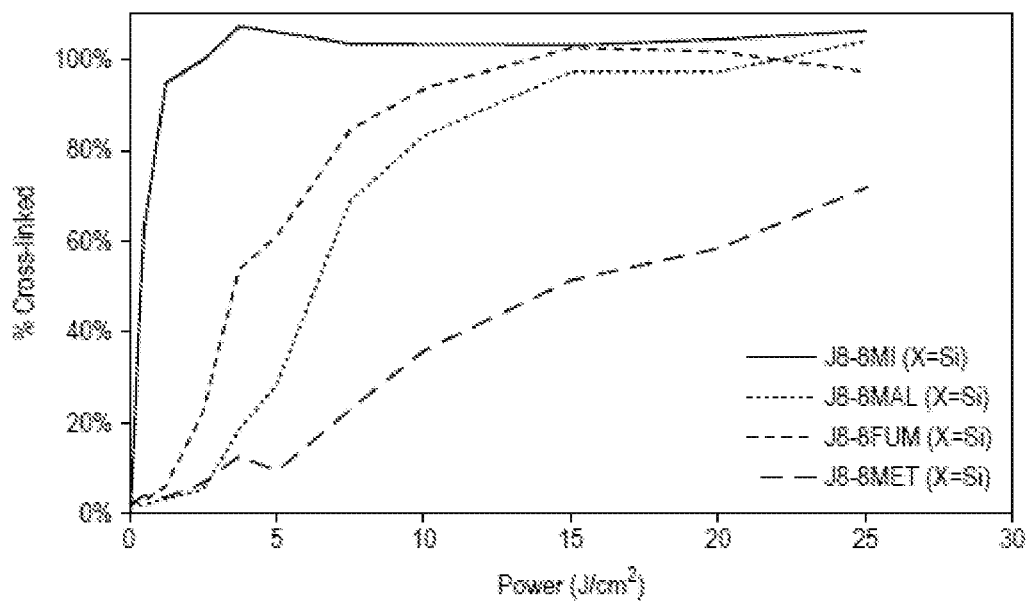
FIGS. 5a and 5b show sensitivity plots for two bi-phenyl dibenzo[d,b]silole cross-linkable donor-acceptor mixtures.
Figure 5B:
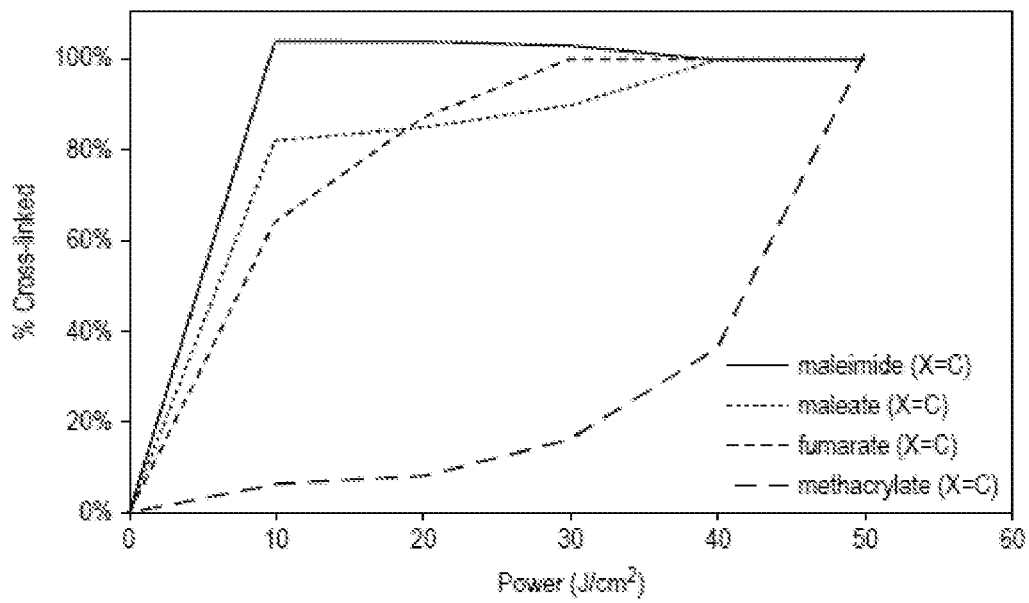

FIG. 5 shows sensitivity plots for two bi-phenyl dibenzo[d,b]silole cross-linkable donor-acceptor mixtures: fumarate/vinyl ether 1:1 (grey) and methacrylate/vinyl ether 1:1 (yellow). The x-axis is power in J/cm², and the y-axis is the percentage of cross-linking achieved, i.e., conversion of monomeric species to cross-linked polymeric species.

Bi-phenyl dibenzo[d,b]silole:

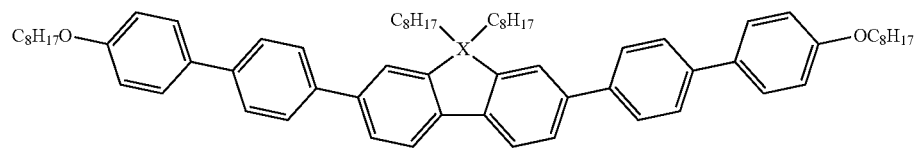

where X=Si.

Synthetic Examples

The compounds of the present invention may be synthesised by common techniques in organic synthesis well known to those of ordinary skill in the art. Illustrative examples of how these compounds can be synthesised are presented below. As can be appreciated, the nature of these materials allows a modular approach to synthesis to be adopted and the silafluorene core can be integrated into a range of materials by standard chemical techniques. In this manner the nature of all components of materials, for example the core A, the various flexible linker/spacer groups ($S^1$, $S^{1a}$, $S^2$, $S^{2a}$ and $S^3$) and the various cross-linkers and cross-linker containing structures (D, $B^1$, $B^2$ and $B^3$) can be readily adjusted to fine tune properties of the bulk materials such as melting point, liquid crystallinity and light emissive properties. The examples provided below are by way of example only and in no way limit the scope of the invention.

Synthesis from Jin et al, *Macromolecules*, 2011, 44, 502-511

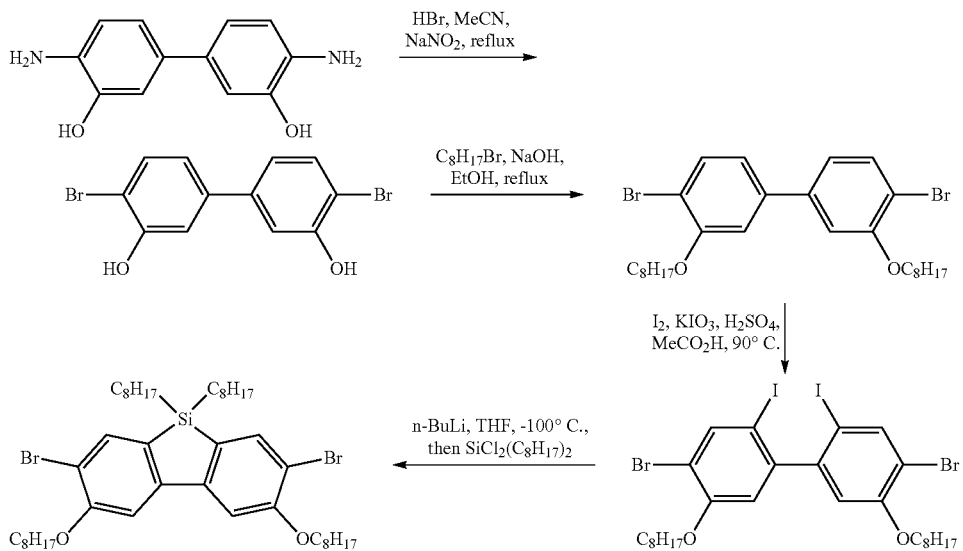

Synthesis from McDowell et al, *Macromolecules*, 2013, 46, 6794-6805.

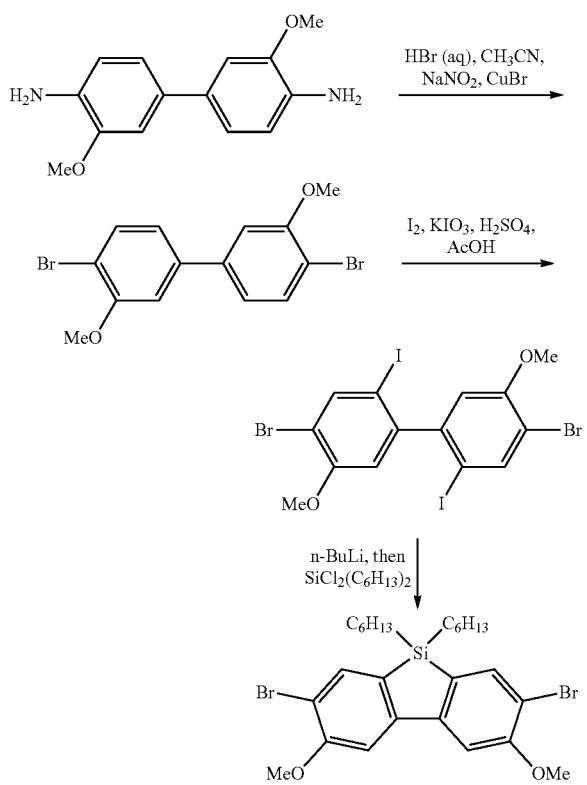

Synthesis of 4,4'-Dibromo-3,3'-dimethoxy-1,1'-biphenyl o-Dianisidine (10.0 g, 40 mmol) was combined with a 40% aqueous solution of HBr (40 mL), H$_2$O (160 mL) and acetonitrile (160 mL) in a 1 L three necked flasked equipped with a thermometer and a dropping funnel. After the starting material had dissolved in the acetonitrile the reaction mixture was cooled to 0° C. in an ice bath. A chilled solution of sodium nitrate (7.2 g, 104.4 mmol) in H$_2$O (14 mL) was added dropwise to the reaction mixture, such that the temperature did not rise above 10° C. Following the addition the reaction mixture was stirred at 0° C. for 30 minutes. After this a freshly prepared solution of CuBr (13.0 g, 90.6 mmol) in a 40% aqueous solution of HBr (160 mL) was added slowly via cannula (to avoid side reaction with atmospheric 02) while ensuring the temperature of the reaction mixture did not rise above 10° C. After the addition the reaction mixture was allowed to warm to room temperature and was then heated to reflux of 1 h. The solution was then cooled to room temperature and extracted with CHCl$_3$ (3×100 mL). The combined organic extracts were then washed with 10% aqueous solution of NaOH and brine and finally dried (MgSO$_4$), filtered and evaporated to dryness under reduced pressure. The crude product was used in the next step without further purification.

Synthesis of 4,4'-Dibromo-2,2'-diiodo-5,5'-dimethoxy-1,1'-biphenyl 4,4'-Dibromo-3,3'-dimethoxy-1,1'-biphenyl (13.0 g, 34.9 mmol), KIO$_3$ (3.3 g, 15.4 mmol) and I$_2$ (9.6 g, 38.0 mmol) were dissolved in a mixture of acetic acid (260 mL) and 7.5 M H$_2$SO$_4$ (26 mL). The solution was heated to 80° C. for 12 h. On completion the reaction mixture was cooled to room temperature and diluted with H$_2$O (250 mL). The precipitate was collected by filtration, dried under vacuum and dissolved in the minimum amount of CHCl$_3$ (200 mL). The organic solution washed with a 10% aqueous solution of NaOH and brine, and then dried (MgSO$_4$), filtered and evaporated to dryness under reduced pressure. The crude product was then purified by recrystallization from boiling ethanol, which yielded the product as brown needle like crystals.

Synthesis of 2,7-Dibromo-3,6-dimethoxy-9,9-dihexylsilafluorene 4,4'-Dibromo-2,2'-diiodo-5,5'-dimethoxy-1,1'-biphenyl (4.0 g, 6.41 mmol) was dissolved in dry THF (60 mL) in a Schlenk flask under Ar and stirred vigorously. The reaction mixture was cool to −110° C. in a MeOH/N₂ bath and then n-BuLi (8.07 mL, 12.9 mmol, 1.6 M in hexanes) was added dropwise over 30 min. The reaction mixture was then stirred at −110° C. for a further 30 min. Next di-n-hexyldichlorosilane (1.96 mL, 7.1 mmol) was added and the reaction mixture was allowed to warm to room temperature and stirred for a further 10 hours. The reaction mixture was then quenched by the addition of water and the product was extracted with diethyl ether. The combined organics were washed with brine, dried (MgSO₄), filtered and the solvent was then removed under reduced pressure. The product was then purified by recrystallization from boiling ethanol.

Scheme and Synthesis Preparations for Silafluorene Compounds A and B 2,7-Bis(4-octyloxybiphenyl-4'-yl)-9,9-dihexylsilafluorene [Compound C]

4-Octyloxybiphenyl-4'-yl-boronic acid (2.36 g, 7.24 mmol), 2,7-dibromo-9,9-dihexylsilafluorene (compound A, 1.60 g, 3.15 mmol), K₂CO₃ (2.17 g, 15.7 mmol), toluene (30 ml) and water (15 ml) were all added to a 3-neck round bottomed flask and the system was evacuated, with the aid of a vacuum pump, and filled with nitrogen 3 times. Subsequently, Pd(PPh₃)₄ (0.36 g, 0.31 mmol) was added and the reaction mixture was stirred under reflux overnight. The reaction mixture was poured into a separating funnel, in which more water (30 ml) and toluene (30 ml) were both added, the water layer washed with toluene (15 ml) and the combined organic layers washed with water (50 ml), dried

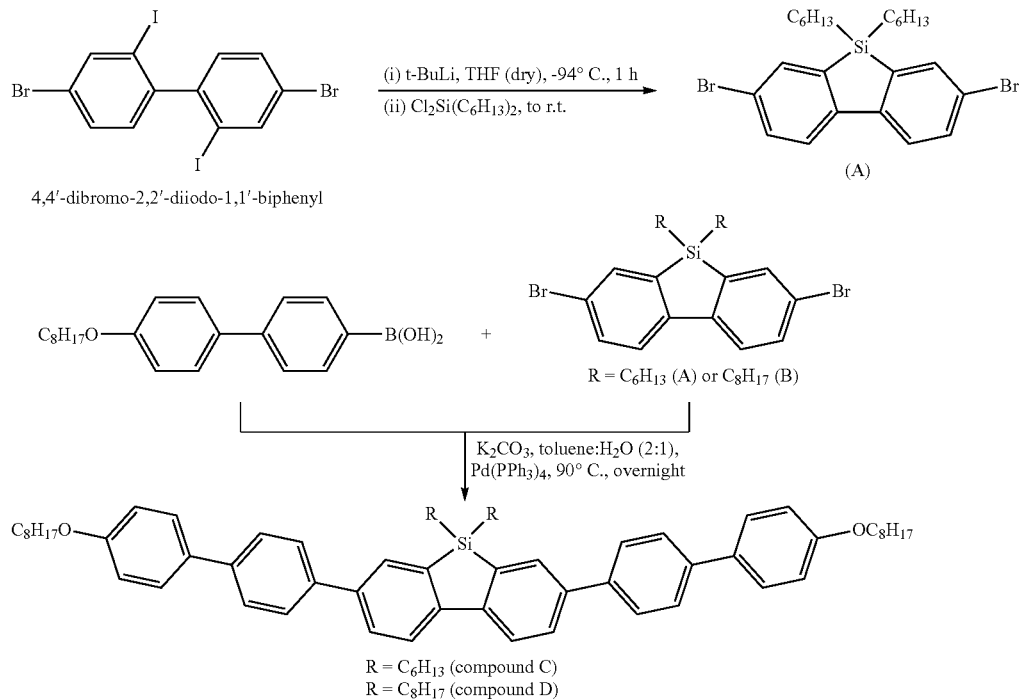

4,4'-Dibromo-2,2'-diiodo-1,1'-biphenyl t-BuLi (15.3 ml, 0.0261 mol, 1.7 M in pentane) was slowly added to a solution of 4,4'-dibromo-2,2'-diiodobiphenyl (3.50 g, 6.21 mmol) in dry THF (40 ml), over 30 mins, at −95° C. (hexanes/liquid nitrogen) under a nitrogen inert atmosphere. The reaction mixture was stirred for a further one hour at −95° C. and dichlorodihexylsilane (3.34 g, 0.0124 mol) was subsequently added and was stirred at room temperature overnight. Water (50 ml) was added and the product was extracted into diethylether (3×50 ml), the ethereal extracts washed with water (150 ml), dried (MgSO₄), filtered and concentrated under reduced pressure. The crude product was purified by gravity column chromatography (wet loaded, silica gel, hexanes) to yield a colourless oil (1.67 g, 53%).

¹H-NMR (400 MHz, CDCl₃): δ (ppm) 7.68 (2H, d, J=2.0 Hz), 7.63 (2H, d, J=8.4 Hz), 7.54 (2H, dd, J=2.0 and 8.0 Hz), 1.19-1.33 (16H, m), 0.91-0.95 (4H, m), 0.84 (6H, t).

(MgSO₄) and filtered. The crude product was purified by gravity column chromatography (silica gel, 30% DCM in hexanes) to yield a white powder (2.00 g, 69.7%).

¹H-NMR (400 MHz, CDCl₃): δ (ppm) 7.82-7.95 (4H, m), 7.61-7.76 (10H, m), 7.58 (4H, d, J=8.8 Hz), 6.99 (4H, d, J=8.8 Hz), 4.01 (4H, t), 1.82 (4H, quint), 1.20-1.53 (36H, m), 1.00-1.04 (4H, m), 0.91 (6H, t), 0.83 (6H, t). MALDI-MS: 910.5 (M⁺).

2,7-Bis(4-octyloxybiphenyl-4'-yl)-9,9-dioctylsilafluorene [Compound D]

4-Octyloxybiphenyl-4'-yl-boronic acid (0.77 g, 2.36 mmol), 2,7-dibromo-9,9-dioctylsilafluorene (compound B, 0.58 g, 1.03 mmol), K₂CO₃ (0.71 g, 5.14 mmol), toluene (10 ml) and water (5 ml) were all added to a 3-neck round bottomed flask and the system was evacuated, with the aid of a vacuum pump, and filled with nitrogen 3 times. Subsequently, Pd(PPh₃)₄ (0.12 g, 0.103 mmol) was added and the reaction mixture was stirred under reflux overnight. The reaction mixture was poured into a separating funnel, in which more water (25 ml) and toluene (25 ml) were both added, the water layer washed with toluene (10 ml) and the combined organic layers washed with water (50 ml), dried (MgSO$_4$) and filtered. The crude product was purified by gravity column chromatography (silica gel, 30% DCM in hexanes) to yield a white solid (0.40 g, 40.4%).

$^1$H-NMR (400 MHz, CDCl$_3$): δ (ppm) 7.89-7.92 (4H, m), 7.63-7.73 (10H, m), 7.59 (4H, d, J=8.8 Hz), 7.00 (4H, d, J=8.8 Hz), 4.02 (4H, t), 1.82 (4H, quint), 1.20-1.53 (44H, m), 1.00-1.04 (4H, m), 0.90 (6H, t), 0.83 (6H, t). MALDI-MS: 966.6 (M$^+$).

Dibenzo[d,b]Silole (Silafluorene)-Based Photo-Cross-linkable Liquid Crystals: Synthesis, Optical Properties and Liquid Crystalline Behaviour The following examples relate to the synthesis and characterisation of n-alkyl-5H-dibenzo[b,d]silole-based liquid crystalline materials for OLED applications, which possess the added benefits of ease of synthesis, wider liquid crystalline phase transition temperature ranges (i.e., from the liquid crystalline state to the isotropic liquid state) and enhanced photo-crosslinking efficiencies. Throughout the examples comparisons are drawn between n-alkyl-5H-dibenzo[b,d]silole-based materials and analogous n-alkylfluorene-based materials:

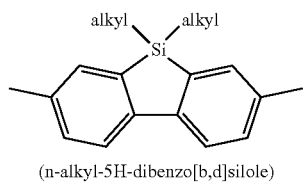
(n-alkyl-5H-dibenzo[b,d]silole)

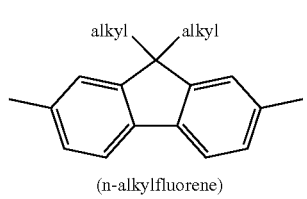
(n-alkylfluorene)

The present inventive examples relate to the following structures both cross-linkable and non-cross-linkable structures:

Non-Cross-Linkable:

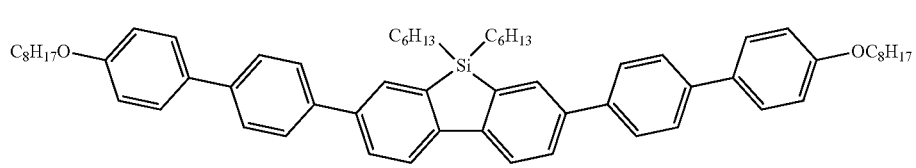
J6-8

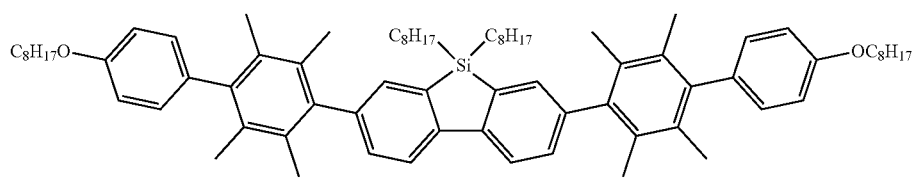
L8-8

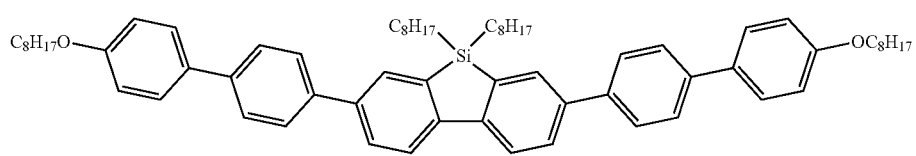
J8-8

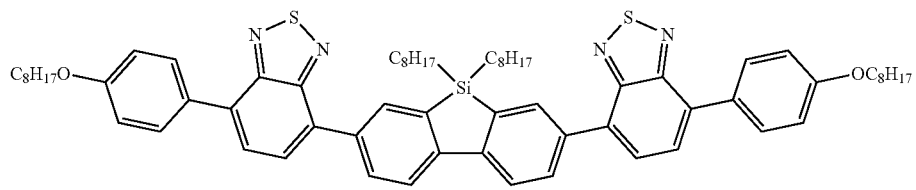
K8-8

Cross-Linkable:

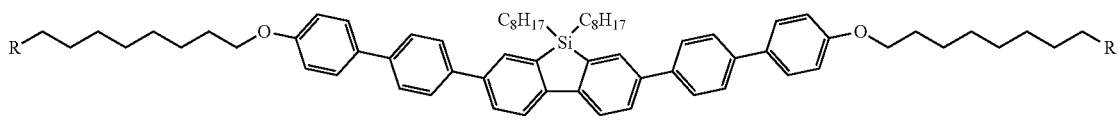

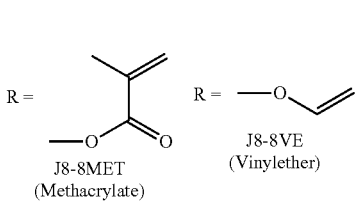
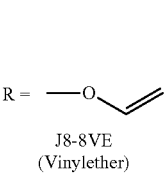
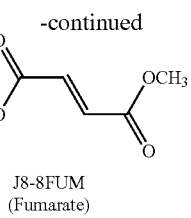
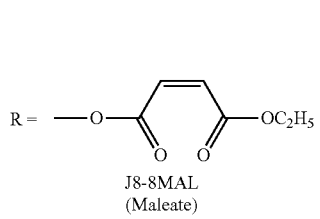
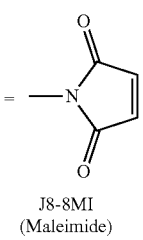

-continued

J8-8MET (Methacrylate)
J8-8VE (Vinylether)
J8-8FUM (Fumarate)
J8-8MAL (Maleate)
J8-8MI (Maleimide)

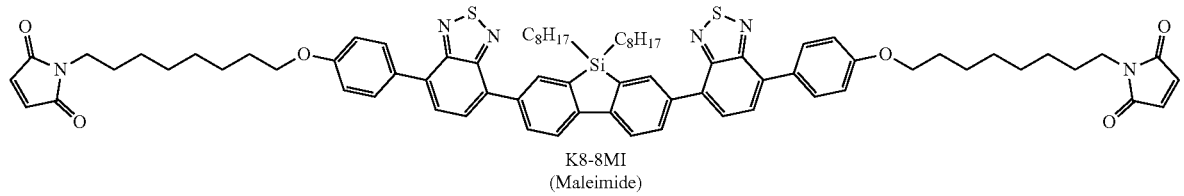

K8-8MI (Maleimide)

Synthesis and Characterisation

In total 10 variations of materials containing the dibenzo[d,b]silole core structure were synthesised from the key commercially available intermediate 9,9-dioctyl-9H-9-silafluorene-2,7-bis(boronic acid) pinacol ester (compound 5):

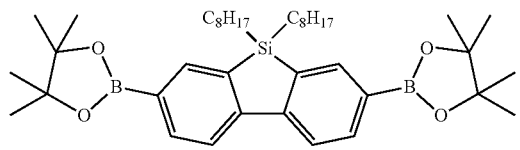

The boronic acid pinacol ester was used in a variety of Suzuki couplings with the corresponding aryl bromides to afford either the desired bis-phenol intermediates (compounds 6 and 14) or to afford the final product directly, such as L8-8. Using a selection of different Williamson-ether synthesis conditions, it was possible to couple the bis-phenols to an assortment of alkyl bromides to give the desired cross-linkable final products (J8-8VE, J8-8MI and K8-8MI) or to afford the bis-phenoxy-octan-1-ol derivative (compound 13) that was used to synthesise the other final products (J8-8MET, J8-8FUM and J8-8MAL). When designing the materials, we selected five different cross-linkable groups to attach to the peripheries of the molecules, such as vinyl ether (electron rich) and four electron deficient groups, such as methacrylate, fumarate, maleate and maleimide. These were all attached to the bi-phenyl substituted dibenzo[d,b]silole core via equivalent spacers, so that we could evaluate the photo-crosslinkable properties of this novel family of materials. In addition to these photo-cross-linkable compounds, non-cross-linkable analogues were synthesised for comparison. The chemical syntheses were designed to be as simple as possible to keep the costs low and enhance the possibility of scale-up, which would render the materials more commercially viable.

Both non-crosslinkable (K8-8) and cross-linkable (K8-8MI) compounds, containing phenyl-benzothiadiazole groups attached to the central dibenzo[d,b]silole core, were synthesised. The phenyl-benzothiadiazole unit was chosen to red-shift the emission into the green region of the visible spectrum. Both the cross-linkable and non-cross-linkable versions were synthesised so that the effects of adding the cross-linkable group to the emissive core could be evaluated. The maleimide group was chosen as the cross-linkable moiety for the green-emissive compound due to the highly efficient photo-crosslinking results observed with the blue-emissive bi-phenyl versions.

A durene-phenyl substituted compound (L8-8) was synthesised as a potential host for the blue-emissive dopant J8-8. It was hypothesised that replacing one of the phenyl rings in the bi-phenyl unit with a durene unit could reduce the effective conjugation of the molecule. The durene units should be able to twist and increase the dihedral angle between the dibenzo[d,b]silole central core and the durene-phenyl aromatic groups, which could enlarge the band-gap of the material and afford a compound that could potentially be used as a host material for a smaller band-gap emissive dopant material.

The compounds of the present invention can be synthesised by common techniques in organic synthesis that are well known to those of ordinary skill in the art. Illustrative examples of how these compounds can be synthesised are presented below. As can be appreciated, the nature of these materials allows a modular approach to be adopted for the chemical syntheses. In this manner, the nature of all components of the materials (formula $D-S^1-A-S^2-B^1$, see family 14 patent), such as the core A, the various flexible linker/spacer groups ($S^1$, $S^{1a}$, $S^2$, $S^{2a}$ and $S^3$) and the various cross-linkers and cross-linker containing structures (D, $B^1$, $B^2$ and $B^3$) can be readily adjusted to fine tune properties of the bulk materials, such as the melting point, liquid crystallinity and emissive properties. The materials shown below are examples only and in no way limit the scope of the invention.

Scheme 1

3,7-Dibromo-5,5-dihexyl-5H-dibenzo[b,d]silole (2) was synthesised in good yield (53%) by treatment of 4,4'-dibromo-2,2'-diiodobiphenyl (1) with t-BuLi to form the lithium salt with subsequent quenching with dichlorodihexylsilane. Compound 3 was purchased commercially and Suzuki coupling reactions of both compounds (2) and (3) with boronic acid (4) afforded the final materials J6-8 and J8-8.

Scheme 1. Synthesis of 5,5-dialkyl-5H-dibenzo[b,d]silole-3,7-biphenyl derivatives J6-8 and J8-8.

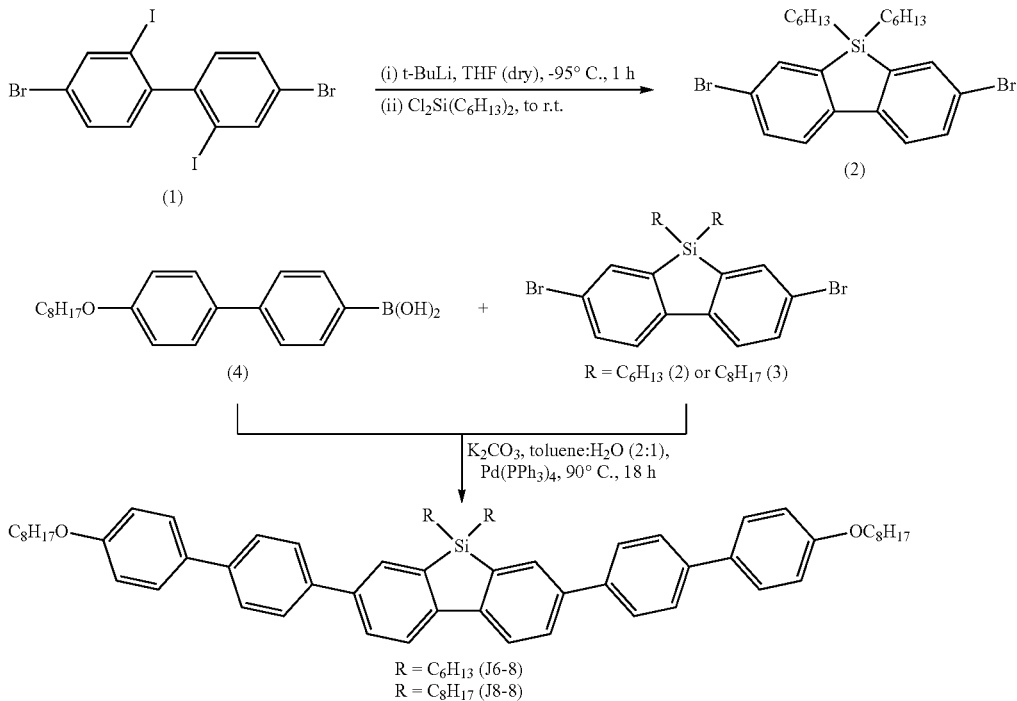

3,7-Dibromo-5,5-dihexyl-5H-dibenzo[b,d]silole (2)

t-BuLi (15.3 mL, 0.0261 mol, 1.7 M in pentane) was slowly added to a solution of 4,4'-dibromo-2,2'-diiodobiphenyl (compound 1, 3.50 g, 6.21 mmol) in dry THF (40 mL), over 30 mins, at −95° C. (hexanes/liquid nitrogen) under a nitrogen inert atmosphere. The reaction mixture was stirred for a further one hour at −95° C. and dichlorodihexylsilane (3.34 g, 0.0124 mol) was subsequently added and was stirred at room temperature overnight. Water (50 mL) was added and the product was extracted into diethylether (3×50 mL), the ethereal extracts washed with water (150 mL), dried (MgSO$_4$), filtered and concentrated under reduced pressure. The crude product was purified by gravity column chromatography (wet loaded, silica gel, hexanes) to yield compound 2 as a colourless oil (1.67 g, 53%).

$^1$H NMR (400 MHz, CDCl$_3$): δ (ppm) 0.84 (6H, t, J=6.8 Hz, CH$_3$), 0.91-0.95 (4H, m, CH$_2$), 1.18-1.33 (16H, m, CH$_2$), 7.53 (2H, dd, J=2.0 and 8.0 Hz, Ar—H), 7.63 (2H, d, J=8.4 Hz, Ar—H), 7.68 (2H, d, J=2.0 Hz, Ar—H).

3,7-Bis(4-octyloxybiphenyl-4'-yl)-5,5-dihexyl-5H-dibenzo[b,d]silole (J6-8)

4-Octyloxybiphenyl-4'-boronic acid (compound 4, 2.36 g, 7.24 mmol), 3,7-dibromo-5,5-dihexyl-5H-dibenzo[b,d]silole (compound 2, 1.60 g, 3.15 mmol), K$_2$CO$_3$ (2.17 g, 15.7 mmol), toluene (30 mL) and water (15 mL) were all added to a 3-neck round bottomed flask and the system was degassed with the aid of two freeze-pump-thaw cycles using nitrogen as the inert gas. Subsequently, Pd(PPh$_3$)$_4$ (0.36 g, 0.31 mmol) was added and the reaction mixture was again degassed by one freeze-pump-thaw cycle. The reaction mixture was stirred at 90° C. for 18 h and poured into a separating funnel, in which more water (30 mL) and toluene (30 mL) were both added, the water layer washed with toluene (15 mL) and the combined organic layers washed with water (50 mL), dried (MgSO$_4$) and filtered. The crude product was purified by gravity column chromatography (dry loaded, silica gel, 20% dichloromethane in hexanes) to yield compound J6-8 as a white powder (2.00 g, 69.7%). Further purification can be carried out by recrystallisation from DCM/ethanol layering.

$^1$H NMR (400 MHz, CDCl$_3$): δ (ppm) 0.83 (6H, t, J=6.8 Hz, CH$_3$), 0.90 (6H, t, J=7.0 Hz, CH$_3$), 1.00-1.04 (4H, m, CH$_2$), 1.19-1.51 (36H, m, CH$_2$), 1.82 (4H, quint., CH$_2$), 4.02 (4H, t, J=6.6 Hz, CH$_2$), 7.00 (4H, d, J=8.8 Hz, Ar—H), 7.59 (4H, d, J=8.8 Hz, Ar—H), 7.66 (4H, d, J=8.8 Hz, Ar—H), 7.72 (6H, d, J=8.0 Hz, Ar—H), 7.88 (2H, d, J=2.0 Hz, Ar—H), 7.92 (2H, d, J=8.0 Hz, Ar—H). $^{13}$C NMR (100 MHz, CDCl$_3$): δ (ppm) 12.5 (CH$_2$), 14.2 (CH$_3$), 14.3 (CH$_3$), 22.7 (CH$_2$), 22.8 (CH$_2$), 24.1 (CH$_2$), 26.2 (CH$_2$), 29.4 (CH$_2$), 29.5 (x2) (CH$_2$), 31.5 (CH$_2$), 32.0 (CH$_2$), 33.3 (CH$_2$), 68.3 (CH$_2$), 115.0 (CH), 121.4 (CH), 127.2 (CH), 127.5 (CH), 128.1 (CH), 129.0 (CH), 131.9 (CH), 133.2 (C), 139.0 (C), 139.5 (C), 139.6 (C), 139.9 (C), 147.4 (C), 159.0 (CO). MALDI-MS: 910.6 (M$^+$). Elemental analysis: expected C=84.34, H=9.07, measured C=84.32, H=9.00.

3,7-Bis(4-octyloxybiphenyl-4'-yl)-5,5-dioctyl-5H-dibenzo[b,d]silole (J8-8)

4-Octyloxybiphenyl-4'-yl-boronic acid (compound 4, 0.77 g, 2.36 mmol), 3,7-dibromo-5,5-dioctyl-5H-dibenzo[b,d]silole (compound 3, 0.58 g, 1.03 mmol), K$_2$CO$_3$ (0.71 g, 5.14 mmol), toluene (10 mL) and water (5 mL) were all added to a 3-neck round bottomed flask and the system was degassed with the aid of two freeze-pump-thaw cycles using nitrogen as the inert gas. Subsequently, Pd(PPh$_3$)$_4$ (0.12 g, 0.103 mmol) was added and the reaction mixture was again degassed by one freeze-pump-thaw cycle. The reaction mixture was stirred at 90° C. for 18 h and poured into a separating funnel, in which more water (25 mL) and toluene (25 mL) were both added, the water layer washed with toluene (10 mL) and the combined organic layers washed with water (50 mL), dried (MgSO$_4$) and filtered. The crude product was purified by gravity column chromatography (dry loaded, silica gel, 20% dichloromethane in hexanes) to yield compound J8-8 as a white powder (0.40 g, 40.4%). Further purification can be carried out by recrystallisation from DCM/ethanol layering.

$^1$H NMR (400 MHz, CDCl$_3$): δ (ppm) 0.83 (6H, t, J=6.8 Hz, CH$_3$), 0.90 (6H, t, J=6.8 Hz, CH$_3$), 1.00-1.04 (4H, m, CH$_2$), 1.20-1.51 (44H, m, CH$_2$), 1.82 (4H, quint., CH$_2$), 4.02 (4H, t, J=6.6 Hz, CH$_2$), 7.00 (4H, d, J=8.8 Hz, Ar—H), 7.59 (4H, d, J=8.8 Hz, Ar—H), 7.65 (4H, d, J=8.4 Hz, Ar—H), 7.72 (6H, d, J=8.4 Hz, Ar—H), 7.88 (2H, d, J=1.6 Hz, Ar—H), 7.92 (2H, d, J=8.0 Hz, Ar—H). $^{13}$C NMR (100 MHz, CDCl$_3$): δ (ppm) 12.5 (CH$_2$), 14.2 (CH$_3$), 14.3 (CH$_3$), 22.8 (x2) (CH$_2$), 24.2 (CH$_2$), 26.2 (CH$_2$), 29.3 (CH$_2$), 29.4 (x2) (CH$_2$), 29.5 (x2) (CH$_2$), 32.0 (CH$_2$), 33.6 (CH$_2$), 68.3 (CH$_2$), 115.0 (CH), 121.4 (CH), 127.2 (CH), 127.5 (CH), 128.1 (CH), 129.0 (CH), 131.9 (CH), 133.2 (C), 139.0 (C), 139.5 (C), 139.6 (C), 139.8 (C), 147.3 (C), 159.0 (CO). MALDI-MS: 966.6 (M$^+$). Elemental analysis: expected C=84.41, H=9.38, measured C=84.47, H=9.29.

Scheme 2

Firstly, a Suzuki coupling reaction between the commercially available boronic ester (5) and 4-bromo-4'-hydroxybiphenyl using catalyst Pd(PPh$_3$)$_4$ in dioxane/H$_2$O (3:1) afforded the bis-phenol (6) in good yield (66%). Due to the poor solubility of compound (6) in moderately polar solvents purification was simply carried out by washing with dichloromethane and filtering. The bromo-alkyl Diels-Alder furan-maleimide adduct (10) was reacted with (6) by a Williamson-ether reaction in DMF at 50° C. to yield the protected derivative of J8-8MI in moderate yield (31%). Subsequent deprotection by heating in toluene afforded the final maleimide material J8-8MI in moderate yield (44%). Compound J8-8VE was synthesised in good yield (51%) by Williamson-ether reaction using potassium carbonate as the base in refluxing butanone.

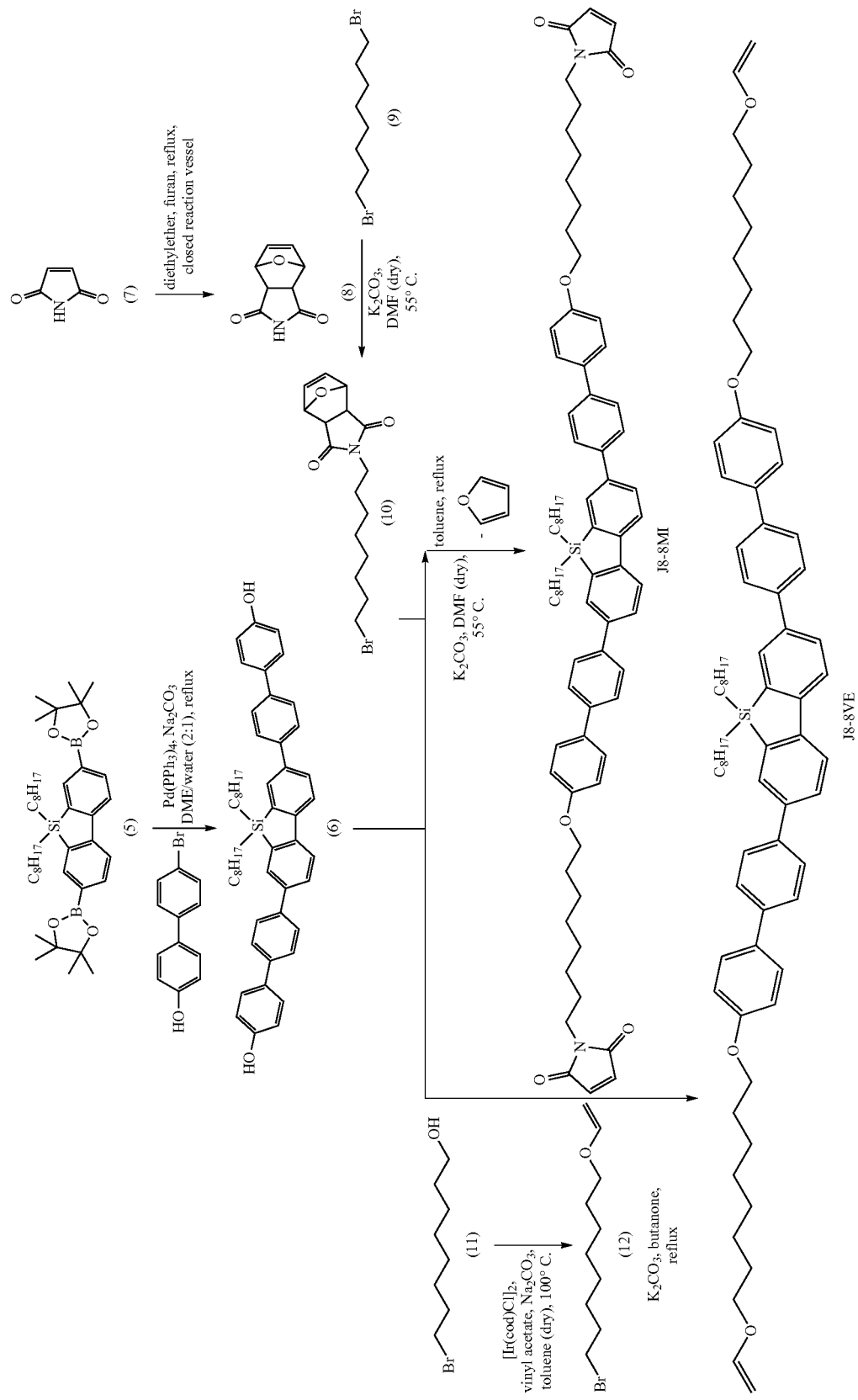
Scheme 2. Synthesis of derivatives J8-8VE and J8-8MI.

3,7-Bis(4-hydroxybiphenyl-4'-yl)-5,5-dioctyl-5H-dibenzo[b,d]silole (6)

4-Bromo-4'-hydroxybiphenyl (3.40 g, 13.7 mmol), 5,5-dioctyl-3,7-bis(4,4,5,5-tetramethyl-1,3,2-dioxaborolan-2-yl)-5H-dibenzo[b,d]silole (compound 5, 3.00 g, 4.55 mmol), $Na_2CO_3$ (18.0 g), DME (180 mL) and water (90 mL) were all added to a 3-neck round bottomed flask. The system was degassed with the aid of sonication under a vacuum (30 seconds), and then back filled with nitrogen, this process was repeated 10 times. Subsequently, $Pd(PPh_3)_4$ (0.53 g, 0.45 mmol) was added and the reaction mixture was stirred at reflux under nitrogen for 18 h. The reaction mixture was then acidified with 10% HCl (200 mL) and then poured into a separating funnel, the aqueous layer was extracted with ethyl acetate (3×150 mL) and the combined organics were washed with water (200 mL), dried ($MgSO_4$) and filtered. After filtering the organic layer was evaporated to dryness under reduced pressure, and the crude product was purified by trituration under dichloromethane (50 mL) and repeated washing with dichloromethane (2×100 mL), to yield compound 6 as a white powder (3.00 g, 88.8%).

$^1$H NMR (400 MHz, $CO(CD_3)_2$): δ (ppm) 0.78 (6H, t, J=7.0 Hz, $CH_3$), 1.07-1.30 (24H, m, $CH_2$), 1.41-1.49 (4H, m, $CH_2$), 6.93-6.97 (4H, m, Ar—H), 7.53-7.57 (4H, m, Ar—H), 7.60 (2H, dd, J=8.1, 2.0 Hz, Ar—H), 7.63-7.66 (4H, m, Ar—H), 7.71-7.76 (6H, m, Ar—H), 8.11 (2H, d, J=1.9 Hz, Ar—H), 8.51 (2H, s, OH). MALDI-MS: 742.3 ($M^+$).

3,6-endo, exo-oxo-$\Delta^4$-tetrahydrophthalimide (8)

A solution of maleimide (7, 2.50 g, 25.8 mmol) and furan (10 mL) in ethyl acetate (20 mL) was stirred at room temperature for 3 days. The resulting precipitate was filtered and dried under vacuum to yield a white powder (3.00 g, 71%). The product 8 was obtained as a mixture of endo- and exo-adducts (1.6:1).

$^1$H NMR (400 MHz, $CDCl_3$): δ (ppm) endo product: 3.6 (s, 2H), 5.35 (s, 2H), 6.6 (s, 2H), exo product: 2.9 (s, 2H), 5.35 (s, 2H), 6.6 (s, 2H).

8-(3, 6-exo-oxo-$\Delta^4$-tetrahydrophthalimide)bromooctane (10)

A mixture of compound 8 (0.76 g, 4.6 mmol), 1,8-dibromooctane (9, 5.0 g, 18.4 mmol) and $K_2CO_3$ (3.18 g, 23.0 mmol) were suspended in dry DMF (10 mL) and stirred at 55° C. under a nitrogen atmosphere for 18 h. The DMF was removed under reduced pressure and the residue was redissolved in dichloromethane (50 mL) and the salts were removed by filtration. The filtrate was evaporated to dryness under reduced pressure and the crude product was purified by column chromatography (silica gel, 30% ethylacetate in hexanes to 50% ethylacetate in hexanes) to yield compound 10 as a viscous liquid that crystallised overnight (0.40 g, 24%).

$^1$H NMR (400 MHz, $CDCl_3$): δ (ppm) exo product 1.20-1.60 (m, 10H), 1.85 (quint., 2H), 2.9 (s, 2H), 3.40 (trip., 2H), 3.50 (trip., 2H), 5.35 (s, 2H), 6.6 (s, 2H).

J8-8MI

A mixture of compound 6 (1.00 g, 1.35 mmol), compound 10 (1.44 g, 4.04 mmol) and $K_2CO_3$ (0.93 g, 6.73 mmol) were suspended in dry DMF (50 mL). The reaction mixture was heated to 55° C. and stirred under nitrogen for 20 h. After completion the reaction mixture was allowed to cool to room temperature and the salts were removed by filtration. The filtrate was evaporated under reduced pressure. The residue was redissolved in dichloromethane (100 mL) and washed with water (3×100 mL). The organic layer was dried ($MgSO_4$), filtered and evaporated to dryness under reduced pressure. The crude product was then purified by flash column chromatography (50% ethyl acetate in hexanes to 100% ethyl acetate) to yield the protected maleimide derivative as a yellow solid (0.54 g, 31%).

$^1$H NMR (400 MHz, $CDCl_3$): δ (ppm) 0.84 (6H, t, J=7.0 Hz, $CH_3$), 1.01-1.05 (4H, m, $CH_2$), 1.21-1.62 (44H, m, $CH_2$), 1.78-1.85 (4H, m, $CH_2$), 2.84 (4H, s, CH), 3.49 (4H, t, J=7.3 Hz, $CH_2$), 4.01 (4H, t, J=7.5 Hz, $CH_2$), 5.28 (4H, s, CH), 6.52 (4H, s, =CH), 7.00 (4H, br d, J=8.7 Hz, Ar—H), 7.59 (4H, br d, J=8.7 Hz, Ar—H), 7.66 (4H, br d, J=8.2 Hz, Ar—H), 7.72-7.74 (6H, m, Ar—H), 7.90 (2H, d, J=1.5 Hz, Ar—H), 7.93 (2H, d, J=8.2 Hz, Ar—H). $^{13}$C NMR (100 MHz, $CDCl_3$): δ (ppm) 12.4 ($CH_2$), 14.1 ($CH_3$), 22.6 ($CH_2$), 24.0 ($CH_2$), 25.9 ($CH_2$), 26.6 ($CH_2$), 27.5 ($CH_2$), 29.0 ($CH_2$), 29.1 ($CH_2$), 29.2(3x) ($CH_2$), 31.8 ($CH_2$), 33.4 ($CH_2$), 39.0 ($CH_2$), 47.4 (CH), 68.1 ($CH_2$), 80.9 (CH), 114.9 (CH), 121.2 (CH), 127.0 (CH), 127.3 (CH), 128.0 (CH), 128.9 (CH), 131.7 (CH), 133.0 (C), 136.5 (CH), 138.8 (C), 139.4 (C), 139.5 (C), 139.7 (C), 147.2 (C), 158.8 (C), 176.3 (C=O). MALDI-MS: 1293.7 ($MH^+$).

The protected maleimide (0.53 g, 0.41 mmol) was heated at reflux in toluene (10 mL) for 16 h to fully eliminate furan. The toluene was removed under reduced pressure and the crude product was purified by flash chromatography (100% dichloromethane to 2% ethyl acetate in dichloromethane) to yield an off-white waxy solid. This was further purified by trituration in ethanol to yield J8-8MI as an off-white solid (0.21 g, 44%).

$^1$H NMR (400 MHz, $CDCl_3$): δ (ppm) 0.84 (6H, t, J=7.0 Hz, $CH_3$), 1.01-1.05 (4H, m, $CH_2$), 1.21-1.52 (40H, m, $CH_2$), 1.57-1.65 (4H, m, $CH_2$), 1.78-1.85 (4H, m, $CH_2$), 3.53 (4H, t, J=7.3 Hz, $CH_2$), 4.02 (4H, t, J=6.5 Hz, $CH_2$), 6.70 (4H, s, CH=CH), 6.99-7.02 (4H, m, Ar—H), 7.57-7.61 (4H, m, Ar—H), 7.65-7.68 (4H, m, Ar—H), 7.71-7.74 (6H, m, Ar—H), 7.90 (2H, d, J=1.8 Hz, Ar—H), 7.93 (2H, d, J=8.1 Hz, Ar—H). $^{13}$C NMR (100 MHz, $CDCl_3$): δ (ppm) 12.4 ($CH_2$), 14.1 ($CH_3$), 22.6 ($CH_2$), 24.0 ($CH_2$), 26.0 ($CH_2$), 26.7 ($CH_2$), 28.5 ($CH_2$), 29.0 ($CH_2$), 29.1 ($CH_2$), 29.2(3x) ($CH_2$), 31.8 ($CH_2$), 33.4 ($CH_2$), 37.9 ($CH_2$), 68.0 ($CH_2$), 114.9 (CH), 121.2 (CH), 127.0 (CH), 127.3 (CH), 128.0 (CH), 128.9 (CH), 131.7 (CH), 133.0 (C), 134.0 (CH), 138.8 (C), 139.4 (C), 139.5 (C), 139.7 (C), 147.2 (C), 158.8 (C), 170.9 (C=O). MALDI-MS: 1156.6 ($M^+$). Elemental analysis: expected C=78.85, H=8.01, N=2.42, measured C=78.75, H=7.93, N=2.45.

8-Bromo-1-vinyloxy Octane (Compound 12)

A three-neck round bottomed flask equipped with a water condenser was dried under vacuum using a heat gun. After cooling down to room temperature 8-bromo-1-octanol (11, 15.0 g, 0.0717 mol), vinyl acetate (dried using $K_2CO_3$ and distilled, 12.4 g, 0.1435 mol), $Na_2CO_3$ (dried at 80° C. under vacuum for 5 hours, 4.65 g, 0.0430 mol) and toluene (dry and degassed, 150 mL) were added and purged with nitrogen gas. The catalyst $[Ir(cod)Cl]_2$ (0.96 g, 0.0014 mol) was added and the reaction mixture was stirred at 100° C. for 2 hours. The reaction mixture was cooled to room temperature and the toluene was removed under reduced pressure. The crude product was purified over a short silica gel plug (wet loaded, 20% dichloromethane in hexanes), followed by flash column chromatography (wet loaded, 3% diethylether in hexanes) to yield compound 12 as a yellow oil (4.45 g, 26.3%).

¹H NMR (400 MHz, CDCl₃): δ (ppm) 1.30-1.45 (m, 8H), 1.65 (quint., 2H), 1.85 (quint., 2H), 3.40 (t, 2H), 3.67 (t, 2H), 3.97 (dd, 1H), 4.16 (dd, 1H), 6.46 (dd, 1H).

J8-8VE

A solution of compound 6 (0.50 g, 0.67 mmol) and compound 12 (0.47 g, 2.02 mmol) in butanone (20 mL) with Cs₂CO₃ (1.10 g, 3.36 mmol) was degassed and stirred at reflux under nitrogen for 20 h. After completion the salts were removed by filtration and the filtrate was evaporated to dryness under reduced pressure. The crude product was then redissolved in dichloromethane (50 mL) and washed with water (2×50 mL). The organic layer was then dried (MgSO₄), filtered and concentrated under reduced pressure. The crude product was then purified by trituration in ethanol and recrystallisation from DCM/ethanol layering to yield a white solid (0.36 g, 51%).

86.2 (CH₂), 114.8 (CH), 121.3 (CH), 127.0 (CH), 127.3 (CH), 128.0 (CH), 128.9 (CH), 131.7 (CH), 133.0 (C), 138.8 (C), 139.4 (C), 139.5 (C), 139.7 (C), 147.2 (C), 152.0 (CH), 158.8 (C). MALDI-MS: 1050.6 (M⁺). Elemental analysis: expected C=82.23, H=9.01, measured C=81.95, H=8.96.

Scheme 3

Firstly, a Williamson-ether reaction between 8-bromo-1-octanol (11) and bis-phenol (6) in a butanone-DMF solvent mixture afforded compound 13 in moderate yield. The mixed solvent system was utilised due to solubility issues in just butanone alone. Three Steglich esterifications under similar reaction conditions at room temperature afforded the final materials J8-8MET, J8-8FUM and J8-8MAL in moderate yields.

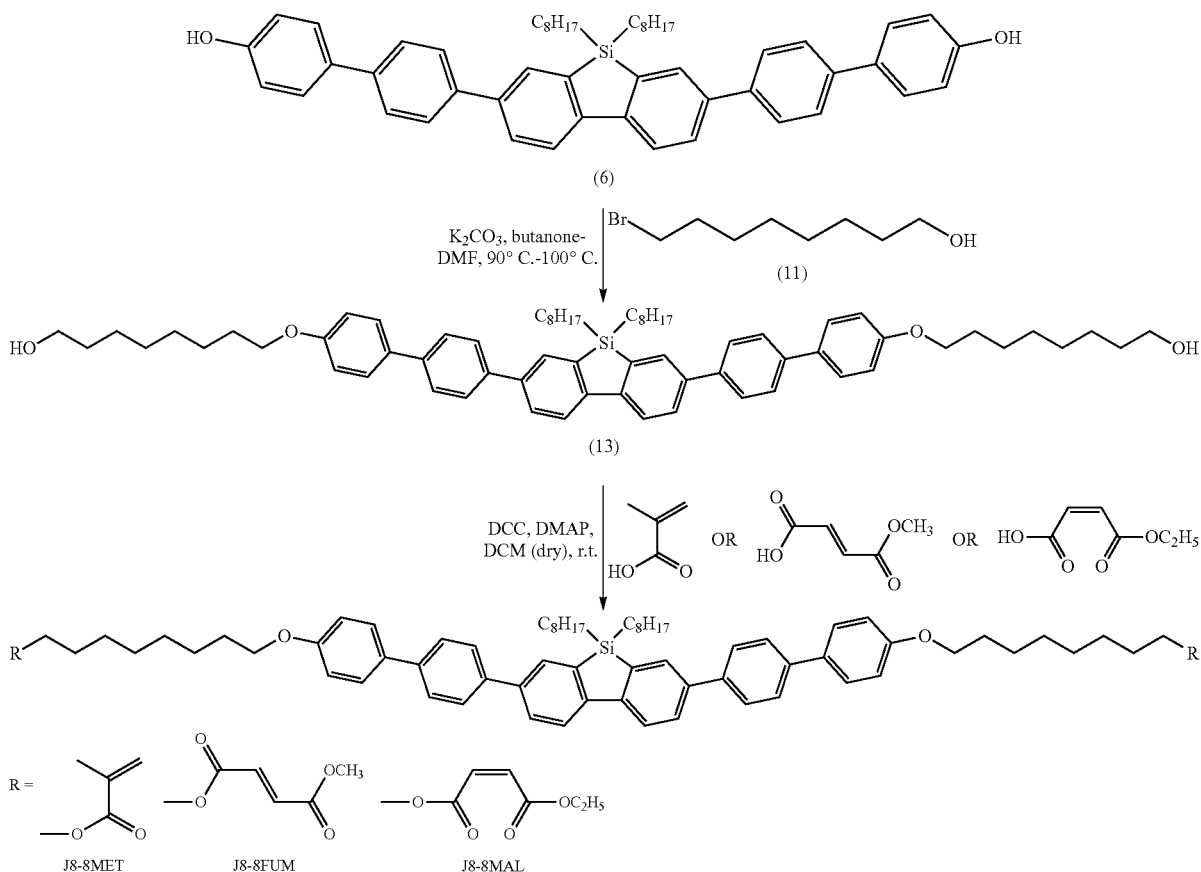

¹H NMR (400 MHz, CDCl₃): δ (ppm) 0.84 (6H, t, J=7.0 Hz, CH₃), 1.01-1.05 (4H, m, CH₂), 1.21-1.30 (20H, m, CH₂), 1.40-1.52 (20H, m, CH₂), 1.65-1.70 (4H, m, CH₂), 1.80-1.87 (4H, m, CH₂), 3.70 (4H, t, J=6.5 Hz, CH₂), 3.99 (2H, dd, J=6.8, 1.8 Hz, CH=CH₂), 4.03 (4H, t, J=6.5 Hz, CH₂), 4.19 (2H, dd, J=14.3, 1.8 Hz, CH=CH₂), 6.49 (2H, dd, J=14.3, 6.8 Hz, CH=CH₂), 7.01 (4H, br d, J=8.6 Hz, Ar—H), 7.59 (4H, br d, J=8.7 Hz, Ar—H), 7.66-7.68 (4H, m, Ar—H), 7.72-7.74 (6H, m, Ar—H), 7.90 (2H, d, J=1.5 Hz, Ar—H), 7.93 (2H, d, J=8.1 Hz, Ar—H). ¹³C NMR (100 MHz, CDCl₃): δ (ppm) 12.4 (CH₂), 14.1 (CH₃), 22.6 (CH₂), 24.0 (CH₂), 26.0 (x2) (CH₂), 29.1 (x2) (CH₂), 29.2 (CH₂), 29.3 (x3) (CH₂), 31.8 (CH₂), 33.4 (CH₂), 68.1 (x2) (CH₂), Compound 13

A solution of compound 6 (1.80 g, 2.42 mmol) and 1-bromo-8-octanol (11, 1.27 g, 6.06 mmol) in butanone (20 mL) and dry DMF (20 mL) with K₂CO₃ (1.67 g, 12.1 mmol) was stirred between 90° C. and 100° C. under nitrogen for 2 days. After completion the salts were removed by filtration and the filtrate was concentrated under reduced pressure. The crude product was then purified by flash column chromatography (wet loaded, silica gel, 30% diethyl ether in dichloromethane to 20% ethanol in dichloromethane) and dried over 2 days under high vacuum to remove residual ethanol to yield a white solid (2.06 g, 85.1%).

¹H NMR (400 MHz, CDCl₃): δ (ppm) 0.83 (6H, t, J=7.0 Hz, CH₃), 1.00-1.04 (4H, m, CH₂), 1.20-1.61 (44H, m, CH₂), 1.82 (4H, quint., CH₂), 3.66 (4H, t, J=6.6 Hz, CH₂), 4.01 (4H, t, J=6.4 Hz, CH₂), 6.99 (4H, d, J=8.8 Hz, Ar—H), 7.58 (4H, d, J=8.8 Hz, Ar—H), 7.64-7.72 (10H, m, Ar—H), 7.87-7.89 (4H, m, Ar—H). MALDI-MS: 998.6 (M⁺).

J8-8MET

DCC (0.52 g, 2.50 mmol) was added portion wise to a solution of compound 13 (0.50 g, 0.50 mmol), methacrylic acid (0.22 g, 2.50 mmol) and DMAP (61 mg, 0.50 mmol) in dry CH₂Cl₂ (30 mL) at room temperature under a nitrogen atmosphere. The reaction mixture was stirred for 20 h and the formed DCU was filtered and CH₂Cl₂ was removed under reduced pressure. The resulting residue was purified by column chromatography (dry loaded, silica gel, 80% dichloromethane in hexanes) to yield a white solid (0.22 g, 38.6%).

¹H NMR (400 MHz, CDCl₃): δ (ppm) 0.83 (6H, t, J=6.8 Hz, CH₃), 0.90 (6H, t, J=6.8 Hz, CH₃), 1.00-1.04 (4H, m, CH₂), 1.20-1.51 (40H, m, CH₂), 1.70 (4H, quint., CH₂), 1.82 (4H, quint., CH₂), 1.95-1.96 (6H, m, CH₃) 4.02 (4H, t, J=6.4 Hz, CH₂), 4.16 (4H, t, J=6.8 Hz, CH₂), 5.55 (2H, quint., HCH═C), 6.11 (2H, sext., J=0.8 Hz, HCH═C), 7.00 (4H, d, J=8.8 Hz, Ar—H), 7.58 (4H, d, J=8.8 Hz, Ar—H), 7.65 (4H, d, J=8.8 Hz, Ar—H), 7.70-7.73 (6H, m, Ar—H), 7.89 (2H, d, J=2.0 Hz, Ar—H), 7.92 (2H, d, J=8.0 Hz, Ar—H). ¹³C NMR (100 MHz, CDCl₃): δ (ppm) 12.5 (CH₂), 14.2 (CH₃), 18.5 (CH₃), 22.8 (CH₂), 24.2 (CH₂), 26.1 (CH₂), 26.2 (CH₂), 28.8 (CH₂), 29.3 (CH₂), 29.4 (x3) (CH₂), 32.0 (CH₂), 33.6 (CH₂), 64.9 (CH₂), 68.2 (CH₂), 115.0 (CH), 121.4 (CH), 125.3 (CH), 127.2 (CH), 127.5 (CH), 128.2 (CH), 129.0 (CH), 131.9 (CH), 133.2 (CH), 136.7 (C), 139.0 (C), 139.5 (C), 139.7 (C), 139.8 (C), 147.4 (C), 158.9 (CO), 167.7 (C═O). MALDI-MS: 1134.6 (M⁺). Elemental analysis: expected C=80.38, H=8.7, measured C=80.18, H=8.53.

J8-8FUM

DCC (0.52 g, 2.50 mmol) was added portion wise to a solution of compound 13 (0.50 g, 0.50 mmol), mono-methyl fumarate (0.33 g, 2.50 mmol) and DMAP (61 mg, 0.50 mmol) in dry CH₂Cl₂ (20 mL) at room temperature under a nitrogen atmosphere. The reaction mixture was stirred for 20 h and the formed DCU was filtered and CH₂Cl₂ was removed using a rotary evaporator. The resulting residue was purified by column chromatography (dry loaded, silica gel, 20% ethylacetate in hexanes) to yield a white solid, which was further purified by recrystallisation from DCM/ethanol layering to yield a white crystalline solid (0.10 g, 16.4%).

¹H NMR (400 MHz, CDCl₃): δ (ppm) 0.83 (6H, t, J=7.0 Hz, CH₃), 1.00-1.04 (4H, m, CH₂), 1.20-1.55 (40H, m, CH₂), 1.70 (4H, quint., CH₂), 1.82 (4H, quint., CH₂), 3.81 (6H, s, CH₃), 4.02 (4H, t, J=6.6 Hz, CH₂), 4.21 (4H, t, J=6.6 Hz, CH₂), 6.87 (4H, s, CH═CH), 7.00 (4H, d, J=8.8 Hz, Ar—H), 7.58 (4H, d, J=8.8 Hz, Ar—H), 7.65 (4H, d, J=8.4 Hz, Ar—H), 7.72 (6H, d, J=8.0 Hz, Ar—H), 7.89 (2H, d, J=1.6 Hz, Ar—H), 7.92 (2H, d, J=8.0 Hz, Ar—H). ¹³C NMR (100 MHz, CDCl₃): δ (ppm) 12.5 (CH₂), 14.2 (CH₃), 22.8 (CH₂), 24.1 (CH₂), 26.0 (CH₂), 26.1 (CH₂), 28.6 (CH₂), 29.2 (CH₂), 29.3 (CH₂), 29.4 (x2) (CH₂), 32.0 (CH₂), 33.6 (CH₂), 52.5 (CH₃), 65.6 (CH₃), 68.2 (CH₂), 115.0 (CH), 121.4 (CH), 125.3 (CH), 127.2 (CH), 127.5 (CH), 128.2 (CH), 129.0 (CH), 131.9 (CH), 133.2 (CH), 133.3 (CH), 134.1 (CH), 139.0 (CH), 139.5 (C), 139.6 (C), 139.8 (C), 147.3 (C), 158.9 (CO), 165.2 (C═O), 165.6 (C═O). MALDI-MS: 1222.6 (M⁺). Elemental analysis: expected C=76.56, H=8.07, measured C=76.11, H=7.99.

J8-8MAL

DCC (0.49 g, 2.35 mmol) was added portion wise to a solution of compound 13 (0.47 g, 0.47 mmol), ethylhydrogen maleate (0.34 g, 2.35 mmol) and DMAP (57 mg, 0.47 mmol) in dry CH₂Cl₂ (20 mL) at room temperature under a nitrogen atmosphere. The reaction mixture was stirred for 20 h and the formed DCU was filtered and CH₂Cl₂ was removed under reduced pressure. The resulting residue was purified by column chromatography (dry loaded, silica gel, 20% ethylacetate in hexanes) to yield a white solid (0.20 g, 33.9%).

¹H NMR (400 MHz, CDCl₃): δ (ppm) 0.84 (6H, t, J=7.0 Hz, CH₃), 1.00-1.04 (4H, m, CH₂), 1.20-1.51 (46H, m, CH₂), 1.70 (4H, quint., CH₂), 1.82 (4H, quint., CH₂), 4.01 (4H, t, J=6.6 Hz, CH₂), 4.20 (4H, t, J=6.8 Hz, CH₂), 4.26 (4H, q, J=7.2 Hz, CH₂), 6.24 (4H, s, CH═CH), 6.99 (4H, d, J=8.8 Hz, Ar—H), 7.58 (4H, d, J=8.8 Hz, Ar—H), 7.65 (4H, d, J=8.4 Hz, Ar—H), 7.72 (6H, d, J=8.4 Hz, Ar—H), 7.89-7.92 (4H, m, Ar—H). ¹³C NMR (100 MHz, CDCl₃): δ (ppm) 12.5 (CH₂), 14.2 (x2) (CH₃), 22.8 (CH₂), 24.1 (CH₂), 26.0 (CH₂), 26.1 (CH₂), 28.6 (CH₂), 29.2 (CH₂), 29.3 (CH₂), 29.4 (x2) (CH₂), 32.0 (CH₂), 33.6 (CH₂), 61.4 (CH₂), 65.6 (CH₃), 68.2 (CH₂), 115.0 (CH), 121.4 (CH), 125.3 (CH), 127.2 (CH), 127.5 (CH), 128.1 (CH), 129.0 (CH), 129.9 (CH), 130.0 (CH), 131.9 (CH), 133.2 (CH), 139.0 (CH), 139.5 (C), 139.6 (C), 139.8 (C), 147.3 (C), 158.9 (CO), 165.4 (C═O), 165.5 (C═O). MALDI-MS: 1251.7 (M⁺). Elemental analysis: expected C=76.76, H=8.21, measured C=76.48, H=8.16.

Scheme 4

Suzuki coupling reaction between the boronic ester (5) and commercially outsourced material 4-(7-bromobenzo[c][1,2,5]thiadiazol-4-yl)phenol (compound 14) using catalyst Pd(PPh₃)₄ in dioxane/H₂O (2:1) afforded the bis-phenol (15) in good yield (%). The maleimide K8-8MI was synthesised under similar conditions outlined for J8-8MI in scheme 2 in good yield (%). A standard Williamson-ether reaction of compound (15) with 1-bromooctane using potassium carbonate and butanone under reflux afforded the final product K8-8 in excellent yield (%).

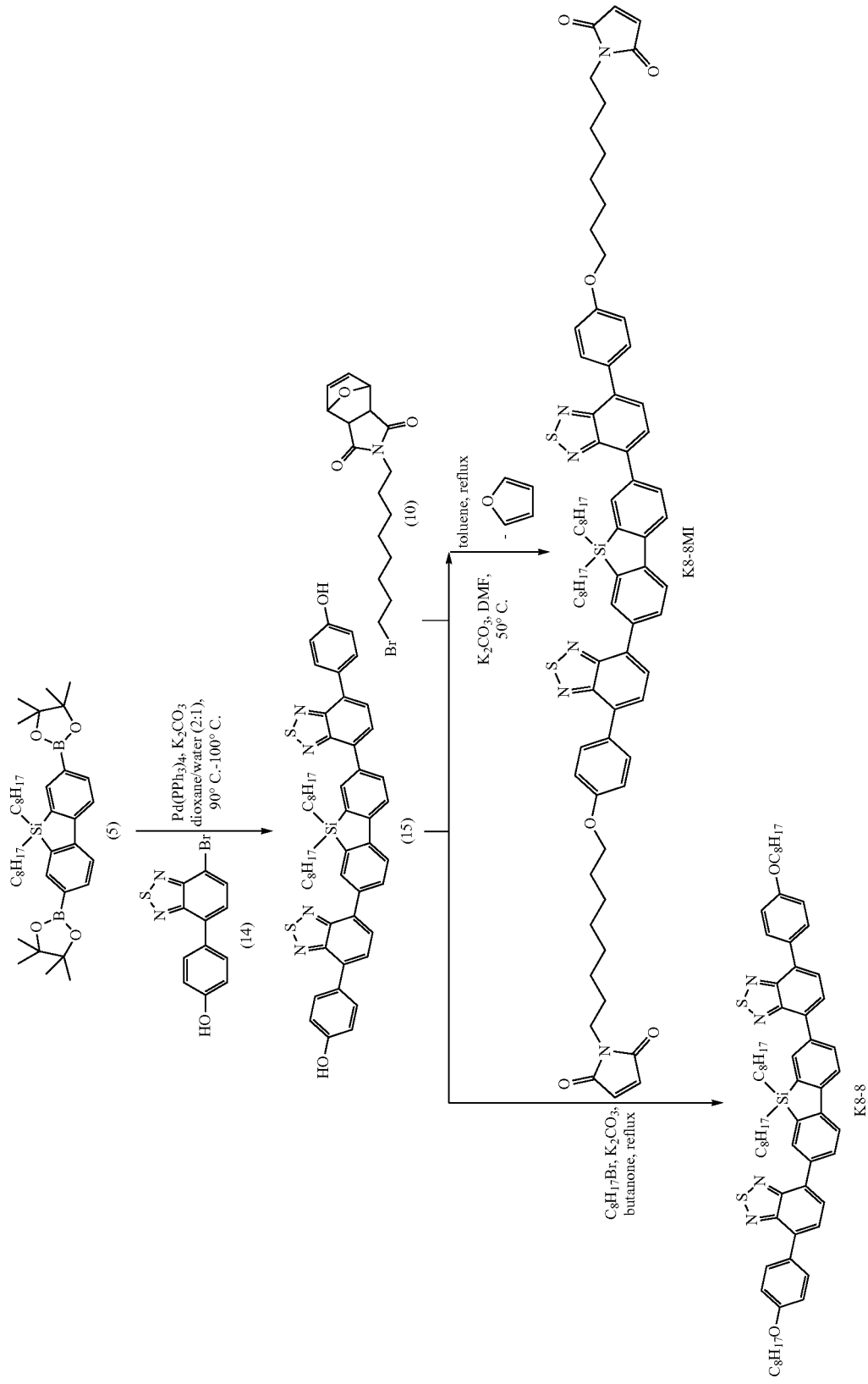
Scheme 4. Synthesis of 5,5-dioctyl-5H-dibenzo[b,d]silole-3,7-benzo[c]-1,2,5-thiadiazole derivatives K8-8 and K8-8MI.

Compound 15

Compound 14 (0.51 g, 1.67 mmol), 5,5-dioctyl-3,7-bis(4,4,5,5-tetramethyl-1,3,2-dioxaborolan-2-yl)-5H-dibenzo[b,d]silole (compound 5, 0.50 g, 0.76 mmol), $K_2CO_3$ (0.52 g, 3.80 mmol), dioxane (20 mL) and water (10 mL) were all added to a 3-neck round bottomed flask. The system was degassed with the aid of two freeze-pump-thaw cycles. using nitrogen as the inert gas. Subsequently, Pd(PPh$_3$)$_4$ (44 mg, 0.04 mmol) was added and the reaction mixture was again degassed by one freeze-pump-thaw cycle and heated to 90° C.-100° C. overnight (16 h). The reaction mixture was then acidified with 10% HCl (200 mL) and then poured into a separating funnel, the aqueous layer was extracted with diethyl ether (3×100 mL) and the combined organics were washed with water (300 mL), dried (MgSO$_4$) and filtered. The filtrate was concentrated under reduced pressure and the crude product was purified by column chromatography (dry loaded, silica gel, 30% ethyl acetate in hexanes) to yield a yellow powder (0.33 g, 50.8%).

$^1$H NMR (400 MHz, (CD$_3$)$_2$SO): δ (ppm) 0.70 (6H, t, J=6.6 Hz, CH$_3$), 1.05-1.30 (24H, m, CH$_2$), 1.43 (4H, quint., CH$_2$), 6.96 (4H, d, J=8.8 Hz, Ar—H), 7.88-7.92 (6H, m, Ar—H), 8.00 (2H, d, J=7.6 Hz, Ar—H), 8.17 (4H, s, Ar—H), 8.35 (2H, s, Ar—H), 9.77 (2H, s, O—H). MALDI-MS: 858.3 (M$^+$).

K8-8

A solution of compound 15 (0.10 g, 0.12 mmol) and 1-bromooctane (0.11 g, 0.58 mmol) in butanone (10 mL) was stirred at reflux with K2003 (80 mg, 0.58 mmol) under nitrogen for 18 h. After completion the salts were removed by filtration and the filtrate was concentrated under reduced pressure. The crude product was then purified by column chromatography (wet loaded, silica gel, 1:1 DCM/hexanes) to yield a yellow powder (0.10 g, 76.9%).

$^1$H NMR (400 MHz, CDCl$_3$): δ (ppm) 0.82 (6H, t, J=6.8 Hz, CH$_3$), 0.91 (6H, t, J=6.8 Hz, CH$_3$), 1.05-1.09 (4H, m, CH$_2$), 1.21-1.54 (44H, m, CH$_2$), 1.85 (4H, quint., CH$_2$), 4.06 (4H, t, J=6.4 Hz, CH$_2$), 7.09 (4H, d, J=8.8 Hz, Ar—H), 7.76 (2H, d, J=7.2 Hz, Ar—H), 7.85 (2H, d, J=7.6 Hz, Ar—H), 7.95 (4H, d, J=8.8 Hz, Ar—H), 8.05 (2H, d, J=8.0 Hz, Ar—H), 8.13 (2H, dd, J=8.0, 1.6 Hz, Ar—H), 8.22 (2H, d, J=1.6 Hz, Ar—H). $^{13}$C NMR (100 MHz, CDCl$_3$): δ (ppm) 12.5 (CH$_2$), 14.2 (CH$_3$), 14.3 (CH$_3$), 22.8 (x2) (CH$_2$), 24.2 (CH$_2$), 26.2 (CH$_2$), 29.3 (CH$_2$), 29.4 (x3) (CH$_2$), 29.5 (CH$_2$), 32.0 (x2) (CH$_2$), 33.6 (CH$_2$), 68.3 (CH$_2$), 114.8 (CH), 121.3 (CH), 127.4 (CH), 128.0 (CH), 129.9 (C), 130.5 (CH), 131.4 (CH), 132.9 (C), 133.0 (C), 134.1 (C), 136.5 (C), 138.9 (C), 148.1 (C), 154.4 (C), 159.6 (C). MALDI-MS: 1082.5 (M$^+$). Elemental analysis: expected C=75.37, H=8.00, N=5.17, measured C=75.35, H=7.95, N=4.99.

K8-8MI

A mixture of compound 15 (0.40 g, 0.47 mmol), compound 10 (0.50 g, 1.40 mmol) and K$_2$CO$_3$ (0.32 g, 2.33 mmol) were suspended in dry DMF (30 mL). The reaction mixture was heated to 55° C. and stirred under nitrogen for 20 h. After completion the reaction mixture was allowed to cool to room temperature and the salts were removed by filtration. The filtrate was evaporated under reduced pressure and the residue was redissolved in dichloromethane (100 mL) and washed with water (2×100 mL). The organic layer was dried (MgSO$_4$), filtered and evaporated to dryness under reduced pressure. The crude product was then purified by flash column chromatography (50% ethyl acetate in hexanes to 100% ethyl acetate) to yield the protected maleimide as a bright yellow solid (0.38 g, 57%).

$^1$H NMR (400 MHz, CDCl$_3$): δ (ppm) 0.81 (6H, t, J=6.7 Hz, CH$_3$), 1.05-1.09 (4H, m, CH$_2$), 1.21-1.62 (44H, m, CH$_2$), 1.80-1.87 (4H, m, CH$_2$), 2.84 (4H, s, CH), 3.49 (4H, t, J=7.3 Hz, CH$_2$), 4.06 (4H, t, J=6.5 Hz, CH$_2$), 5.28 (4H, s, CH), 6.52 (4H, s, CH=CH), 7.08-7.10 (4H, m, Ar—H), 7.78 (2H, d, J=7.3 Hz, Ar—H), 7.86 (2H, d, J=7.3 Hz, Ar—H), 7.94-7.96 (4H, m, Ar—H), 8.07 (2H, d, J=8.2 Hz, Ar—H), 8.15 (2H, dd, J=8.2 Hz, Ar—H), 8.21 (2H, d, J=1.6 Hz, Ar—H).

The protected maleimide (0.27 g, 0.19 mmol) was heated at reflux in toluene (10 mL) for 16 h to fully eliminate furan. The toluene was removed under reduced pressure and the crude product was purified by flash chromatography (100% dichloromethane to 4% ethyl acetate in dichloromethane) to yield compound 23 as a bright yellow waxy solid. This was further purified by trituration using ethanol to yield the product as a bright yellow solid (0.15 g, 62%).

$^1$H NMR (400 MHz, CDCl$_3$): δ (ppm) 0.82 (6H, t, J=6.7 Hz, CH$_3$), 1.06-1.10 (4H, m, CH$_2$), 1.21-1.54 (40H, m, CH$_2$), 1.58-1.65 (4H, m, CH$_2$), 1.81-1.88 (4H, m, CH$_2$), 3.54 (4H, t, J=7.3 Hz, CH$_2$), 4.06 (4H, t, J=6.5 Hz, CH$_2$), 6.07 (4H, s, CH=CH), 7.08-7.11 (4H, t, Ar—H), 7.78 (2H, d, J=7.5 Hz, Ar—H), 7.87 (2H, d, J=7.5 Hz, Ar—H), 7.94-7.97 (4H, m, Ar—H), 8.07 (2H, d, J=8.1 Hz, Ar—H), 8.15 (2H, dd, J=8.1, 1.8 Hz, Ar—H), 8.21 (2H, d, J=1.8 Hz, Ar—H). $^{13}$C NMR (100 MHz, CDCl$_3$): δ (ppm) 12.4 (CH$_2$), 14.1 (CH$_3$), 22.6 (CH$_2$), 24.1 (CH$_2$), 26.0 (CH$_2$), 26.7 (CH$_2$), 28.5 (CH$_2$), 29.0 (CH$_2$), 29.2(4x) (CH$_2$), 31.9 (CH$_2$), 33.5 (CH$_2$), 37.9 (CH$_2$), 68.1 (CH$_2$), 114.7 (CH), 121.2 (CH), 127.3 (CH), 127.9 (CH), 129.8 (C), 130.4 (CH), 131.3 (CH), 132.8 (C), 132.9 (C), 134.0(3x) (CH, C), 136.4 (C), 138.8 (C), 148.0 (C), 154.3 (C), 159.4 (C), 170.9 (C=O). MALDI-MS: 1272.5 (M$^+$). Elemental analysis: expected C=71.66, H=6.96, N=6.60, measured C=71.60, H=6.95, N=6.62.

Scheme 5

Suzuki coupling reaction between the boronic ester (5) and commercially outsourced material 4-bromo-2,3,5,6-tetramethyl-4'-(octyloxy)-1,1'-biphenyl (compound 16) using catalyst Pd(PPh$_3$)$_4$ in toluene/H$_2$O (2:1) at 90° C. afforded the final product L8-8 in good yield (%).

Scheme 5. Synthesis of compound L8-8.

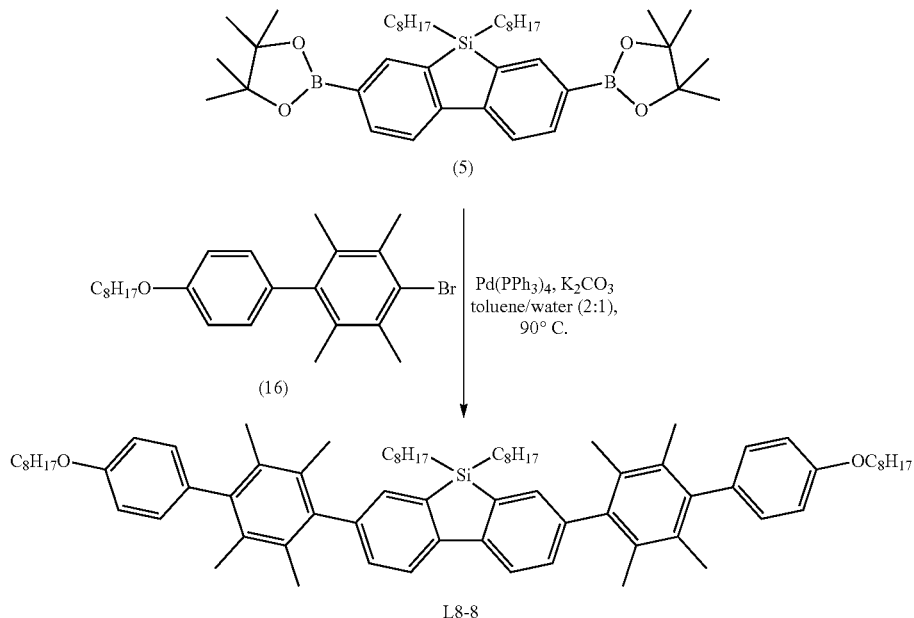

L8-8

4-bromo-2,3,5,6-tetramethyl-4'-(octyloxy)-1,1'-biphenyl (compound 16, 0.70 g, 1.67 mmol), 5,5-dioctyl-3,7-bis(4,4,5,5-tetramethyl-1,3,2-dioxaborolan-2-yl)-5H-dibenzo[b,d]silole (compound 5, 0.50 g, 0.76 mmol), $K_2CO_3$ (0.52 g, 3.80 mmol), toluene (20 mL) and water (10 mL) were all added to a 3-neck round bottomed flask. The system was degassed with the aid of two freeze-pump-thaw cycles using nitrogen as the inert gas. Subsequently, $Pd(PPh_3)_4$ (88 mg, 0.08 mmol) was added and the reaction mixture was again degassed by one freeze-pump-thaw cycle. The reaction mixture was heated at 90° C. for 24 h under nitrogen and poured into a separating funnel, in which more water (50 mL) and toluene (50 mL) were both added, the water layer washed with toluene (20 mL) and the combined organic layers washed with water (50 mL), dried ($MgSO_4$) and filtered. The crude product was purified by column chromatography (wet loaded, silica gel, 20% dichloromethane in hexanes) to yield a white powder, which was further purified by recrystallization from DCM/ethanol layering (0.56 g, 68.3%).

$^1$H NMR (400 MHz, $CDCl_3$): δ (ppm) 0.84 (6H, t, J=7.0 Hz, $CH_3$), 0.91 (6H, t, J=6.8 Hz, $CH_3$), 0.94-0.98 (4H, m, $CH_2$), 1.17-1.55 (50H, m, $CH_2$), 1.84 (4H, quint., $CH_2$), 2.00 (12H, s, Ar—$CH_3$), 2.03 (12H, s, Ar—$CH_3$), 4.03 (4H, t, J=6.6 Hz, $CH_2$), 6.98 (4H, d, J=8.8 Hz, Ar—H), 7.08-7.13 (4H, m, Ar—H), 7.28 (2H, dd, J=8.0, 1.6 Hz, Ar—H), 7.46 (2H, s, J=1.6 Hz, Ar—H), 7.94 (2H, d, J=8.0 Hz, Ar—H). $^{13}$C NMR (100 MHz, $CDCl_3$): δ (ppm) 12.5 ($CH_2$), 14.2 ($CH_3$), 14.3 ($CH_3$), 22.8 (x2) ($CH_2$), 24.2 ($CH_2$), 26.3 ($CH_2$), 29.2 ($CH_2$), 29.3 ($CH_2$), 29.4 ($CH_2$), 29.6 ($CH_3$), 32.0 ($CH_2$), 33.4 ($CH_3$), 33.5 ($CH_2$), 68.1 ($CH_2$), 114.4 (CH), 120.7 (CH), 130.6 (CH), 131.3 (CH), 132.0 (CH), 132.5 (CH), 134.7 (C), 134.9 (C), 138.1 (C), 141.0 (C), 141.4 (C), 141.5 (C), 146.6 (C), 157.8 (CO). MALDI-MS: 1078.8 ($M^+$). Elemental analysis: expected C=84.54, H=9.90, measured C=84.57, H=9.85.

Optical Properties

Light-emitting materials used in OLED devices exhibit electroluminescence (EL) in the visible region of the electromagnetic spectrum. Red, green and blue (RGB) EL colours are fundamentally important for the realisation of full-colour OLED displays (i.e., mobile phones) and lighting (i.e., solid-state white light). Excitons in EL are produced by charge-injection after applying an electric field, however, a similar process, in which the excitons are produced by photo-excitation using, for example, UV-light, is termed photoluminescence (PL). For the majority of emissive organic semiconductor materials, the EL and PL spectra are identical. In order to evaluate the physical properties of the materials both absorption and fluorescence properties were investigated. Therefore, UV/Vis absorption and PL spectra were recorded for the compounds in solution and in the thin film (FIGS. 5a, 5b and 6a, 6b). High PL quantum yields (PLQYs) in the solid-state are desired and a comparison of the materials PLQY in the dilute solution-state and the solid-state can give valuable information regarding the molecular aggregation in the thin film compared to the isolated molecules of the dilute solution-state. Unfortunately, PLAY measurements of the materials were beyond the scope of this work-package. The samples were prepared as follows:

(a) Solution-state: the samples for the UV/Vis absorption and PL spectra were prepared by dissolving in analytical reagent grade toluene, at a concentration of $1 \times 10^{-5}$ M and $1 \times 10^{-6}$ M for the UV/Vis absorption spectra and PL spectra, respectively. The UV/Vis absorption spectra were recorded using a Unicam UV/Vis spectrometer and the PL spectra were measured using a Jobin Yvon-spex Fluorolog. The excitation wavelength used for the PL spectra was 350 nm, unless otherwise stated.

(b) Thin film: the samples for the UV/Vis absorption and PL spectra were prepared by spin-coating from toluene solution (analytical reagent grade) at a sample loading of 20 mg/mL. The samples were spin-coated onto a quartz disc (Ø=11 mm) at a speed of 2500 rpm for a duration of 60 seconds. The UV/Vis absorption spectra were recorded using a Cary 5000 UV/Vis/NIR spectrometer and the PL spectra were recorded using a Jobin Yvon-spex Fluorolog. The excitation wavelength used for the PL spectra was 350 nm, unless otherwise stated.

TABLE 1

| Compound | Solution (nm) | | Film (nm) | |
| --- | --- | --- | --- | --- |
| | Absorption ($\lambda_{max}$) | PL ($\lambda_{emission}$) | Absorption ($\lambda_{max}$) | PL ($\lambda_{emission}$) |
| J6-8 | 344 | 395 | 334 | 418 |
| J8-8 | 345 | 397 | 331 | 408 |
| K8-8 | 320/433 | 537 | 314/447 | 556 |
| L8-8 | 291 | 359 | 287 | 406 |
| J8-8MI | 341 | 393 | 332 | 517 |
| J8-8MAL | 341 | 392 | 331 | 413 |
| J8-8FUM | 341 | 393 | 335 | 417 |
| J8-8MET | 341 | 394 | 338 | 418 |
| J8-8VE | 341 | 395 | 333 | 422 |
| K8-8MI | 320/435 | 536 | 314/443 | 557 |

The absorption and photoluminescence data for the solutions and thin films of all 10 compounds are summarised in table 1.

Regarding the blue emissive compound, J8-8 shows a PLmax (film) equal to 408 nm, which compares to 409 nm of the n-alkylfluorene-based analogous compound. With of phase transitions and the identification of the type of mesophase was determined by examining the textures under the microscope. After these initial investigations, the temperature values and mesophase designation were further confirmed by DSC analysis, in which more accurate values could be obtained. From POM and DSC analysis the following properties were expected to be established: (1) melting point determination (either a crystal to isotropic liquid transition or crystal to liquid crystal transition), (2) clearing point determination (liquid crystal to isotropic liquid transition), (3) the magnitude of the liquid crystal transition temperature range (from the melting point to the clearing point) to determine liquid crystalline stability, (4) mesophase type identification (either nematic phase or smectic phase), (5) crystallisation tendency (and supercooling), (6) glass-transition temperature ($T_g$) value and (7) thermal stability (thermal decomposition and thermal polymerisation tendency). Abbreviations: Cr=crystal, N=nematic, I=isotropic, Cr—N=a phase transition that exhibits a melting point transition with a subsequent phase change into a nematic liquid crystal state, Cr—I=a phase transition that exhibits a melting point transition with a subsequent phase change into an isotropic liquid state, N—I=a phase transition that exhibits a phase change from a nematic liquid crystal state to an isotropic liquid state. DSC thermograms can be used to show the important phase transitions at the relevant temperature.

Summary of structures in table 2:

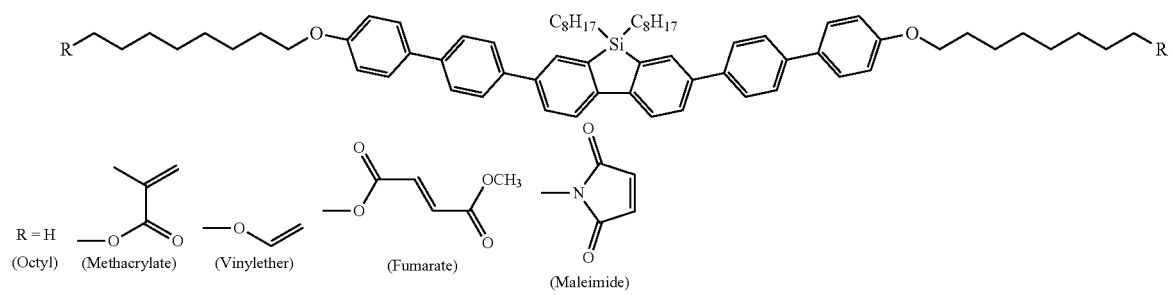

regards to the green emissive compound, K8-8 shows a PLmax (film) of 556 nm, which compares to 552 nm of the n-alkylfluorene-based analogous compound. Therefore, the emission properties of the dibenzo[b,d]silole-based materials, J8-8 and K8-8, are strikingly similar compared to their n-alkylfluorene counterpart materials, which suggests that replacing the carbon atom at the 9-position of fluorene with a silicon atom has negligible effects on the emission properties.

Liquid Crystalline Properties

Anisotropy of the refractive index (or birefringence) is one of the distinguishing physical properties of liquid crystalline materials. These properties also enable the visualization of the macroscopic molecular orientation. When the liquid crystal sample is placed on a glass slide with a cover slip on top, between two crossed polarizers under an optical microscope, an assortment of textures and birefringence colours can be observed. These textures and colours afford information about the macroscopic structure of the liquid crystal phases. Mesophase characterisation was carried out by both polarising optical microscopy (POM) and differential scanning calorimetry (DSC). In the first instance POM was conducted to get initial approximate temperature values

TABLE 2

| R | X | Crystalline | | Nematic | | Isotropic | ΔN—I |
| --- | --- | --- | --- | --- | --- | --- | --- |
| H | C | • | 107 | • | 167 | • | 60 |
| Methacrylate | C | • | 78 | • | 122 | • | 44 |
| Vinylether | C | • | 82 | • | 143 | • | 61 |
| Fumarate | C | • | 76 | • | 105 | • | 29 |
| Maleimide | C | • | 74 | • | 106 | • | 32 |
| H (J8-8) | Si | • | 116 | • | 224 | • | 108 |
| Methacrylate (J8-8MET) | Si | • | 98 | • | polymerised | • | |
| Vinylether (J8-8VE) | Si | • | 104 | • | 207 | • | 103 |
| Fumarate (J8-8FUM) | Si | • | 78 | • | 150 | • | 72 |
| Maleimide (J8-8MI) | Si | • | 94 | • | 156 | • | 62 |

As can be seen from table 2, 3 and 4, the inventors found that advantageously the temperature range of the liquid crystalline phase of the Si containing molecules is wider than that for conventional materials, such as fluorene-based materials.

Table 3 structures:

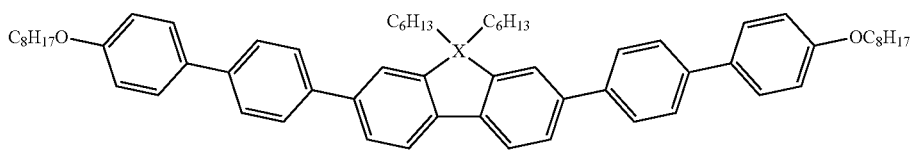

TABLE 3

| X | Cr | | N | | I | ΔN—I |
|---|----|----|---|----|----|------|
| C | • | 123 | • | 188 | • | 65 |
| Si (J6-8) | • | 147 | • | 243 | • | 96 |

Table 4 structures:

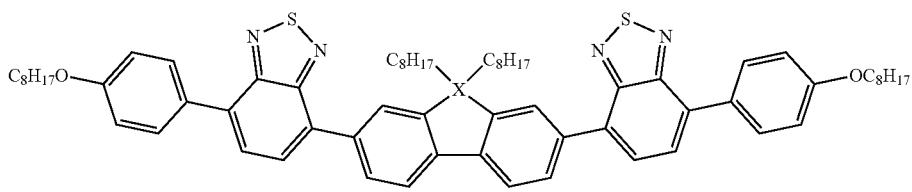

TABLE 4

| X | Cr | | N | | I | ΔN—I |
|---|----|----|---|----|----|------|
| C | • | 139 | (• | 94) | • | monotropic |
| Si (K8-8) | • | 120 | • | 130 | • | 10 |

Tables 2, 3, and 4 show the liquid crystalline transition temperatures for the transitions from crystalline to nematic and from nematic to isotropic phases.

From the DSC-analysis results the following can be concluded: (1) K8-8MI and L8-8 are not liquid crystalline and only form an isotropic liquid after melting, (2) all materials, except K8-8MI and L8-8, exhibit a nematic liquid crystalline phase, (3) the dibenzo[d,b]silole-based materials show slightly higher melting points than the n-alkylfluorene analogues, (4) the dibenzo[d,b]silole-based materials show wider liquid crystalline transition temperature ranges (ΔN—I) than the n-alkylfluorene analogues, (5) when the lateral alkyl chains are changed from $C_8H_{17}$ (octyl) to $C_6H_{13}$ (hexyl) the dibenzo[d,b]silole-based material exhibits a 31° C. more stable liquid crystalline enantiotropic nematic phase range compared to the analogous standard fluorene-based material, (6) dibenzo[d,b]silole-benzothiadiazole material exhibits a more stable liquid crystalline enantiotropic nematic phase, compared to the monotropic nematic phase exhibited by the standard n-alkylfluorene and (7) supercooling of the n-alkylfluorene derivatives is larger than the silafluorene analogous materials, i.e., the latter show a greater tendency to crystallise. Although this can be beneficial for material purification, it is less desirable for OLED device applications since crystallisation during device fabrication (pre UV-curing) could be detrimental. However, due to the fact that the cross-linking system is a mixture of materials crystallisation should be inhibited more compared to mono-molecular systems. Moreover, after photo-crosslinking and the formation of a polymeric cross-linked network these issues can, to some degree, be disregarded because crystallisation in these types of rigid polymer networks are highly unlikely. Advantageously, dimeric materials, those where D is -A-$S^2$—$B^1$, may solve this problem and inhibit crystallisation due to an increase in viscosity by the increase in the molecular weight of the compounds. No clearing point was detected for compound J8-8MET by POM or DSC measurements, and after melting J8-8MET undergoes thermal polymerisation. Although this thermal instability is unappealing for the development of photo-crosslinkable materials, J8-8MET could be a good candidate for a thermally cross-linkable blue emissive material.

Photo-Crosslinking Measurements

Solution processable photo-crosslinkable active materials used as the hole-transporting layer and/or the emissive layer of an OLED device are attractive because of their multilayer capability and photo-patternability, which could give higher efficiency and resolution solution processed devices. Due to the formation of a robust, insoluble and impenetrable cross-linked film additional layers can be deposited on top from solution without disturbing the layer already deposited. Photo-crosslinkable materials permit photo-patterning to achieve high resolution pixel density. Our aim was to develop an initiator-free photo-crosslinking protocol for blue-emissive and green-emissive films based on the novel dibenzo[d,b]silole materials, in which optimal cross-linking conditions would be identified and compared with analogous n-alkylfluorene derivatives. The photo-crosslinking system was based on an electron rich (donor)-electron poor (acceptor)-type cross-linking technology. Photo-crosslinking experiments were carried out under an inert atmosphere, using a commercial UV-curing LED spot lamp system (385 nm, 0.5 J/cm$^2$), which provided high intensity light over a small area.

All the films used in the subsequent experiments were prepared using variations of the following protocol: thin films were prepared using solution processing techniques, in which the materials were dissolved at a concentration of 20 mg/mL in toluene at a weight ratio of either 1:1 (electron rich/electron poor) for the blue-emissive material system, or at a weight ratio of 5:4:1 (blue electron rich/blue electron poor/green electron poor) for the green-emissive material system. The green-emissive material system contains 10 wt. % of the green dopant to put into effect energy transfer (FRET) from the host to the dopant with subsequent emission of green visible light. Thin emissive films were prepared by spin-casting dilute solutions of the materials on circular quartz substrates (Ø=11 mm) at 2500 rpm for 60 seconds.

For the cross-linking sensitivity studies of the blue-emissive system, we used two cross-linkable mixtures (1:1 wt. ratio) containing the donor J8-8VE and four acceptor materials J8-8MET, J8-8FUM, J8-8MAL and J8-8MI, which are shown in table 5.

TABLE 5

| Donor | Acceptor |
|---|---|
| J8-8VE (vinyl ether): —O⌒⫽ | |
| | J8-8MET (methacrylate): —O-C(=O)-C(CH₃)=CH₂ |
| | J8-8FUM (fumarate): —O-C(=O)-CH=CH-C(=O)-OCH₃ |
| | J8-8MAL (maleate): —O-C(=O)-CH=CH-C(=O)-OC₂H₅ |
| | J8-8MI (maleimide): —N(C(=O)CH=CHC(=O)) |

The following experiments were conducted on thin films of the mixtures that were prepared as previously described. Photo-crosslinking was carried out under an inert atmosphere. Eleven identical films of the cross-linkable mixtures were prepared on quartz substrates by spin coating and a UV/Vis absorption spectrum was obtained for each sample. The samples were then exposed to different doses of 385 nm UV-light (0 s, 1 s, 2.5s, 5 s, 7.5 s, 10 s, 15 s, 20 s, 30 s, 40 s and 50 s) with a power rating of 500 mJ/cm$^2$. After exposure, the UV/Vis absorption spectrum was recorded again to check that no photo-degradation had occurred due to the exposure of the film to UV-light. The eleven samples were then rinsed in dichloromethane (a solvent in which all uncross-linked materials are readily soluble) to remove any uncross-linked material, and the UV/Vis absorption spectrum was taken a final time to determine the amount of material remaining after rinsing. This process was repeated for all four cross-linkable donor-acceptor mixtures. A graph showing the sensitivity plots for the donor-acceptor cross-linkable mixtures is shown in FIG. 5. The two mixtures consisted of a 1:1 weight ratio of donor to acceptor materials (see table 5), in which the acceptor components were varied (J8-8MET and J8-8FUM), and the vinyl ether-based material J8-8VE was kept constant and used as the donor material in both mixtures.

Effects of Cross-Linking Groups on Emissive Properties and Stability

For an OLED device, an optimal photo-crosslinking system would ideally have negligible effect on the emissive properties and stability. By this we mean the effects of cross-linkable groups and UV-curing should have little or no change in the CIE coordinates of the material and little effect on the stability of the material during device operation. To better investigate the effects of the cross-linking groups on stability we synthesised non-cross-linkable analogues (compounds J8-8 and K8-8).

CIE (x,y) Coordinates

With respect to the non-cross-linkable materials the CIE (x,y) coordinates were calculated from the PL spectra of a thin film of the material spin-coated from a solution in toluene (concentration=20 mg/mL). For the cross-linkable versions the solutions were prepared as described previously and the films formed by spin-coating onto quartz substrates. The films were then exposed to sufficient UV-light doses under an inert atmosphere to completely cross-link the materials (25 J/cm$^2$) and then rinsed with dichloromethane. The PL spectra of the rinsed films were then recorded.

TABLE 6

| CIE (x, y) | x | y |
|---|---|---|
| Methacrylate | 0.17 | 0.15 |
| Fumarate | 0.17 | 0.12 |
| Maleate | 0.16 | 0.09 |
| Maleimide | 0.18 | 0.18 |
| Non-crosslinkable | 0.16 | 0.06 |

Table 6 shows the CIE (x,y) coordinates for the bi-phenyl-dibenzo[d,b]silole materials.

From CIE (x,y) coordinate plots it is clear that the cross-linking groups have an effect on the emission properties of the materials. This shift is most obvious with the use of the maleimide and vinyl ether cross-linking mixture (J8-8VE/J8-8MI) and is not unexpected due to the PET quenching exhibited by the maleimide containing materials. The cross-linkable system that gives the best balance between cross-linking rate and CIE (x,y) coordinates after cross-linking for the blue material is the maleate and vinyl ether mixture (J8-8VE/J8-8MAL) because it is able to photo-crosslink with 15 J/cm$^2$ of energy and has excellent post cross-linking CIE (x,y) coordinates of x=0.16 and y=0.09.

The n-alkylfluorene counterparts exhibit similar differences in emission due to the cross-linking groups. Similar to the dibenzo[d,b]silole maleimide mixture the effects of PET influence the emission properties of the cross-linked material resulting in CIE (x,y) coordinates of 0.19 and 0.22 (table 7). Interestingly the effects of the other cross-linking groups differ between the two versions. The dibenzo[d,b]silole-based materials exhibit noticeable differences between the methacrylate, maleate and fumarate cross-linking groups, whereas with the n-alkylfluorene analogues the emission coordinates are group around x=0.16 and y=0.13.

TABLE 7

| CIE (x, y) | x | y |
|---|---|---|
| Methacrylate | 0.17 | 0.13 |
| Fumarate | 0.17 | 0.12 |
| Maleate | 0.16 | 0.12 |
| Maleimide | 0.19 | 0.22 |
| Non-cross-linkable | 0.16 | 0.03 |

Table 7 shows the CIE (x,y) coordinates for the bi-phenyl n-alkylfluorene materials.

The optimal CIE (x,y) coordinates for a blue material are x=0.15 y=0.06, which is very close to the coordinates calculated for the non-crosslinkable dibenzo[d,b]silole material J8-8, x=0.16, y=0.06 (table 6). From FIGS. 18 and 20 it is also clear that a smaller shift in CIE (x,y) coordinates is observed for the dibenzo[d,b]silole materials when compared to the n-alkylfluorene versions. It should be noted that these conclusions are drawn from CIE plots of the PL spectra of these materials and the results may differ with their electroluminescence (EL) spectra. Also, it is worth noting that if these materials were to be used in an OLED device, it would be unlikely for them to be used in a neat film like the ones described in this chapter. It would be much more likely that they would be used in conjunction with a host material, similar to our aforementioned system used for the green-emissive guest-host thin films. This may alter the rate of cross-linking, the CIE (x,y) coordinates and the stability of the material, hence this should be investigated further.

Optical properties, photo-crosslinking studies, liquid crystalline behaviour and electrochemical have been investigated. The data provided above demonstrates the photo-crosslinking in inert conditions of both blue and green emissive thin films with low doses and without photo-degradation. The ease and lower cost of the chemical synthesis, compared to the fluoroalkylfluorene-based materials, are both noteworthy. This new class of emissive materials exhibit a nematic liquid crystalline phase with wider liquid crystalline transition temperature ranges compared to the n-alkylfluorene analogous materials. Mixtures of these materials show improved photo-crosslinking efficiencies in their thin films, compared to the analogous n-alkylfluorene materials. CIE (x,y) coordinates of the cross-linked and non-crosslinkable blue materials also show improvements. Additionally, the dibenzo[d,b]silole-based materials exhibit nearly identical HOMO-levels compared to the n-alkylfluorene-based materials, which suggests the presence of the added silicon atom has negligible effect on the materials oxidation properties. As expected, the electron affinity of the dibenzo[d,b]silole-based blue material (J8-8) is slightly enhanced compared to its n-alkylfluorene counterpart, which slightly deepens the LUMO-level of the dibenzo[d,b]silole-based materials.

The invention claimed is:
1. A compound of Formula (I)

$$D-S^1-A-S^2—B^1,$$ Formula (I)

wherein:
A represents a conjugated chain of from 1 to 30 aromatic moieties independently selected from the group consisting of aromatic moieties, heteroaromatic moieties and E moieties, provided that A includes at least one E moiety,
wherein E is selected from the group consisting of:
$E^1$ being a dibenzo[d,b]silole moiety of the structure:

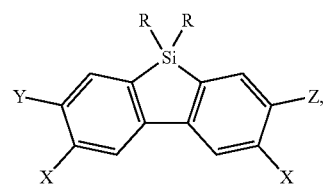

$E^2$ being a moiety of the structure:

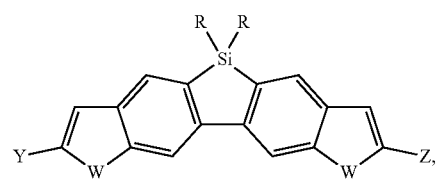

and $E^3$ being a moiety of the structure:

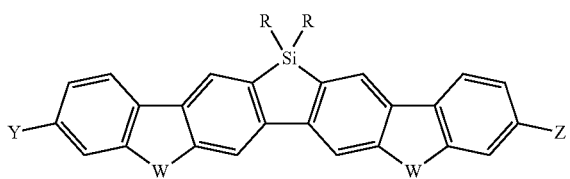

wherein E is connected in the conjugated chain of A and optionally to $S^1$ or to $S^2$ through covalent bonds at Y and Z where Y and Z are each a bond;
wherein each R is independently selected from the group consisting of straight chain or branched $C_4$-$C_{20}$alkyl and $C_4$-$C_{20}$alkenyl, optionally wherein from 1 to 5 $CH_2$ groups are each replaced by an oxygen, provided that no acetal, ketal, peroxide or vinyl ether is present in the R group, and optionally wherein each H bonded to a C in each R group may independently be replaced by a halogen;
wherein the X moieties are the same and are selected from the group consisting of hydrogen, straight chain or branched $C_1$-$C_8$ alkyl, straight chain or branched $C_1$-$C_8$ alkoxyl and a halogen, wherein each E moiety may have the same or different X moieties,
wherein W is either an oxygen or sulfur atom,
D represents a moiety having one or more cross-linkable functionalities,
$S^1$ and $S^2$ are flexible linker groups independently selected from straight chain or branched $C_5$-$C_{14}$ alkyl groups, optionally wherein 1 to 5 methylene groups are substituted for an oxygen atom provided that no acetal, ketal or peroxide is present in said flexible linker group; and
$B^1$ represents a moiety having one or more cross-linkable functionalities or a hydrogen atom, with the proviso that when B¹ represents a hydrogen atom, D represents a moiety having at least two cross-linkable functionalities.

2. The compound according to claim 1, wherein A has the structure:

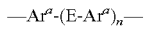

wherein each $Ar^a$ is independently selected from the group consisting of a bond, a diradical comprising an aromatic moiety, a diradical comprising a heteroaromatic moiety, an E moiety, or a chain comprising 2 to 5 aromatic, heteroaromatic and/or E moieties connected together by single bonds;

n is an integer from 1 to 8.

3. The compound according to claim 2, wherein each $Ar^a$ is independently selected from the group consisting of a diradical comprising a $C_6$-$C_{22}$ aromatic moiety, a diradical comprising a heteroaromatic moiety having 4 to 22 carbon atoms, an E moiety, or a chain comprising 2 or 3 aromatic, heteroaromatic and/or E moieties connected together by single bonds.

4. The compound according to claim 3, wherein the diradical comprising a $C_6$-$C_{22}$ aromatic moiety is selected from the group consisting of 1,3-phenylene, 1,4-phenylene, naphthalene-1,4-diyl, naphthalene-2,6-diyl, perylene-3,10-diyl, perylene-2,8-diyl, perylene-3,9-diyl and pyrene-2,7-diyl, 9,9-dialkylfluorene-2,7-diyl, 9,9-dialkylfluorene-3,6-diyl, 9-(1'-alkylidene)fluorene-2,7-diyl, 6,12-dihydro-6,6,12,12-tetraoctyl-indeno[1,2-b]fluorene-2,8-diyl, 6,12-dihydro-6,6,12,12-tetraoctyl-indeno[1,2-b]fluorene-3,9-diyl and/or wherein the diradical comprising a heteroaromatic moiety having 4 to 22 carbon atoms is selected from the group consisting of 2,2'-dithiophene-5,5'-diyl, thiophene-2,5-diyl, pyrimidine-2,5-diyl, pyridine-2,5-diyl, 1,2,4-oxazole-3,5-diyl, 1,3,4-oxadiazole-2,5-diyl, 1,2,5-oxadiazole-3,4-diyl, thieno[3,2-b]thiophene-2,5-diyl, dithieno[3,2-b:2',3'-d]thiophene-2,6-diyl, dithieno[3,2-b:2',3'-d]thiophene-3,7-diyl, dibenzothiophene-3,7-diyl, dibenzothiophene-4,6-diyl and dibenzothiophene-2,8-diyl, benzo[1,2-b:4,5-b']bis[1]benzothiophene-3,9-diyl, thiazolo[5,4-d]thiazole-2,5-diyl, oxazolo[5,4-d]oxazole-2,5-diyl, thiazolo[5,4-d]oxazole-2,5-diyl, thiazolo[4,5-d]thiazole-2,5-diyl, oxazolo[4,5-d]oxazole-2,5-diyl, thiazolo[4,5-d]oxazole-2,5-diyl, 2,1,3-benzothiadiazole-4,7-diyl, 4-thien-2-yl-2,1,3-benzothiazole-7,5'-diyl, 4,7-dithien-2-yl-2,1,3-benzothiazole-5', 5"-diyl, imidazo[4,5-d]imidazole-2,5-diyl, 4-alkyl-1,2,4-triazole-3,5-diyl, 9-alkylcarbazole-2,7-diyl, 9-alkylcarbazole-3,6-diyl, 1,7-dialkylindolo[2,3-b]carbazole-3,9-diyl, 1,7-dialkylindolo[2,3-b]carbazole-2,8-diyl, 2,9-dialkylcarbazolo[3,2-b]carbazole-4,11-diyl, 2,9-dialkylcarbazolo[3,2-b]carbazole-5,12-diyl, 1,7-dialkyldiindolo[3,2-b]thiophenes-3,9-diyl, 1,7-dialkyldiindolo[3,2-b]thiophenes-4,10-diyl, benzo[1,2-b:4,5-b']dithiophene-2,6-diyl, benzo[1,2-b:5,4-b']dithiophene-2,6-diyl, [1]benzothieno[3,2-b][1]benzothiophene-2,7-diyl, benzo[1,2-d:4,5-d']bisoxazole-2,6-diyl, benzo[1,2-d:5,4-d']bisoxazole-2,6-diyl, and 5,5-dioxodibenzothiophene-3,7-diyl.

5. The compound according to claim 1, wherein each R group attached to the Si comprises a $C_4$-$C_{20}$ haloalkyl, $C_4$-$C_{20}$alkyl or $C_4$-$C_{20}$ alkenyl and each spacer group —$S^1$ and —$S^2$, comprises a straight chain $C_5$-$C_{14}$ alkyl, optionally wherein from 1 to 5 $CH_2$ groups are each replaced by an oxygen, provided that no acetal, ketal, peroxide or vinyl ether is present in the —$S^1$ or —$S^2$, moiety.

6. The compound according to claim 1, wherein A comprises from 5 to 10 E moieties, and/or wherein A represents a conjugated chain of from 8 to 16 aromatic moieties.

7. The compound according to claim 1, wherein A comprises at least 3 different aromatic moieties.

8. The compound according to claim 1, wherein B¹ is hydrogen and D represents a moiety having two or more cross-linkable functionalities, such that D is:

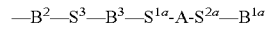

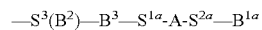

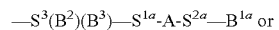

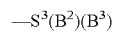

wherein $B^{1a}$ represents a moiety having a cross-linkable functionality, or a hydrogen atom;

$B^2$ and $B^3$ each represents a moiety having a cross-linkable functionality;

$S^{1a}$ and $S^{2a}$ are flexible linker groups; and $S^3$ is a spacer group.

9. The compound according to claim 1, wherein D is:

wherein, preferably, each -A-$S^2$—B¹ in the compound are the same.

10. The compound according to claim 1, wherein in the moieties having one or more or two or more cross-linkable functionalities, the cross-linkable functionalities are selected from the group consisting of ethylenic, diene, thiol and oxetane cross-linkable groups.

11. The compound according to claim 10, wherein the cross-linkable functionalities are selected from the group consisting of straight chain and cyclic α,β-unsaturated esters, α,β-unsaturated amides, vinyl ethers and non-conjugated diene cross-linking groups, preferably from the group consisting of methacrylate, ethacrylate, ethylmaleato, ethylfumarato, N-maleimido, vinyloxy, alkylvinyloxy, vinylmaleato, vinylfumarato, N-(2-vinyloxymaleimido) and 1,4-pentadien-3-yl.

12. The compound according to claim 1 wherein D, and B¹, B² and B³, where present, are radiation-activated cross-linkable groups.

13. The compound according to claim 1 wherein —$S^1$ and —$S^2$ in each occurrence are independently of formula II:

            Formula (II)

wherein $R_3$ is straight chain or branched $C_5$-$C_{14}$ alkyl, optionally wherein from 1 to 5 $CH_2$ groups are each replaced by an oxygen, provided that no acetal, ketal, peroxide or vinyl ether is present in the —$S^1$ or —$S^2$ moiety, and wherein $K_1$ is a bond or an ether, ester, carbonate, thioether, amine or amide linkage.

14. The compound according to claim 8 wherein —$S^3$ in each occurrence is independently of formula III:

            Formula (II)

wherein $R_4$ is 1 to 5 $R_5$ moieties each independently connected by a bond, an ether linkage or an ester linkage, where each $R_5$ moiety is independently selected from a straight chain or branched $C_1$-$C_{20}$ alkyl group, a $C_3$-$C_8$ cycloalkyl group, a $C_6$-$C_{16}$ aryl group or a $C_4$-$C_{15}$ heteroaryl group, and optionally wherein each H bonded to a C in each $R_5$ group may independently be replaced by a halogen, and wherein $K_2$ is a bond or an ether, ester, carbonate, thioether, amine or amide linkage.

15. The compound according to claim 1, wherein the compound displays liquid crystalline order.

16. The compound according to claim 1 incorporated into a network polymer formed by exposure of the compound to radiation.

17. A device comprising one or more charge transport layers and/or emissive layers comprising the compound according to claim 1 or a network polymer formed by exposure of the compound to radiation.

18. The device according to claim 17, wherein the device is an OLED device, a photovoltaic device or a thin film transistor (TFT) device.

19. A device according to claim 17, wherein the network polymer or the compound according to claim 1 is provided in a hole transporting layer or an electron transporting layer provided directly adjacent an electron transporting layer or a hole transporting layer respectively.

20. A device according to claim 19 which is an OLED device having a light emitting emissive layer and wherein the compound or the network polymer forms a uniformly aligned liquid crystalline structure whereby the light emitting layer emits linearly polarised light.

21. A method for forming a device comprising one or more charge transport layers and/or emissive layers, the method comprising providing a layer comprising a compound according to claim 1, selectively irradiating the layer with radiation, to form a network polymer and washing away any non-irradiated and unpolymerised compound.

22. The method according to claim 21, further comprising repeating said steps of the providing the layer, the selectively irradiating, and the washing.

23. A device of claim 17, comprising two or more network polymers each forming patterned structures, said structures being comprised of materials that are electroluminescent in nature, wherein the wavelength of electroluminescence emitted by one patterned structure is different to the wavelength of electroluminescence emitted by at least one other patterned structure.

24. The compound according to claim 1 synthesized by a compound according to formula IV:

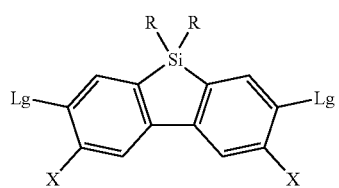

Formula (IV)

wherein Lg is a halogen atom or borate leaving group, wherein each R is independently selected from the group consisting of straight chain or branched $C_1$-$C_{20}$ alkyl and $C_2$-$C_{20}$ alkenyl, optionally wherein from 1 to 5 $CH_2$ groups are each replaced by an oxygen, provided that no acetal, ketal, peroxide or vinyl ether is present in the R group, and optionally wherein each H bonded to a C in each R group may independently be replaced by a halogen, wherein the X moieties are the same and are selected from the group consisting of hydrogen, straight chain or branched $C_1$-$C_8$ alkyl, straight chain or branched $C_1$-$C_8$ alkoxyl and a halogen, wherein the compound of formula IV provides one or more $E^1$ moieties.

25. The compound of claim 1 synthesized by a compound according to formula V:

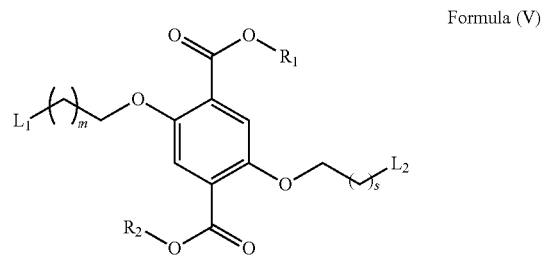

Formula (V)

wherein $R_1$ and $R_2$ are independently selected from the group consisting of $C_1$-$C_{12}$ alkyl, $C_6$-$C_{10}$ aryl or $C_5$-$C_9$ heteroaryl;

wherein $L_1$ and $L_2$ are independently selected leaving groups, optionally selected from Cl, Br, I, O-Tosyl, O-Mesyl or O-Triflyl; and wherein m and s are each an integer independently selected from 1 to 10, the synthesis comprising a step of alkylating a phenolic oxygen with the compound of Formula V, wherein the compound of formula V provides one or more $S^3$ moieties.

* * * * *